(12) United States Patent
Kishi et al.

(10) Patent No.: US 7,324,388 B2
(45) Date of Patent: Jan. 29, 2008

(54) NONVOLATILE MEMORY

(75) Inventors: Koji Kishi, Takarazuka (JP); Hideaki Kurata, Kodaira (JP); Satoshi Noda, Ome (JP); Yusuke Jono, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 217 days.

(21) Appl. No.: 11/189,977

(22) Filed: Jul. 27, 2005

(65) Prior Publication Data
US 2006/0023515 A1 Feb. 2, 2006

(30) Foreign Application Priority Data
Aug. 2, 2004 (JP) ............................. 2004-225287

(51) Int. Cl.
*G11C 7/10* (2006.01)
(52) U.S. Cl. ..................... 365/189.01; 365/185.18; 365/185.17; 365/185.27
(58) Field of Classification Search ........... 365/189.01, 365/185.18, 185.17, 185.27
See application file for complete search history.

(56) References Cited
U.S. PATENT DOCUMENTS
6,388,293 B1 5/2002 Ogura et al.
6,850,438 B2* 2/2005 Lee et al. ............... 365/185.11
6,894,931 B2* 5/2005 Yaegashi et al. ........ 365/185.22
2004/0084714 A1 5/2004 Ishii et al. .................. 257/315

FOREIGN PATENT DOCUMENTS
JP 2004-152977 5/2004

* cited by examiner

*Primary Examiner*—Richard T. Elms
*Assistant Examiner*—Toan Le
(74) *Attorney, Agent, or Firm*—Miles & Stockbridge P.C.

(57) ABSTRACT

A nonvolatile memory includes circuits each having first control transistors, memory transistors, second control transistors and memory transistors repeatedly connected in series in sequence. Inversion layers are formed in the direction intersecting the serial direction with turning on of the control transistors. A selection circuit selects a connection of the inversion layer placed under the first control transistor and its corresponding read/write circuit. The control transistors placed on both sides adjacent to the memory transistor are turned on to perform reading. The first control transistors placed on both sides of the second control transistor as viewed from side to side are turned on to perform writing into the other of the right and left memory transistors via one of the right and left memory transistors. The selection circuit connects the read/write circuit and the inversion layer in such a manner that the same read/write circuit is used in reading and writing for the same memory transistor.

18 Claims, 64 Drawing Sheets

(READ)

NONVOLATILE MEMORY

CROSS-REFERENCE TO RELATED APPLICATION

The present application claims priority from Japanese patent application No. 2004-225287 filed on Aug. 2, 2004, the content of which is hereby incorporated by reference into this application.

BACKGROUND OF THE INVENTION

The present invention relates to a programmable nonvolatile memory, and a technique effective if applied to, for example, an electrically programmable AND type flash memory.

An AND type flash memory has been described in a patent document 1 (Japanese Unexamined Patent Publication No. 2004-152977). As one flash memory, there is shown a structure wherein diffusion regions are repeatedly parallel-formed over a semiconductor substrate, auxiliary electrodes are disposed among the respective diffusion regions through an oxide film interposed thereamong to form control transistors, and memory transistors each based on a charge storage region and a control gate are formed on the right and left sides of the auxiliary electrodes. The control gates extend in the direction of diffusion and intersecting the auxiliary electrodes and function as word lines. Further, there is shown, as another structure, a structure wherein other control transistors using auxiliary electrodes in place of the diffused layers are adopted. When the control transistors are turned on, inversion layers are formed in their channel regions and function as wirings. Since the diffusion regions may not be repeatedly disposed in parallel in the latter structure, the structure is excellent in terms of a further reduction in chip area.

Upon reading for each memory of the structure, the memory transistor for reading is made conductive to its right and left diffusion regions and inversion layers. At this time, memory information is determined according to whether a change in current occurs in the diffusion region according to the threshold voltage of the memory transistor. Upon writing for the memory of the structure, the memory transistor for writing is made conductive to its right and left diffusion regions and inversion layers to allow a write current to flow from the diffusion regions to the inversion layers. At this time, electric field concentration occurs between the corresponding inversion layer and a channel of the memory transistor by reducing the conductance of the control transistor adjacent to the memory transistor for writing, whereby hot electrons generated by the field concentration are injected into the corresponding charge storage region. This write system is referred to as "non cell-through write system".

SUMMARY OF THE INVENTION

However, it has been found out by the present inventors that since the conductance of each control transistor must be reduced in the non cell-through write system, the resistance of each inversion layer increases, the write current is reduced small and correspondingly write variations also increase, eventually leading to the fear that a reduction in write speed will become inescapable.

An object of the present invention is to provide a nonvolatile memory capable of improving the performance of writing for memory information.

The above, other objects and novel features of the present invention will become apparent from the description of the specification and the accompanying drawings.

Summaries of representative ones of the inventions disclosed in the present application will be explained in brief as follows:

[1] A nonvolatile memory according to the present invention has circuits each having first control transistors, memory transistors, second control transistors and memory transistors repeatedly connected in series in sequence. The nonvolatile memory includes read/write circuits each used to form inversion layers in a direction intersecting the serial direction with turning on of the first and second control transistors and perform reading and writing of memory information from and to each memory transistor, and a selection circuit which selects a connection of the inversion layer placed under the first control transistor and the corresponding read/write circuit. Upon a read operation, the second control transistor and one of the right and left first control transistors are turned on to perform reading of one of the right and left memory transistors. Upon a write operation, the first control transistors on both sides of the second control transistor as viewed from side to side are turned on to perform writing into the other memory transistor via one of the right and left memory transistors. At this time, the selection circuit controls a connection of the read/write circuit and the inversion layer placed under the first control transistor in such a manner that the same read/write circuit is used in reading and writing for the same memory transistor.

According to the above means, an inversion layer placed under an adjoining first control transistor is configured as one current path upon writing to one memory transistor. An inversion layer placed under another first control transistor that straddles a second control transistor and another memory transistor adjacent thereto on the opposite side thereof and is located ahead thereof, is used as the other current path. This write system will be referred to as "cell-through write system". According to it, in order to produce large field concentration between the memory transistor and the second control transistor when a write current flows from the memory transistor to the second transistor, only the conductance of the second control transistor may be reduced. There is no need to reduce the conductance of the inversion layer for the first control transistor, which functions as a wiring for causing the write current to flow. Accordingly, the performance of writing of memory information can be improved.

Further, a write operation for memory information is accompanied with a read operation called verify. The write operation is performed stepwise and memory information is read as occasion arises. It is determined whether the intended write state is reached according to the read memory information. Writing is continued using the read data until the read data reaches the intended data. According to it, even when the first control transistors used for the supply of the write current are spaced away from each other as in the cell-through write system, the use of the selection circuit is indispensable which controls the connection of the read/write circuit and the inversion layer placed under the first control transistor in such a manner that the same read/write circuit is used upon reading and writing for the same memory transistor. The selection circuit according to the means is used as a pledge for the writing based on the cell-through write system. In the case of such a configuration that one intrinsic read/write circuit is allocated every two adjoining inversion layers, for example, memory information is latched through the inversion layer on the drain side of each of the memory transistors disposed between the different read/write circuits upon the read operation, whereas upon the write operation based on the cell-through write system, another circuit different from the read/write circuit used upon the read operation must be used as the read/write circuit for controlling the potential on the source side of each memory transistor. Therefore, it is not possible to directly reflect data read for verify on the write operation.

[2] A nonvolatile memory according to a further specific form includes circuits each having first control transistors, memory transistors, second control transistors and memory transistors repeatedly connected in series in sequence. The nonvolatile memory includes read/write circuits each used to form inversion layers in a direction intersecting the serial direction with turning on of the first and second control transistors and perform reading and writing of memory information from and to each memory transistor, and a selection circuit which selects a connection of the inversion layer and the corresponding read/write circuit. A signal is read into the corresponding inversion layer placed under the first control transistor adjacent to the corresponding memory transistor to perform reading of memory information, and hot electrons are injected into the memory transistor for writing via the second control transistor and memory transistor adjacent to the memory transistor for writing to perform writing of memory information. Upon a read operation, the selection circuit connects the inversion layer placed under one first control transistor adjacent to the corresponding memory transistor for reading to the read/write circuit. Upon a write operation, the selection circuit connects the inversion layers placed under the pair of first control transistors interposing the memory transistor for the write operation therebetween to the read/write circuit. The selection circuit controls a connection of the read/write circuit and the inversion layer under placed the corresponding first control transistor in such a manner that the same read/write circuit is used in reading and writing for the same memory transistor.

[3] Further, a nonvolatile memory according to another form includes an insulating film formed over a main surface of a semiconductor substrate, first and second electrodes alternately formed over the insulating film in plural form in a first direction at predetermined intervals, a plurality of third electrodes formed over the insulating film at predetermined intervals in a second direction intersecting the first direction and insulated from the first and second electrodes, charge storage regions each disposed between the first and second electrodes and capable of selectively storing an electrical charge immediately below the third electrode, read/write circuits each used for reading of memory information corresponding to the state of the electrical charge held in the charge storage region and writing of memory information for controlling a charge holding state with respect to the charge storage region, and a selection circuit which selects a connection of an inversion layer selectively formed immediately below the first electrode and the corresponding read/write circuit. Upon reading of the memory information, the read/write circuit detects memory information using the inversion layers placed immediately below the right and left first electrodes adjacent to the charge storage region for reading, and an inversion layer placed immediately below the second electrode. Upon writing of the memory information, the read/write circuit controls a charge holding state using a current path extending from the inversion layer placed immediately below one of the right and left first electrodes adjacent to the charge storage region for writing to a weak inversion layer placed immediately below the other second electrode, an inversion layer placed below the third electrode adjacent thereto, and the inversion layer placed immediately below the first electrode adjacent thereto. The selection circuit controls a connection of the read/write circuit and the inversion layer under the first electrode in such a manner that the same read/write circuit is used in reading and writing of memory information from and to the same charge storage region.

In the above means, the first electrode constitutes a first control transistor, the second electrode constitutes a second control transistor, and the charge storage region and third electrode constitute a memory transistor. In a manner similar to above, there is no need to reduce the conductance of the inversion layer formed immediately below the first electrode, which functions as a wiring for causing a write current to flow. The performance of writing of memory information can be enhanced. When a verify operation is taken into consideration, a write operation based on a cell-through write system is enabled.

The read/write circuit includes, for example, a static latch, a detecting transistor which when one input/output node of the static latch is used as a reference node upon the operation of reading of memory information, level-changes the other input/output node of the static latch in response to the level of the inversion layer formed under the first electrode, and a current supply transistor which selectively supplies a current to the current path according to write data held in the static latch upon the operation of writing of memory information.

The selection circuit can adopt, for example, such a configuration as to select the corresponding inversion layer necessary for processing from the inversion layers immediately below the four first electrodes depending upon the position of the charge storage region for reading or writing of the memory information, of the charge storage regions disposed among the four first electrodes with respect to the one read/write circuit and the inversion layers placed immediately below its corresponding four first electrodes provided in parallel continuously, and to connect the selected inversion layer to the one read/write circuit. The selection circuit may also adopt such a configuration as to select the corresponding inversion layer necessary for processing from the inversion layers placed immediately below the three first electrodes depending upon the position of the charge storage region for reading or writing of the memory information, of the charge storage regions disposed among the three first electrodes with respect to the one read/write circuit and the inversion layers placed immediately below the three first electrodes corresponding to the read/write circuit provided in parallel continuously, and to connect the selected inversion layer to the one read/write circuit.

Upon the write operation of the memory information, the read/write circuit sets, for example, a first potential to the first electrode adjacent to the charge storage region for writing, sets a second potential lower than the first potential to the first electrode located on the side opposite to the first electrode, and applies a third potential lower than the voltage applied to the pair of first electrodes to the second electrode adjacent to the charge storage region. Consequently, hot electrons are generated at a boundary between the inversion layer placed immediately below the second electrode to which the third potential is applied, and a channel placed immediately below the charge storage region adjacent to the inversion layer, and hence a high potential for injecting the hot electrons in the charge storage region is applied to the corresponding third electrode.

Upon the read operation of the memory information, for example, the read/write circuit precharges the corresponding inversion layer placed immediately below the first electrode adjacent to the charge storage region for reading to a fourth potential to forcibly set the corresponding inversion layer placed immediately below the second electrode on the opposite side thereof to a potential lower than the fourth potential, thereby detecting the presence or absence of a change in the precharged first potential.

The operation of initializing the charge holding state is enabled with respect to the charge storage region. Upon such an initializing operation, a fifth potential is set to the corresponding inversion layer immediately below the first electrode and the corresponding inversion layer immediately below the second electrode. Further, a negative sixth potential lower than the fifth potential is set to the third electrode, whereby electrons are moved in their emission direction from the corresponding charge storage region immediately below the third electrode to which the sixth potential is set.

[4] According to another aspect of the present invention, a wiring based on a diffused layer or the like may be adopted in place of the first control transistor. This wiring bears a signal transfer function based on the inversion layer formed immediately below the first control transistor.

A nonvolatile memory according to this aspect includes read/write circuits in which two memory transistors and one control transistor are alternately disposed in series between two wirings and each of which is used to form inversion layers in a direction parallel to the wirings with turning on of the control transistor and perform reading and writing of memory information from and to the corresponding memory transistor, and a selection circuit which selects a connection of each inversion layer and the read/write circuit. Upon a read operation, an inversion layer is formed in the center control transistor, the reading of the memory transistor between one of right and left wirings and its corresponding inversion layer placed below the center control transistor is performed, and the writing into the other of the right and left memory transistors is performed via the right and left wirings and one of the right and left memory transistors upon a write operation. At this time, the selection circuit controls a connection of the read/write circuit and the wirings in such a manner that the same read/write circuit is used in reading and writing for the same memory transistor. In a manner similar to the above, there is no need to reduce the conductance of a wiring for causing a write current to flow. The performance of writing of memory information can be improved. When a verify operation is taken into consideration, a write operation based on a cell-through write system is enabled.

A nonvolatile memory according to a further specific form includes read/write circuits in which two memory transistors and one control transistor are alternately disposed in series between two wirings and each of which is used to form inversion layers in a direction parallel to the wirings with turning on of the control transistor and perform reading and writing of memory information from and to the corresponding memory transistor, and a selection circuit which selects a connection of the wirings and the read/write circuit. A signal is read into the wiring adjacent to the corresponding memory transistor to perform reading of memory information, and hot electrons are injected into the memory transistor for writing via the control transistor and memory transistor adjacent to the memory transistor for writing to perform writing of memory information. Upon a read operation, the selection circuit connects one wiring adjacent to the corresponding memory transistor for reading to the corresponding read/write circuit. Upon a write operation, the selection circuit connects the pair of wirings interposing the memory transistor for the write operation therebetween to the corresponding read/write circuit. The selection circuit controls a connection of the read/write circuit and the wiring in such a manner that the same read/write circuit is used in reading and writing for the same memory transistor.

A nonvolatile memory according to a further form from an aspect similar to the above includes an insulating film formed over a main surface of a semiconductor substrate, a plurality of first electrodes each formed of a diffused layer, which are formed over the main surface of the semiconductor substrate at predetermined intervals in a first direction, a plurality of second electrodes formed over the insulating film in the first direction alternately with respect to the first electrodes, a plurality of third electrodes formed over the insulating film at predetermined intervals in a second direction intersecting the first direction and insulated from the first and second electrodes, charge storage regions each disposed between the first and second electrodes and capable of selectively storing an electrical charge immediately below the third electrode, read/write circuits each used for reading of memory information corresponding to a state of the electrical charge held in the charge storage region and writing of memory information for controlling a charge holding state with respect to the charge storage region, and a selection circuit which selects a connection of the first electrode and the corresponding read/write circuit. Upon reading of the memory information, the read/write circuit detects memory information using inversion layers placed immediately below the right and left first and second electrodes adjacent to the charge storage region for reading. Upon writing of the memory information, the read/write circuit controls a charge holding state using a current path extending from one of the right and left first electrodes adjacent to the charge storage region for writing to a weak inversion layer placed immediately below the other second electrode, an inversion layer placed below the third electrode adjacent thereto, and the first electrode adjacent thereto. The selection circuit controls a connection of the read/write circuit and the first electrode formed of the diffused layer in such a manner that the same read/write circuit is used in reading and writing of memory information from and to the same charge storage region.

The read/write circuit includes, for example, a static latch, a detecting transistor which when one input/output node of the static latch is used as a reference node upon the operation of reading of memory information, level-changes the other input/output node of the static latch in response to the level of the first electrode, and a current supply transistor which selectively supplies a current to the current path according to write data held in the static latch upon the operation of writing of memory information.

The selection circuit may adopt, for example, such a configuration as to select the corresponding first electrode necessary for processing from the four first electrodes depending upon the position of the charge storage region for reading or writing of the memory information, of the charge storage regions disposed among the four first electrodes with respect to the one read/write circuit and the four first electrodes corresponding to the read/write circuit provided in parallel continuously, and to connect the selected first electrode to the one read/write circuit. The selection circuit may also adopt such a configuration as to select the corresponding first electrode necessary for processing from the three first electrodes depending upon the position of the charge storage region for reading or writing of the memory information, of the charge storage regions disposed among the three first electrodes with respect to the one read/write circuit and the three first electrodes corresponding to the read/write circuit provided in parallel continuously, and to connect the selected first electrode to the one read/write circuit.

Upon the write operation of the memory information, for example, the read/write circuit sets a first potential to one first electrode adjacent to the charge storage region for writing, sets a second potential lower than the first potential to the first electrode located on the side opposite to the first electrode, applies a third potential for generating hot electrons to the corresponding second electrode adjacent to the charge storage region at a boundary between the inversion layer placed immediately below the second electrode, and a channel placed immediately below the charge storage region adjacent to the inversion layer, and applies a high potential for injecting the hot electrons in the charge storage region to the corresponding third electrode.

Upon the read operation of the memory information, for example, the read/write circuit precharges the first electrode adjacent to the charge storage region for reading to a fourth potential to forcibly set the corresponding inversion layer placed immediately below the second electrode on the opposite side thereof to a potential lower than the fourth potential, thereby detecting the presence or absence of a change in the precharged first potential.

The operation of initializing the charge holding state is enabled with respect to the charge storage region. Upon such an initializing operation, a fifth potential is set to the corresponding inversion layers immediately below the first and second electrodes and a negative sixth potential lower than the fifth potential is set to the third electrode, whereby electrons are moved in their emission direction from the corresponding charge storage region immediately below the third electrode to which the sixth potential is set.

An advantageous effect obtained by a representative one of the inventions disclosed in the present application will be explained in brief as follows:

Write performance for memory information can be improved in a nonvolatile memory.

DETAILED DESCRIPTION OF THE PREFFERED EMBODIMENTS

<<Overall Configuration of Flash Memory>>

Figure 1:
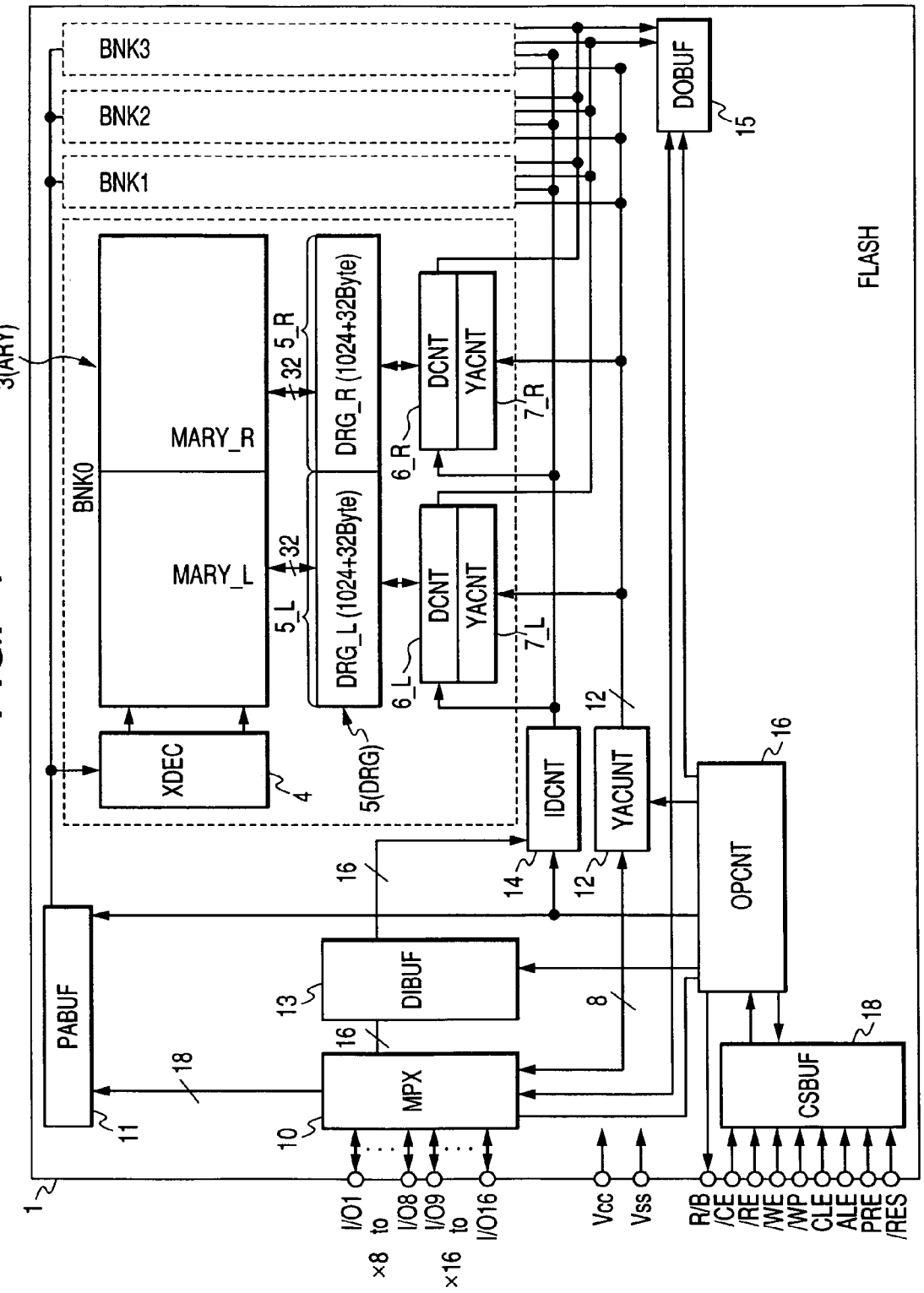
FIG. 1 is a block diagram of a flash memory according to one embodiment of the present invention.

A flash memory is illustrated in FIG. 1. The flash memory 1 is formed over one semiconductor substrate such as monocrystalline silicon or the like.

Although not restricted in particular, the flash memory 1 has four memory banks BNK0 through BNK3. The respective memory banks BNK0 through BNK3 have configurations identical to one another and can be operated in parallel. The configuration of the memory bank BNK0 is typically illustrated in detail in the figure. Each of the memory banks BNK0 through BNK3 includes a flash memory array (ARY) 3, an X decoder (XDEC) 4, a data register (DRG) 5, data controllers (DCNT) 6_R and 6_L, and Y address controllers (YACNT) 7_R and 7_L.

The memory array 3 has a large number of electrically erasable and programmable nonvolatile memory transistors. The details of the memory array will be described in detail later. However, the memory array is configured as a stacked gate structure in which memory gates are stacked on one another in a charge storage region with an insulating film interposed therebetween although memory transistors are not restricted in particular. An erase process corresponding to initialization of memory information with respect to each of the memory transistors is, although not restricted in particular, performed as the process of applying a circuit ground potential to the source of the memory transistor and a well, and applying a negative high voltage to each memory gate to move electrons in the charge storage region in an electron emission direction, thereby reducing a threshold voltage. A process for writing memory information into the memory transistor is performed as the process of causing a current to flow from the drain of the memory transistor to its source to thereby generate hot electrons at a substrate surface at its source end and injecting them into the corresponding charge storage region with a high voltage-based electric field of the memory gate, thereby increasing a threshold voltage. A read process is performed as the process of precharging a bit line in advance, selecting a memory transistor with a predetermined read decision level as a word line selection level and allowing memory information to be detected according to a change in current flowing through the bit line or a change in voltage level that appears on the bit line. A read/write circuit to be described later is connected to the bit line. The read/write circuit latches memory information read into the bit line by the read process and is used in bit line driving or the like based on write data upon the write process. Data input/output nodes of the read/write circuit are connected to their corresponding input/output nodes of a plurality of main amplifiers through selectors in plural bit units. Incidentally, the storage of information by one nonvolatile memory may be performed in the form of a binary corresponding to one bit or a multivalue of 2 bits or more. In the case of, for example, 2 bits, although not restricted in particular, a data register connected to the bit line is further provided. Then, the process of determining and reading 2-bit memory data while pre- and post-results read several time in parts from the corresponding memory cell by changing a read decision level are being held in the corresponding sense latch and data register in several is performed. Further, a write process is performed so as to set a threshold voltage corresponding to the values of 2 bits while separately retaining 2-bit write data into the corresponding sense latch and data register.

Although not restricted in particular, the flash memory 3 is divided into the left and right areas (MARY_R and MARY_L). For example, each of the MARY_R and MARY_L includes a memory capacity of 1024+32 bytes as 65536 pages. In the present example, odd-numbered pages are assigned to the MARY_L on the left side with 1024+32 bytes as a data storage unit (1 page), whereas even-numbered pages are allocated to the MARY_R on the right side. The X decoder decodes a page address used as an access address for the flash memory array and selects a corresponding memory cell in page unit in a ×8-bit input/output mode although not restricted in particular. In the case of a ×16-bit input/output mode, a corresponding memory cell is selected in 2-page units for each odd-numbered page address.

The data register 5 has a static memory array and is divided into the left and right areas (DRG_R and DRG_L) although not restricted in particular. For example, each of the areas DRG_R and DRG_L is provided with a memory capacity of 1024+32 bytes. The area DRG_R and the area DRG_L respectively have a memory capacity of one page set as the data storage unit. A data register assigned the area DRG_R is referred to as "data register 5_R" for convenience, and a data register assigned the DRG_L is called "data register 5_L" for convenience.

The flash memory 3 and the data register 5 perform the input/output of data. When, for example, the selectors provided in the flash memory array 3 respectively connect data input/output nodes of read/write circuits to their corresponding input/output nodes of the main amplifier, the selection of the selectors is sequentially automatically switched by an internal clock to enable the transfer of data corresponding to one page between the memory array 3 and the data registers 5_L and 5_R.

Each of the data registers 5_L and 5_R comprises an SRAM, for example. In the present example, the area DRG_R and the area DRG_L are respectively constituted of discrete SRAMs. The data controller 6_R (6_L) controls the input/output of data from and to the data register 5_R (5_L). The Y address controller 7_R (7_L) performs address control on the data register 5_R (5_L).

External input/output terminals I/O1 through I/O16 are shared for an address input terminal, a data input terminal, a data output terminal and a command input terminal and connected to a multiplexer (MPX) 10. Page addresses inputted to the external input/output terminals IO1 through I/O16 are inputted from the multiplexer 10 to a page address buffer (PABUF) 11. Y addresses (column addresses) are preset from the multiplexer 10 to a Y address counter (YACUNT) 12. Write data inputted to the external input/output terminals 101 through I/O16 are supplied from the multiplexer 10 to a data input buffer (DIBUF) 13. The write data supplied to the data input buffer 13 are inputted to the data controllers 6_L and 6_R through an input data controller (IDCNT) 14. ×8 bits or ×16 bits are selected for the input/output of data from the external input/output terminals I/O1 through I/O16. When the ×16-bit input/output is being selected, the input data controller 14 gives 16-bit write data to the data controllers 6_R and 6_L in parallel according to the data controllers 6_R and 6_L. When the ×8-bit input/output is being selected, the input data controller 14 supplies 8-bit write data to the data controller 6_L in the case of an odd-numbered page, and supplies 8-bit write data to the data controller 6_R in the case of an even-numbered page. Read data outputted from the data controllers 6_R and 6_L are supplied to the multiplexer 10 via a data output buffer (DBUF) 15, followed by being outputted from the external input/output terminals I/O1 through I/O16.

Some of command codes and address signals supplied to the external input/output terminals I/O1 through I/O16 are supplied from the multiplexer 10 to an internal controller (OPCNT) 16.

The X decoder 4 decodes each of the page addresses supplied to the page address buffer 11 and selects a word line from the memory array 5 in accordance with the result of decoding. Although not restricted in particular, the Y address counter 12 to which the Y addresses supplied to the page address buffer 11 are preset, is configured as a 12-bit counter, and performs address counting with a preset value as a starting point and supplies a counted Y address to each of the Y address controllers 7_R and 7_L. The counted Y addresses are used as address signals when the corresponding write data supplied from the input data controller (IDCNT) 14 is written into the data register 5 and when the corresponding read data supplied to the output buffer 15 is selected from the data register 5. Each of the Y addresses supplied to the page address buffer 11 is equal to the leading address of the counted Y addresses. The leading Y address is called "access leading Y address".

A control signal buffer (CSBUF) 18 is supplied with a chip enable signal /CE, a command latch enable signal CLE, an address latch enable signal ALE, a write enable signal /WE, a read enable signal /RE, a write protect signal /WP, a power-on-read enable signal PRE, and a reset signal /R as external access control signals. A code "/" added to the head of each signal means that the signal is low enable.

The chip enable signal /CE is of a signal which selects the operation of the flash memory 1. When the chip enable signal /CE is low in level, the flash memory (device) 1 is rendered active (made operable), whereas when it is high in level, the flash memory 1 is brought to standby (deactivated). The read enable signal /RE controls data output timings from the external input/output terminals I/O1 through I/O16. Data is read in sync with a clock change in the signal. The write enable signal /WE provides instructions for capturing a command, an address and data into the flash memory 1 on the rising edge thereof. The command latch enable signal CLE is of a signal for designating data supplied to the external input/output terminals 1/O1 through I/O16 from outside as commands. The data of the output terminals I/O1 through I/O16 are captured in sync with the rising edge of /WE when CLE="H", and are recognized as the commands. The address latch enable signal ALE is of a signal for designating data supplied to the external input/output terminals I/O1 through I/O16 from outside as addresses. When ALE="H" (High level), the data of the output terminals I/O1 through I/O16 are brought in sync with the rising edge of /WE and recognized as the addresses. The write protect signal /WP inhibits the flash memory 1 from performing erasure and writing with its low level. The power-on-read enable signal PRE is enabled when a power on read function for reading data of a predetermined sector without inputting commands and addresses after power-on is used. The reset signal /RES instructs the flash memory 1 to perform an initializing operation with its transition from a low level to a high level after power-on.

The internal controller 16 performs interface control in accordance with the access control signals or the like and controls internal operations such as an erase process, a write process and a read process according to the input commands. Also the internal controller 16 outputs a ready busy signal R/B. When the flash memory 1 is in operation, the ready busy signal R/B is brought to a low level and thereby notifies a busy state to the outside. Vcc indicates a power supply voltage and Vss indicates a ground voltage respectively. High voltages necessary for the write and erase processes are generated by an internal booster or step-up circuit (not shown) based on the power supply voltage Vcc.

<<Memory Array Using Inversion Layers for Bit Lines>>

Figure 2:
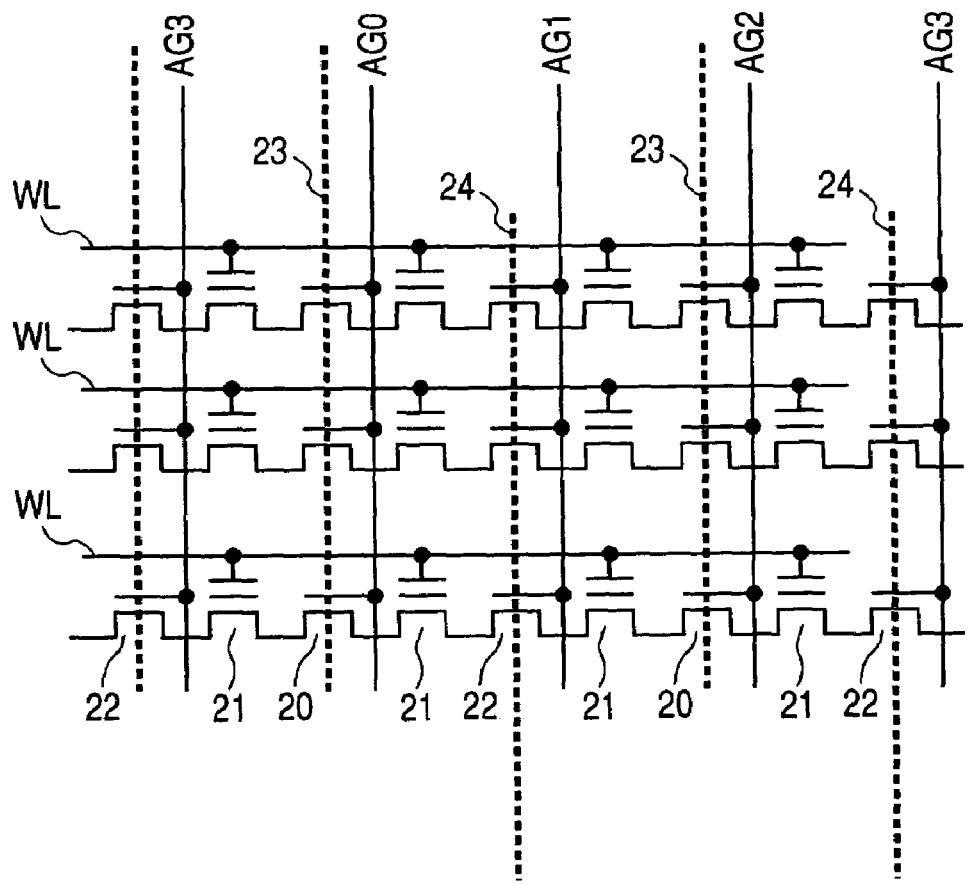
FIG. 2 is a circuit diagram illustrating a transistor layout of a memory array.

A transistor layout of a memory array 3 is illustrated in FIG. 2. The memory array 3 has a plurality of circuits in which first control transistors 20, memory transistors 21, second control transistors 22 and memory transistors 21 are repeatedly series-connected in sequence. Select terminals (memory gates) of the memory transistors 21 are electrically connected to their corresponding word lines WL every rows. The first control transistors 20 are sequentially switch-controlled by control signals AG0 and AG2 every columns. The second control transistors 22 are sequentially switch-controlled by control signals AG1 and AG3 every columns. In short, switch states of the first and second control transistors 20 and 22 are respectively controlled by the control signals AG0 through AG3 every control transistor columns corresponding to four columns of the first and second control transistors 20 and 22 in total. They conform to read, write and erase operation forms while control forms will be described later. With turning on of the first and second control transistors 20 and 22, inversion layers 23 and 24 are formed in the directions intersecting the serial direction. The inversion layers 23 and 24 function as local bit lines and source lines.

Figure 3:
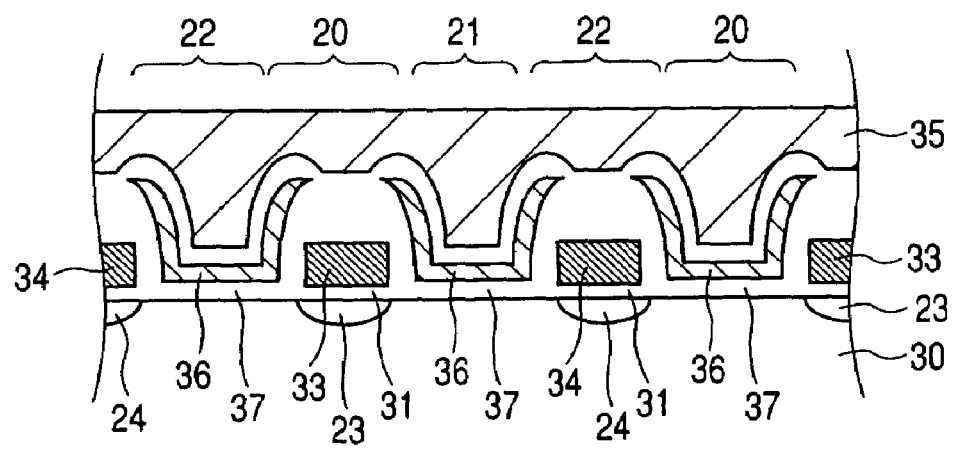
FIG. 3 is a sectional view illustrating a vertical sectional structure of a device taken along a word line.

A vertical sectional structure of a device taken along a word line is illustrated in FIG. 3. An insulating film 31 is formed over a main surface of a p-type semiconductor substrate 30. First electrodes 33 and second electrodes 34 are formed over the insulating film 31 in plural form in a first direction (direction as viewed from the obverse and reverse sides of the sheet in FIG. 3) alternately at predetermined intervals. The first electrodes 33 and the second electrodes 34 are respectively formed of, for example, a polysilicon gate electrode material and configured as gate electrodes of the control transistors 20 and 22. A plurality of third electrodes 35 insulated from the first and second electrodes 33 and 34 are formed at predetermined intervals in a second direction (direction as viewed from side to side on the sheet in FIG. 3) intersecting the first direction. Further, charge storage regions 36 capable of selectively storing electrical charges immediately below the third electrodes are respectively formed between the first electrodes 33 and the second electrodes 34. The third electrodes 35 function as memory gates (word lines WL) for the memory transistors 21 and are formed of, for example, a polysilicon gate electrode material. Each of the charge storage regions 36 is configured as a charge trap region constituted of, for example, a silicon nitride film, or a floating gate electrode constituted of a polysilicon film. The inversion layers 23 and 24 are selectively induced at the surface of the semiconductor substrate 30. Designated at 37 is an insulating film formed between the charge storage regions 36 and the semiconductor substrate 30. No diffusion layers each used as a high-concentration impurity region are formed among the first control transistors 20, memory transistors 21 and second control transistors repeatedly disposed in series.

<<Selected Form of Read Path>>

Figure 4:
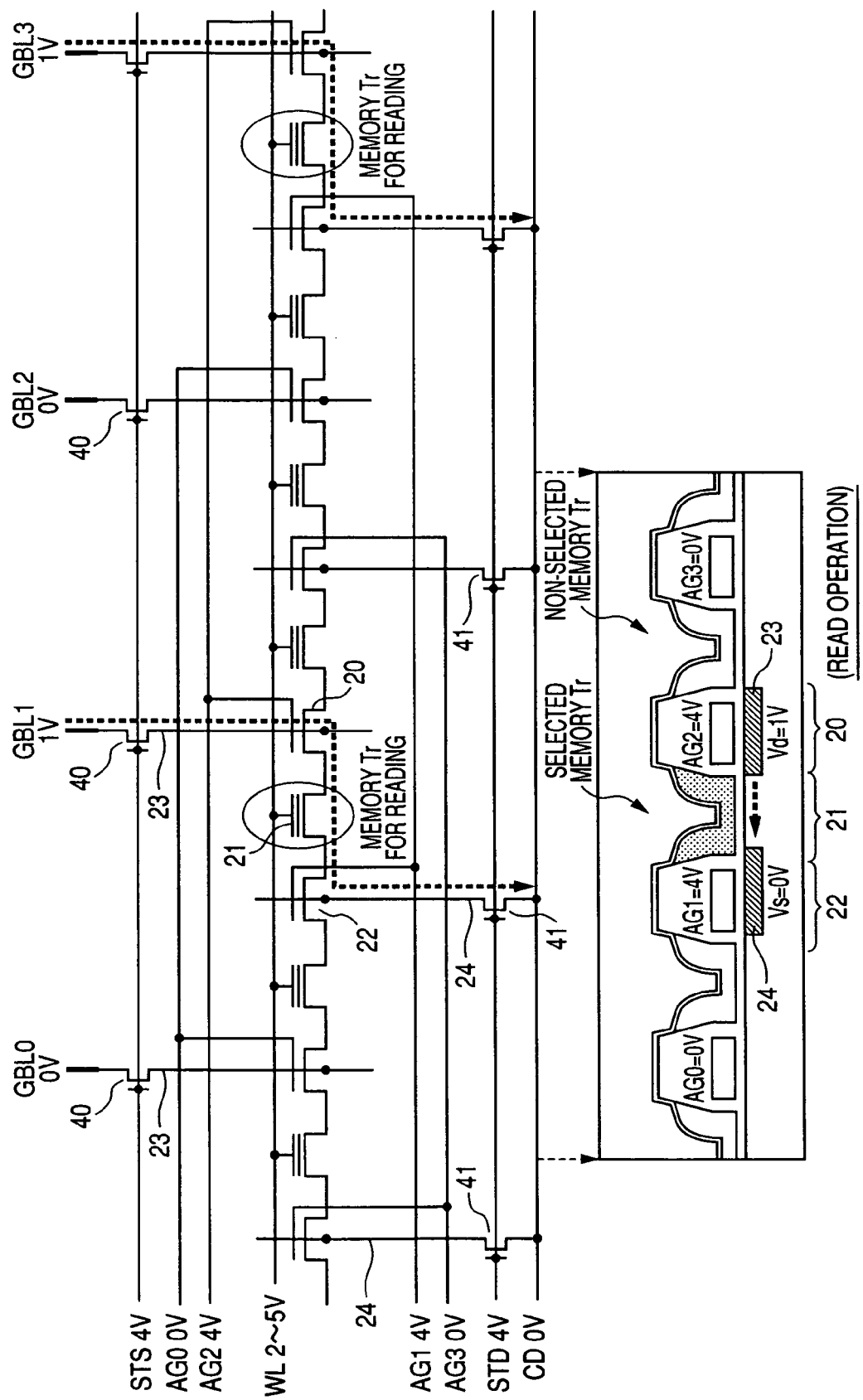
FIG. 4 is a circuit diagram illustrating a selected form of signal paths for a read operation.

A selected form of signal paths at a read operation is shown in FIG. 4. While the inversion layers 23 function as the local bit lines as mentioned above, the inversion layers 23 are connected to their corresponding global bit lines GLB0 through GBL3 via selection switches 40. While the inversion layers 24 function as the local source lines as mentioned above, the inversion layers 24 are connected to their corresponding common line CD via selection switches 41.

Upon the read operation, an inversion layer 24 for a second control transistor 22 adjacent to a memory transistor 21 for reading is connected to a circuit ground voltage (0 volt (V)). An inversion layer 23 for a first control transistor 20 is connected to a read/write circuit to be described later to form a signal path. When a word line WL is supplied with a decision selection level (ranging from 2 to 5V), a current that flows through the inversion layer 23 is pulled out if the threshold voltage of the memory transistor 21 is lower than the decision selection level. If the threshold voltage of the memory transistor 21 is higher than the decision selection level, then no current flows through the inversion layer 23. Thus, the read/write circuit to be described later detects whether a change in level occurs in the inversion layer 23 thereby to read memory information. Since quaternary storage for retaining 2-bit memory information in one memory transistor 21 is assumed to be used here, plural levels are selected as decision levels. Since the memory transistor 21 adjoining to the right side of the second control transistor 22 is intended for reading according to FIG. 4, control signals AG2 and AG1 are respectively brought to a selection level of 4V and control signals AG0 and AG3 are respectively brought to a non-selection level of 0V. When the memory transistor 21 adjoining to the left side of the second control transistor 22 is intended for reading although not shown in the figure, the control signals AG2 and AG3 are respectively brought to the non-selection level of 0V and the control signals AG0 and AG1 are respectively brought to the selection level of 4V.

<<Selected Form of Write Path>>

Figure 5:
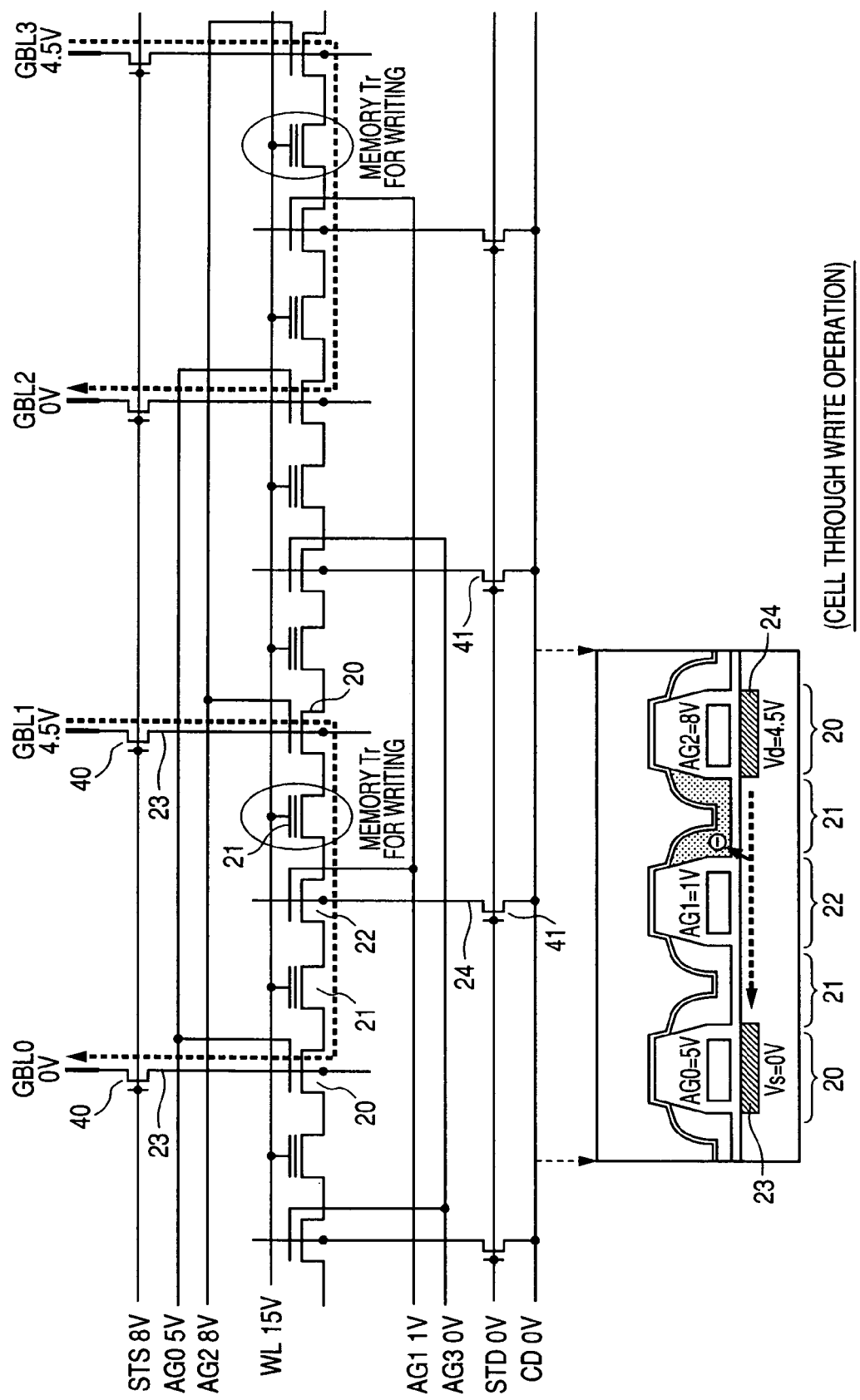
FIG. 5 is a circuit diagram illustrating signal paths for a write operation by a cell through write system.

Signal paths at a write operation based on a cell-through write system are illustrated in FIG. 5. Upon the write operation, first control transistors 20 located on both sides of a memory transistor 21 for writing are turned on (forcibly-inverted) so as to have comparatively large conductance to form inversion layers 23 (GBL0 and GBL1 sides). A second control transistor 22 provided therebetween is turned on (weak-inverted) so as to have comparatively small conductance to form an inversion layer 24. A high voltage is applied to a word line WL to turn on the memory transistor 21 thereby to form a current path. For example, a first potential like 8V is set to the gate of the first control transistor 20 adjacent to the memory transistor 21 for writing (AG2=8V), and a second potential like 5V lower than the first potential is set to the first control transistor 20 placed on the opposite side thereof (AG0=5V). A third potential like 1V lower than the first and second voltages is applied to the gate of the second control transistor 22 adjacent to the memory transistor fro writing (AG1=1V). In this condition, a potential like 4.5V is set to the inversion layer 23 (GBL1 side) adjacent to the memory transistor 21 for writing, and a ground potential like 0V is applied to the inversion layer 24 formed by the second control transistor 22 placed on the opposite side thereof and the inversion layer 23 (GBL0 side) formed by the first control transistor 20 placed ahead thereof. Thus, while a current flows through the inversion layer 23 on the GBL0 side from the inversion layer 23 on the GBL1 side, an electric field concentrates between a channel of the memory transistor 21 for writing and the weak inversion layer 24 small in conductance, of the second control transistor 22 adjacent to the memory transistor 21. With the occurrence of such electric field concentration, hot electrons occur in the surface of the semiconductor substrate at the position of its occurrence. The hot electrons are injected into the corresponding charge storage region 36 of the memory transistor 21 according to an electric field based on the high potential of the word line WL. With the injection of the electrons into the charge storage region 36, the threshold voltage of the memory transistor 21 is rendered high. According to the example of FIG. 5, in order to suppress the write operation, the voltage applied to the inversion layer 23 on the GBL0 side is set to 2V, and the hot electrons generated by the field concentration between the channel of the memory transistor 21 for writing and the weak inversion layer 24 small in conductance, of the second control transistor 22 adjacent thereto may be suppressed. The read/write circuit not shown in the drawing controls the voltage applied to the inversion layer 23 on the GBL0 side on the basis of write data to thereby control writing and write inhibition. Whether its threshold voltage reaches an intended threshold voltage according to the write operation, is confirmed by a verify operation. Since the verify operation is performed after the selection of the read paths described in FIG. 4, the read/write circuit must read memory information through the inversion layer 23 on the GBL1 side upon the verify operation and reflect the result of reading on the control on the potential of the inversion layer 23 on the GBL0 side as write data. This can be realized by a selection circuit (to be described in detail later) that controls the connection of the read/write circuit and each global bit line.

Incidentally, the direction of a write current may be reversed to set the memory transistor 21 adjoining to the left side of the second control transistor 22 as one intended for writing. When each memory transistor between the GBL1 and GBL2 is intended for writing, the control signal AG1 is changed to 0V and the control signal AG3 is changed to 1V, and the direction of a write current is controlled according to the voltages applied to the GBL1 and GBL2, whereby the position of an operable second control transistor may be interchanged between even- and odd-numbered positions.

In order to initialize the state of the threshold voltage of the written memory transistor, although not illustrated in the drawing in particular, a fifth potential like a circuit ground voltage is set to the inversion layers 23 and 24 of the first control transistor 20 and the second control transistor 22, the semiconductor substrate is set to the circuit ground potential, and a sixth potential like a negative potential of −12V is set to the corresponding word line WL. Thus, the electrons are moved in their emission direction from the charge storage region, and the threshold voltage of the memory transistor 21 is reduced.

Figure 6:
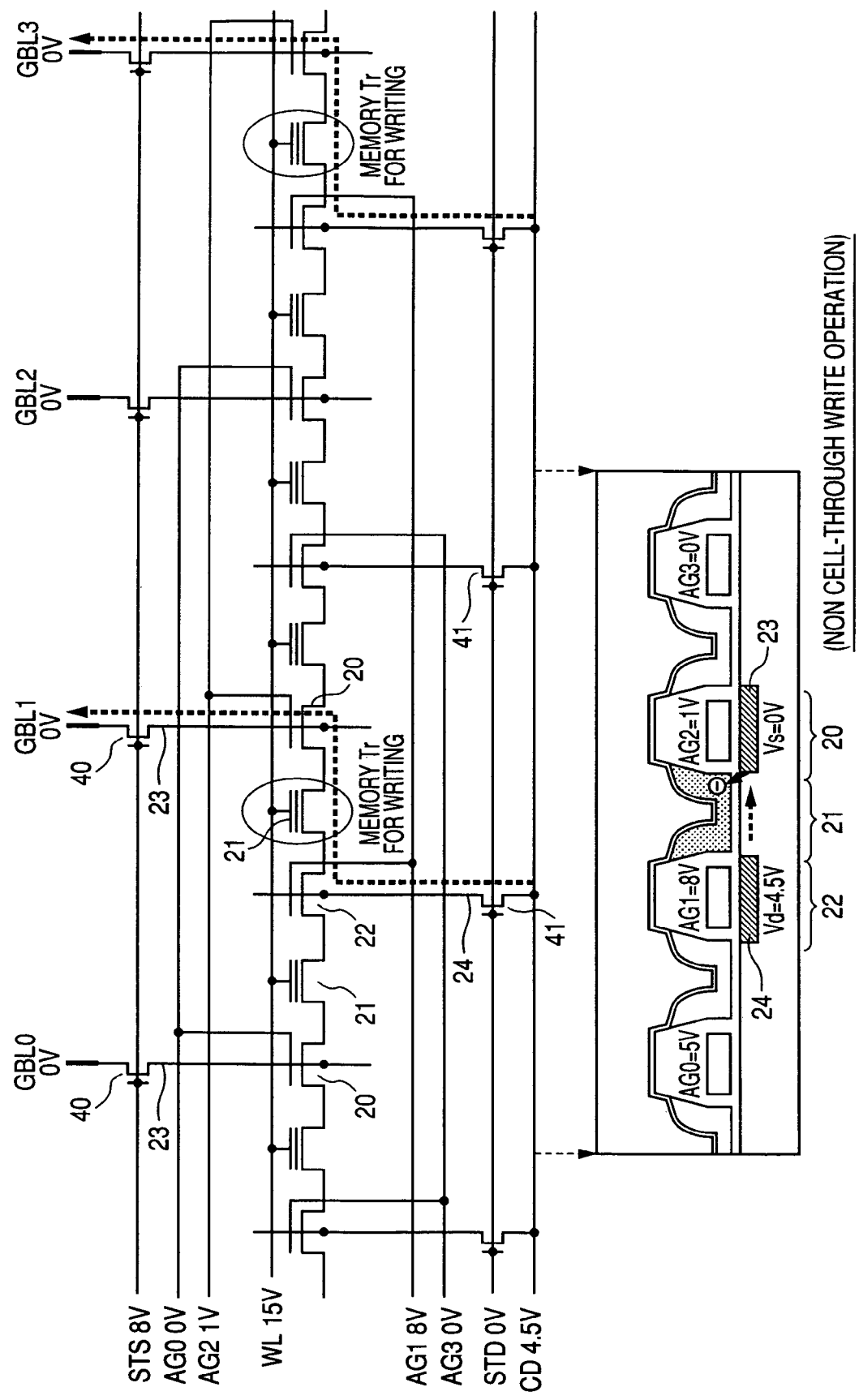
FIG. 6 is a circuit diagram illustrating signal paths for a write operation by a non cell-through write system as a reference.

Signal paths for a write operation by a non cell-through write system are illustrated in FIG. 6 as a reference. In the non cell-through write system, a write current is caused to flow from an inversion layer 24 based on a second control transistor 22 adjacent to a memory transistor 21 for writing on the one hand to an inversion layer 23 based on a first control transistor 20 adjacent to the memory transistor on the other hand. Control on the write current by the corresponding read/write circuit may be performed from the GBL1 side. The detection of read data by a verify operation may also be carried out from the same GBL1 side as the side for the write control. Since, however, low conductance must be set to the inversion layer 23 to generate hot electrons, the write current itself is reduced and hence a write time and variations in write characteristic are forced to increase.

<<Selected Form by Selection Circuit>>

Figure 7:
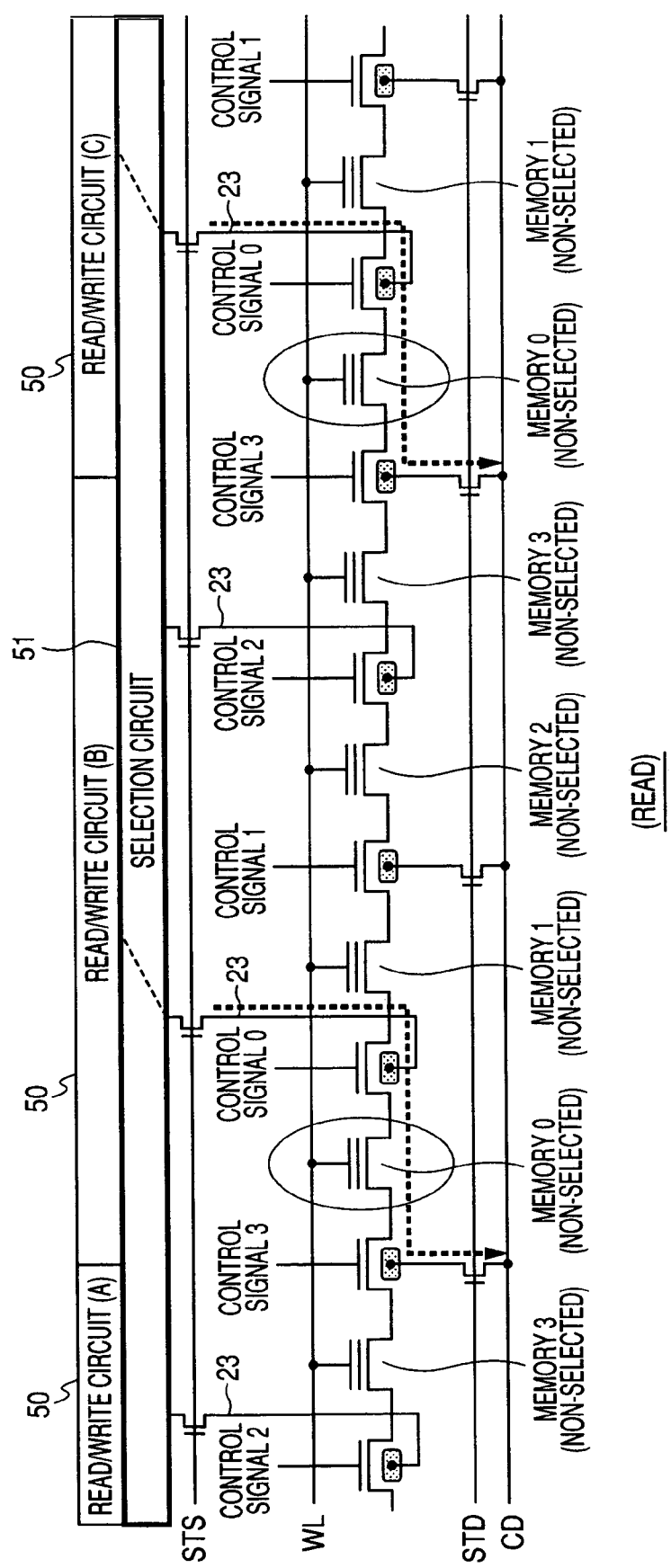
FIG. 7 is a circuit diagram showing a connected configuration at the time that memories 0 are intended for reading, as a selected form of their corresponding inversion layers by a selection circuit.
Figure 8:
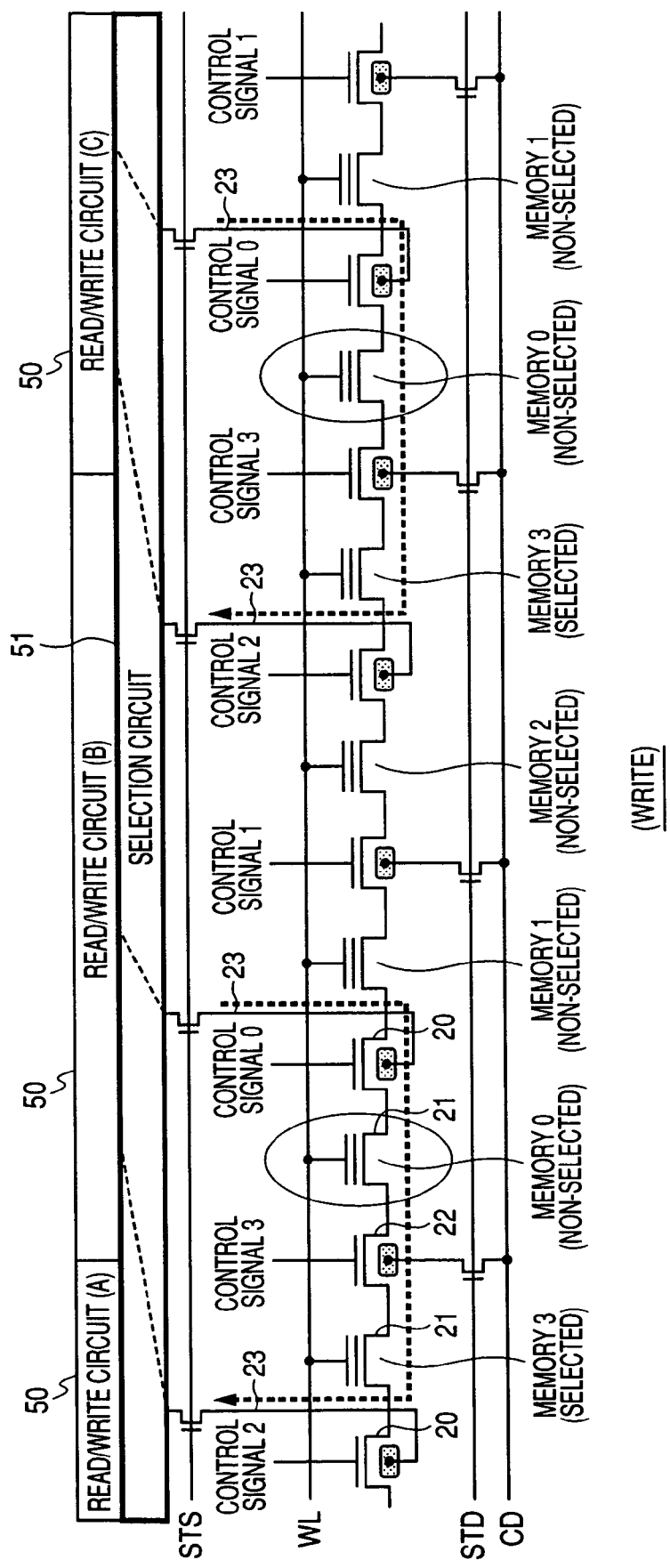
FIG. 8 is a circuit diagram showing a connected configuration at the time that the memories 0 are intended for writing, as a selected form of their corresponding inversion layers by the selection circuit.
Figure 9:
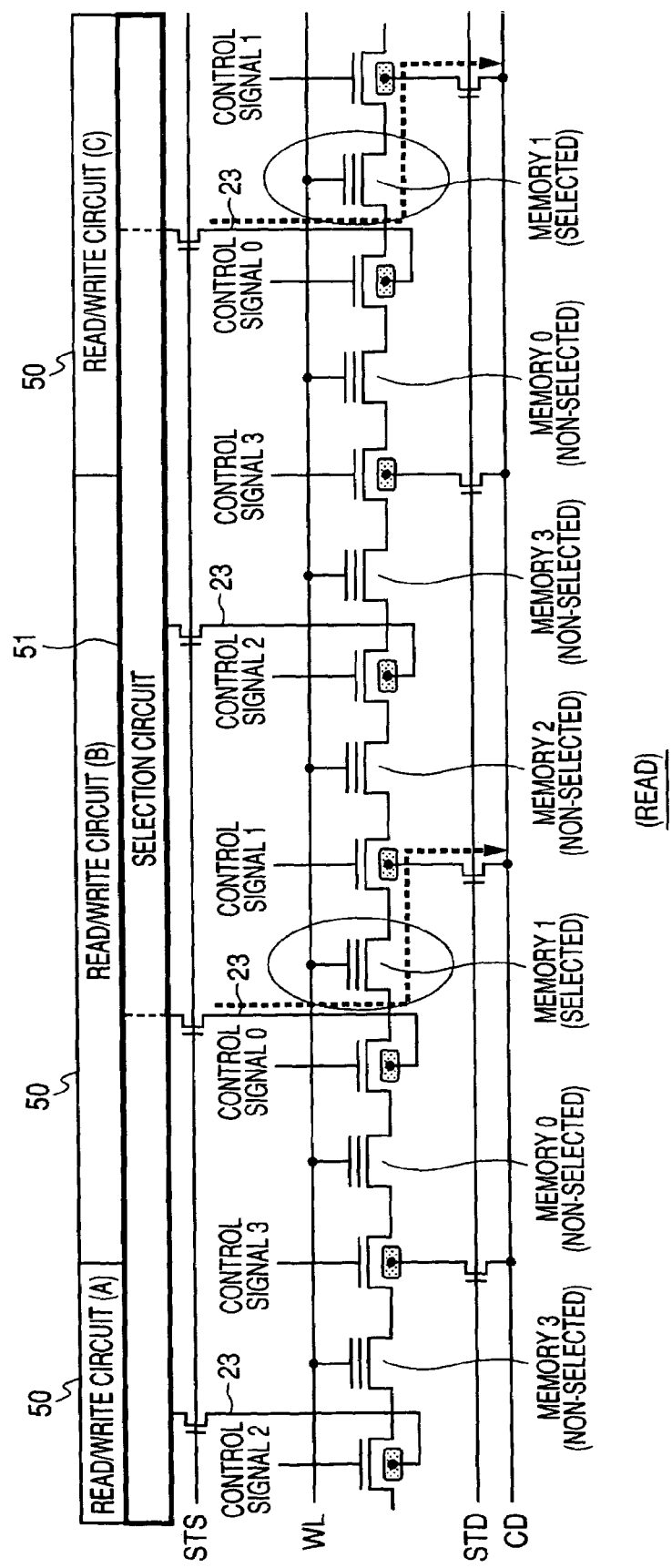
FIG. 9 is a circuit diagram depicting a connected configuration at the time that memories 1 are intended for reading, as a selected form of their corresponding inversion layers by the selection circuit.
Figure 10:
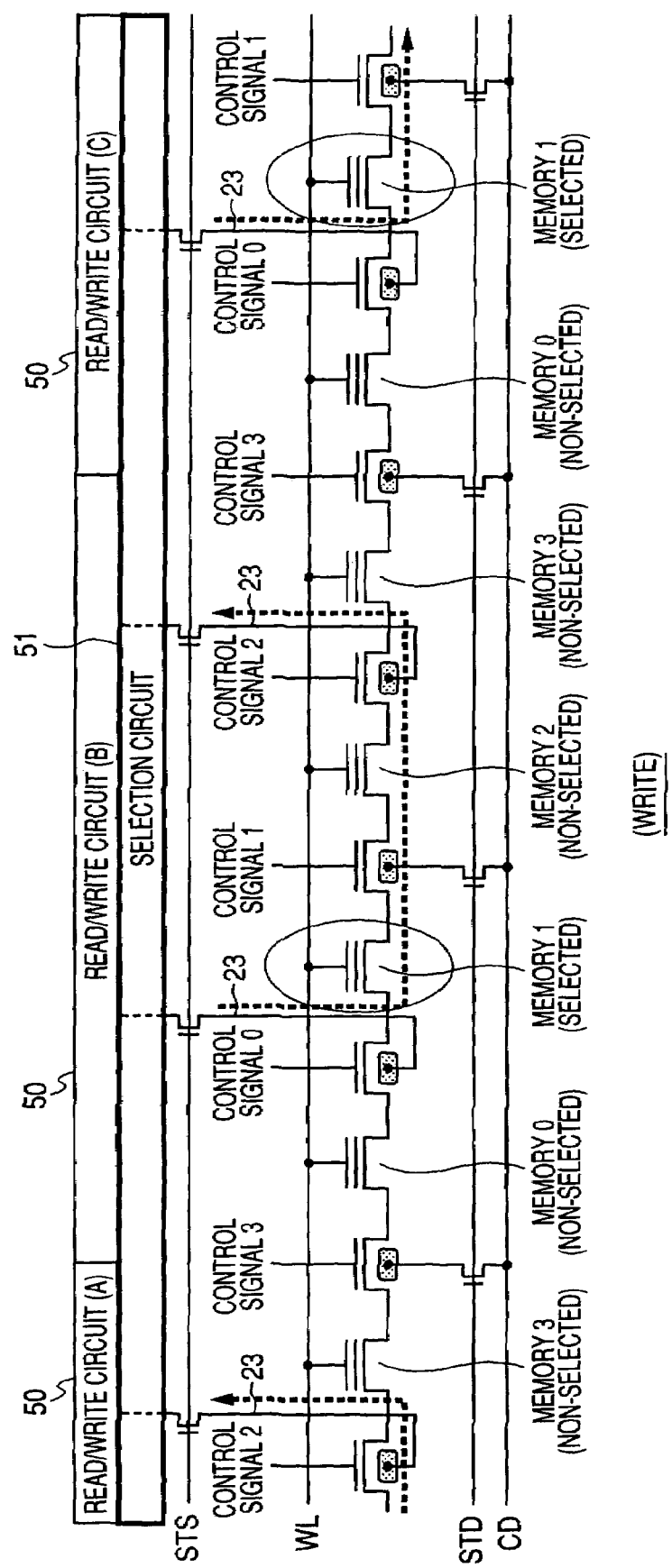
FIG. 10 is a circuit diagram showing a connected configuration at the time that the memories 1 are intended for writing, as a selected form of their corresponding inversion layers by the selection circuit.
Figure 11:
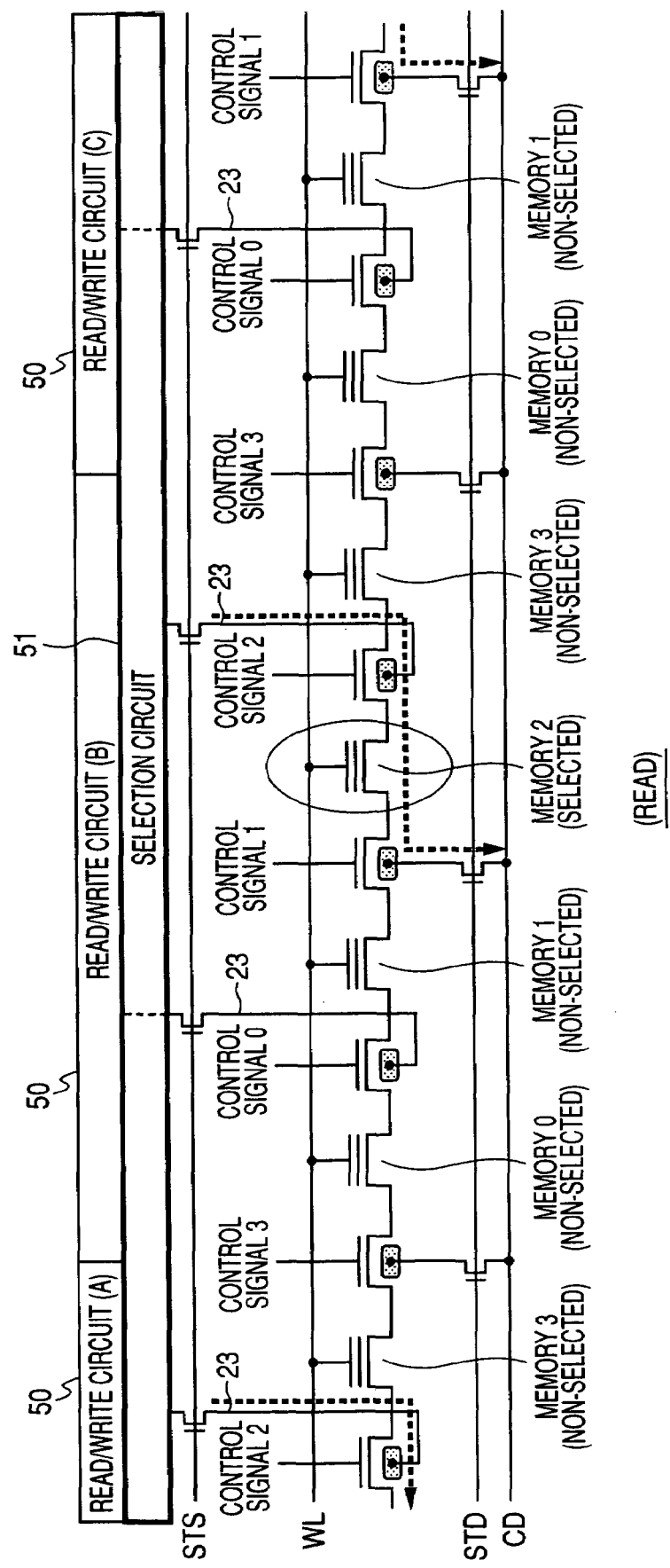
FIG. 11 is a circuit diagram depicting a connected configuration at the time that memories 2 are intended for reading, as a selected form of their corresponding inversion layers by the selection circuit.
Figure 12:
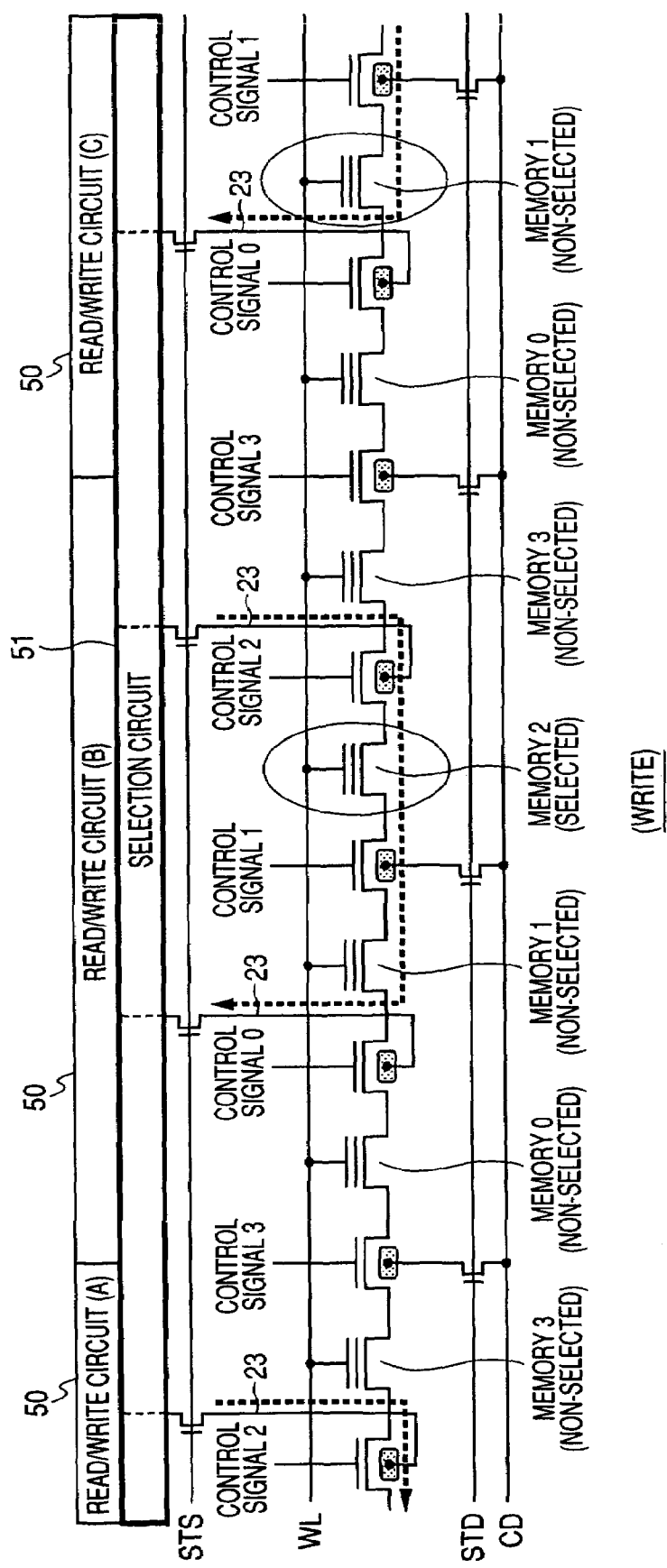
FIG. 12 is a circuit diagram showing a connected configuration at the time that the memories 2 are intended for writing, as a selected form of their corresponding inversion layers by the selection circuit.
Figure 13:
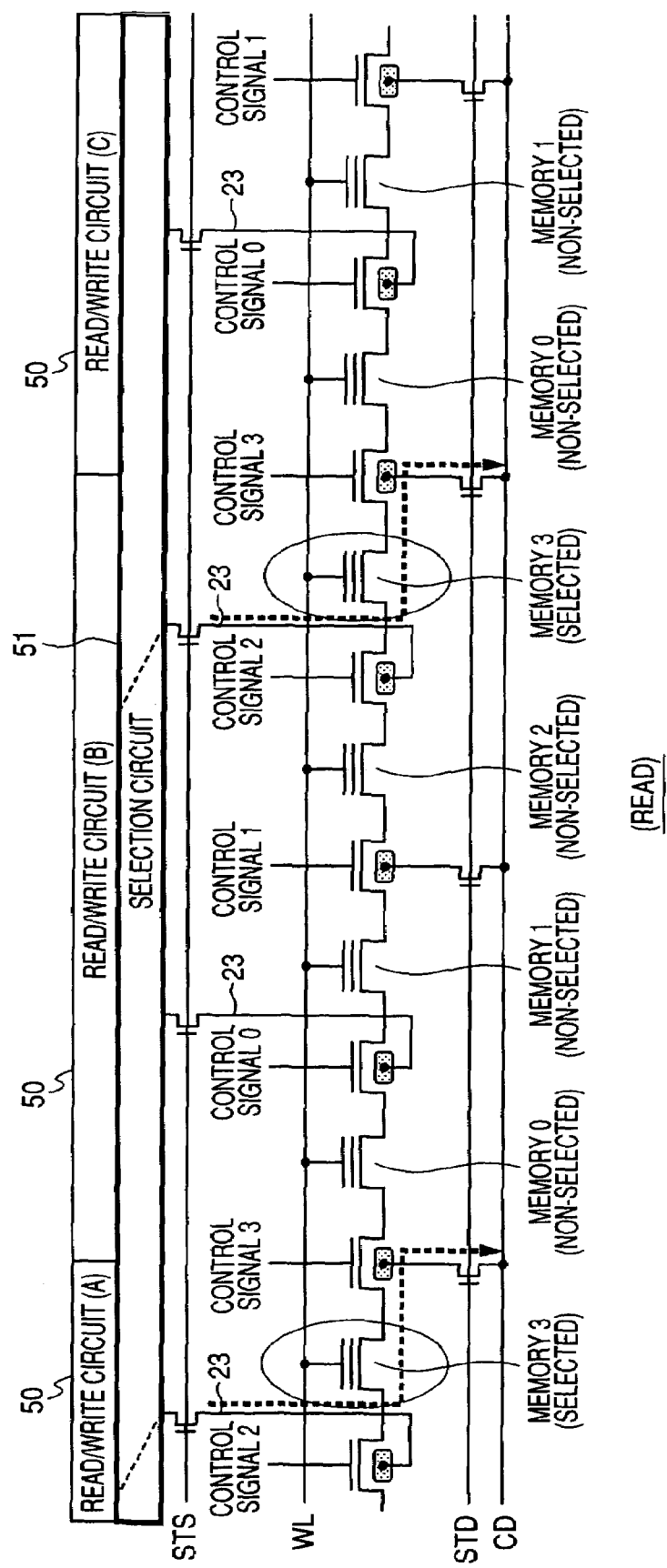
FIG. 13 is a circuit diagram depicting a connected configuration at the time that memories 3 are intended for reading, as a selected form of their corresponding inversion layers by the selection circuit.
Figure 14:
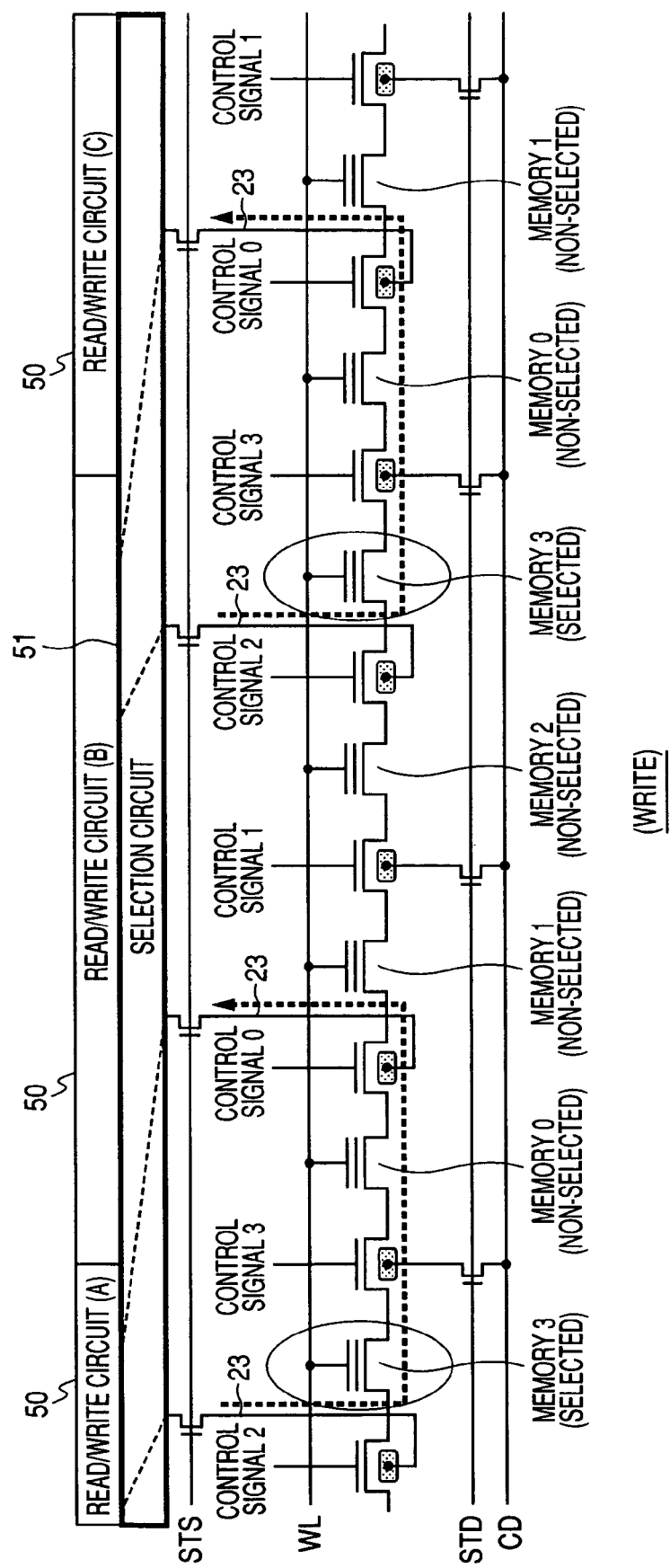
FIG. 14 is a circuit diagram showing a connected configuration at the time that the memories 3 are intended for writing, as a selected form of their corresponding inversion layers by the selection circuit.

FIGS. 7 through 14 illustrate selected forms of inversion layers by a selection circuit. In each figure, a control signal 0 means a control signal AG0, a control signal 1 means a control signal AG1, a control signal 2 means a control signal AG2, a control signal 3 means a control signal AG3, a memory 0 means a memory transistor 21 adjoining to the left side of the control signal 0 (control signal AG0), a memory 1 means a memory transistor 21 adjoining to the right side of the control signal 0 (control signal AG0), a memory 2 means a memory transistor 21 adjoining to the left side of the control signal 2 (control signal AG2), and a memory 3 means a memory transistor 21 adjoining to the right side of the control signal 2 (control signal AG2), respectively. Reference numerals 50 indicate read/write circuits shown typically, and reference numeral 51 indicates a selection circuit. A connected configuration related to one read/write circuit 50(B) and inversion layers 23 placed immediately below four first electrodes continuously provided in parallel with it is shown in each figure. A connected configuration at the time that memories 0 are intended for reading is shown in FIG. 7, and a connected configuration at the time that the memories 0 are intended for writing is shown in FIG. 8, respectively. A connected configuration at the time that memories 1 are intended for reading is shown in FIG. 9, and a connected configuration at the time that the memories 1 are intended for writing is shown in FIG. 10, respectively. A connected configuration at the time that memories 2 are intended for reading is shown in FIG. 11, and a connected configuration at the time that the memories 2 are intended for writing is shown in FIG. 12. A connected configuration at the time that memories 3 are intended for reading is shown in FIG. 13, and a connected configuration at the time that the memories 3 are intended for writing is shown in FIG. 14. As apparent from the selected forms of the inversion layers shown in FIGS. 7 through 14, the selection circuit 51 selects the corresponding inversion layers necessary for processing from the four inversion layers 23 depending upon the positions of the memory transistors for reading or writing of the memory information, of the memory transistors 21 disposed among the four inversion layers with respect to the one read/write circuit 50 and the inversion layers 23 based on its corresponding four first control transistors 20 provided in parallel continuously, and connects the selected inversion layers to the one read/write circuit 50. In short, the selection circuit 51 controls the connection of the read/write circuit 50 and its corresponding inversion layer 23 based on the first control transistor 20 in such a manner that the same read/write circuit 50 is used for reading and writing for the same memory transistor 21.

Figure 15:
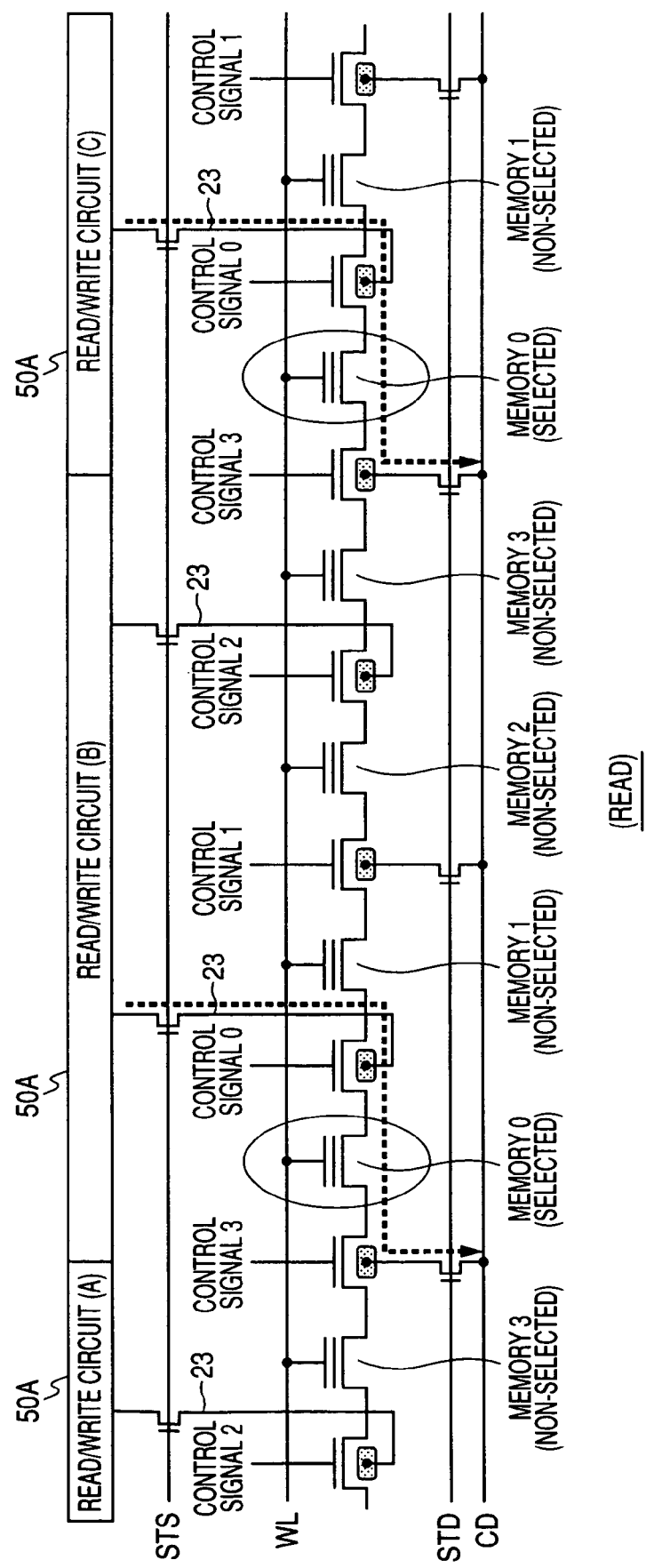
FIG. 15 is a circuit diagram showing, as a comparative example free of adoption of the selection circuit, a connected configuration at the time that memories 0 are intended for reading as an operation form at that time that the allocation of each read/write circuit and its corresponding inversion layers is fixed.
Figure 16:
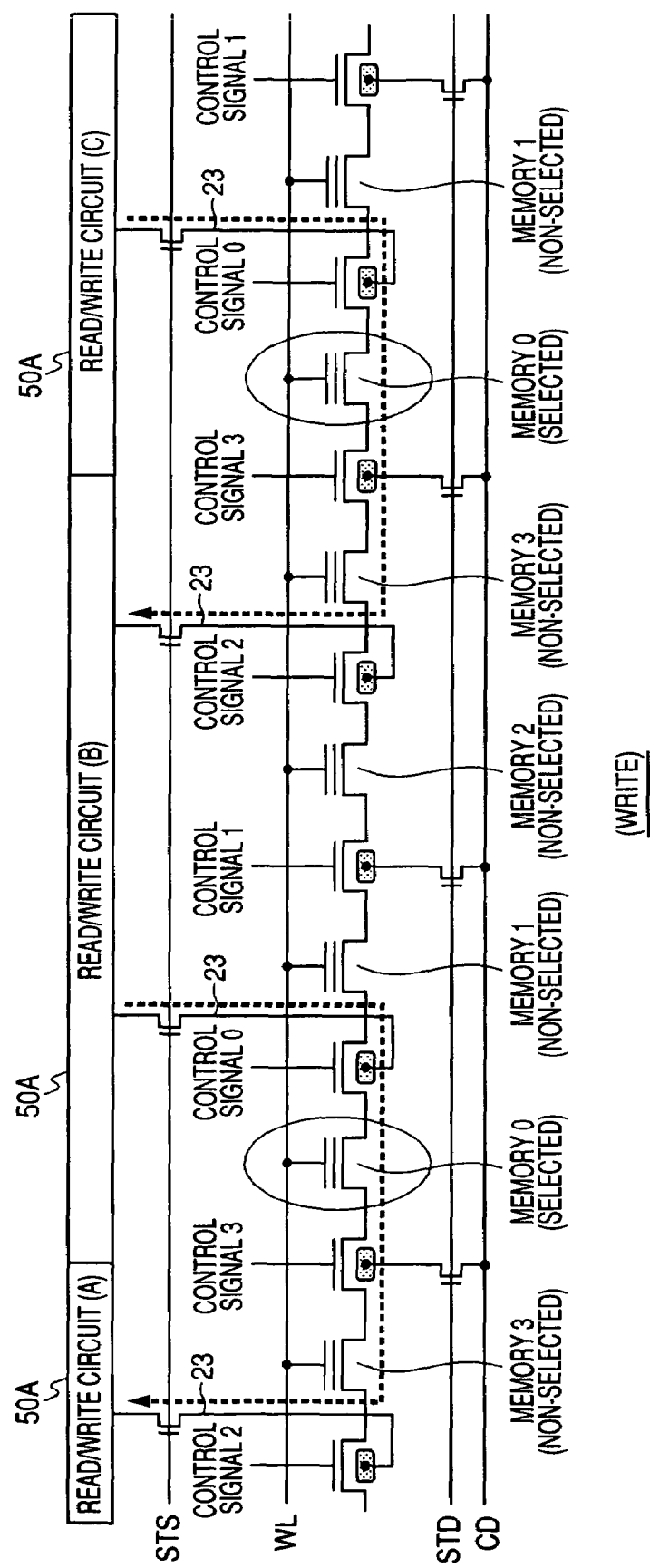
FIG. 16 is a circuit diagram showing, as the comparative example free of adoption of the selection circuit, a connected configuration at the time that the memories 0 are intended for writing as an operation form at that time that the allocation of each read/write circuit and its corresponding inversion layers is fixed.
Figure 17:
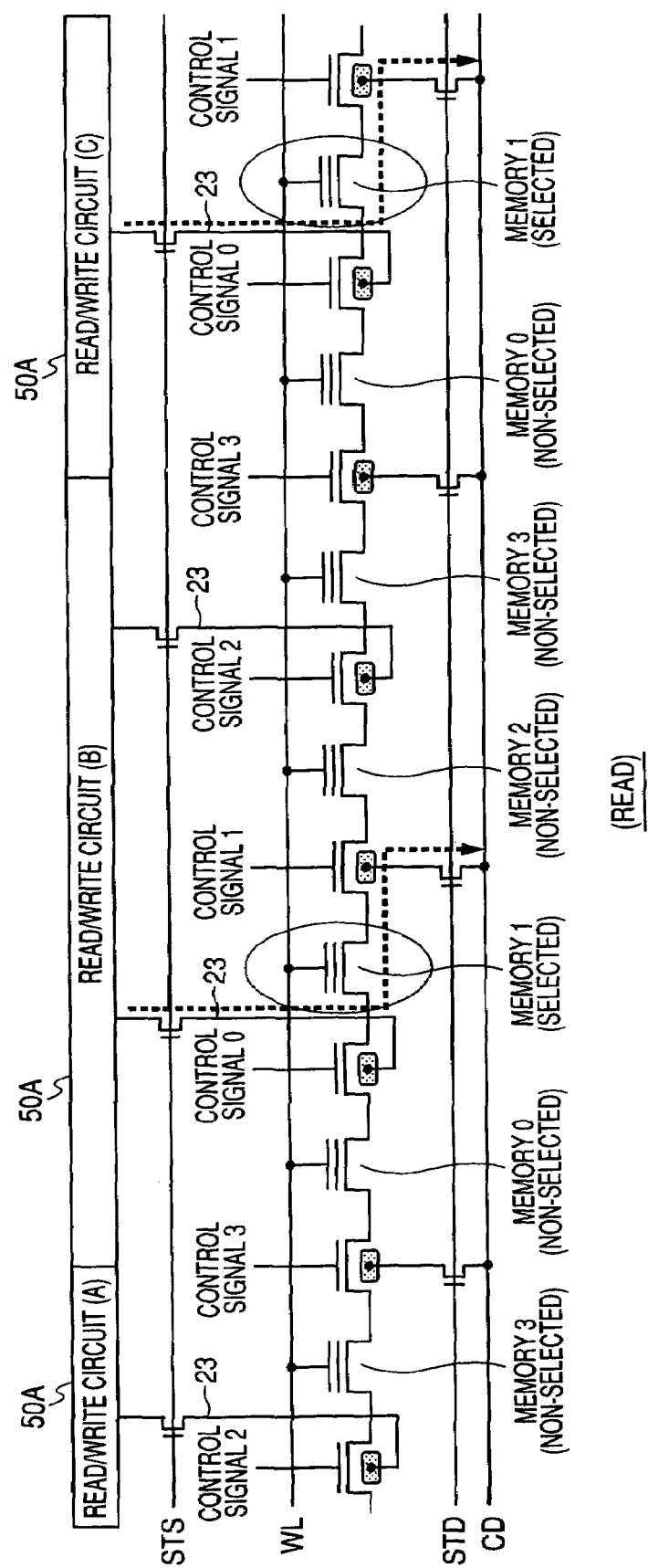
FIG. 17 is a circuit diagram depicting, as the comparative example free of adoption of the selection circuit, a connected configuration at the time that memories 1 are intended for reading as an operation form at that time that the allocation of each read/write circuit and its corresponding inversion layers is fixed.
Figure 18:
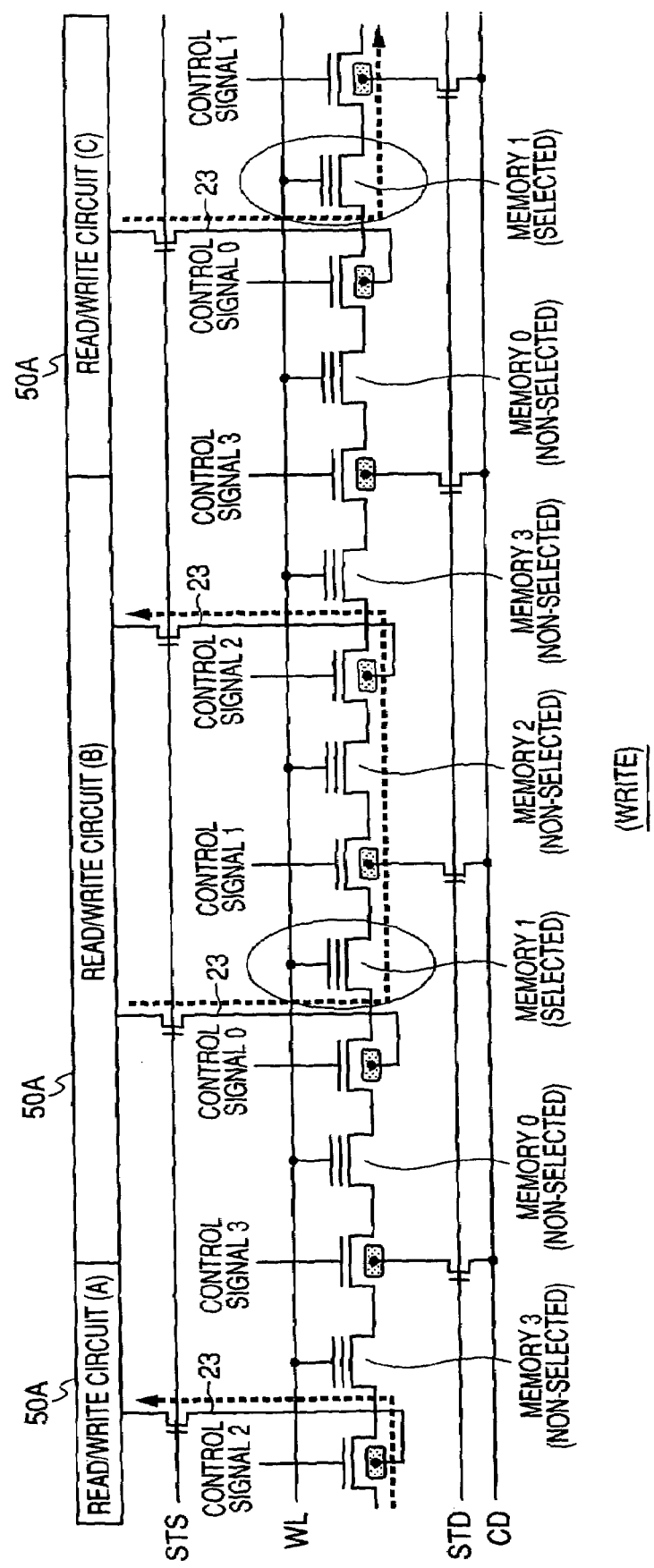
FIG. 18 is a circuit diagram showing, as the comparative example free of adoption of the selection circuit, a connected configuration at the time that the memories 1 are intended for writing as an operation form at that time that the allocation of each read/write circuit and its corresponding inversion layers is fixed.
Figure 19:
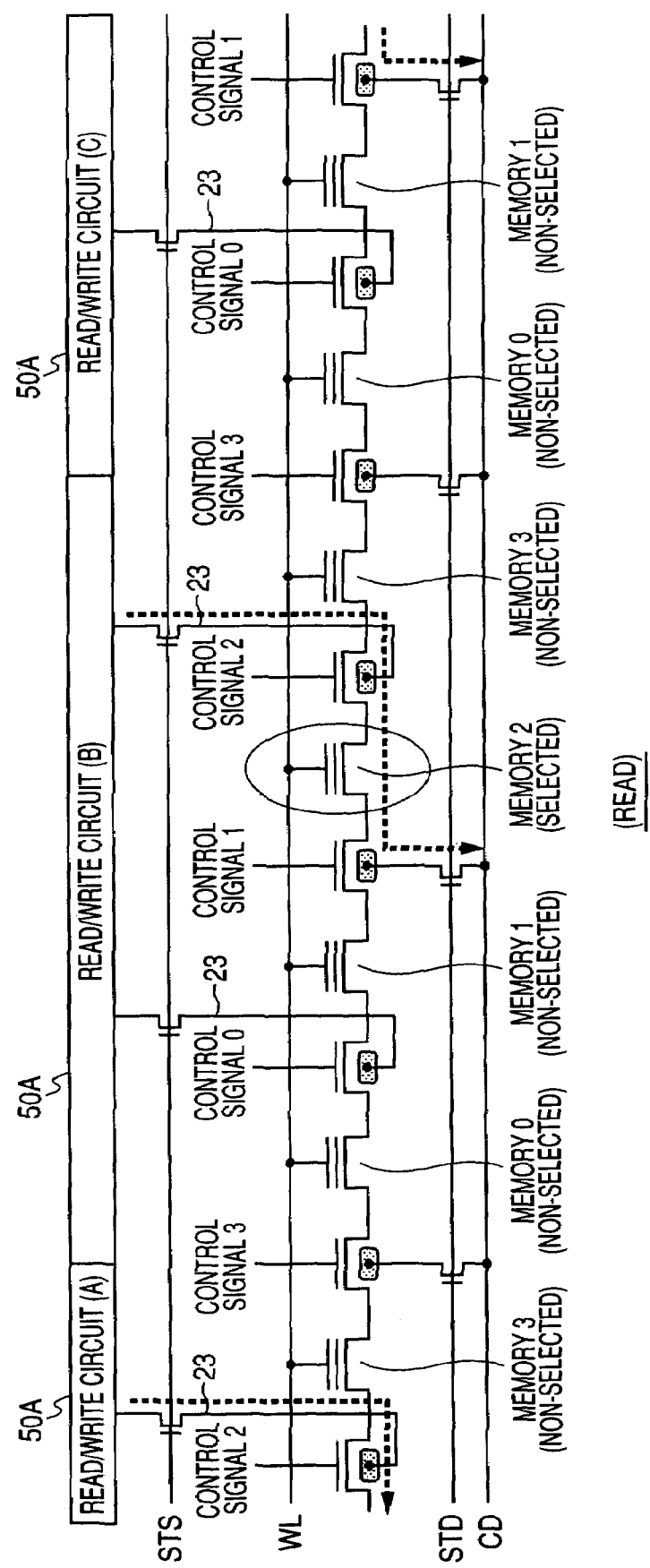
FIG. 19 is a circuit diagram showing, as the comparative example free of adoption of the selection circuit, a connected configuration at the time that memories 2 are intended for reading as an operation form at that time that the allocation of each read/write circuit and its corresponding inversion layers is fixed.
Figure 20:
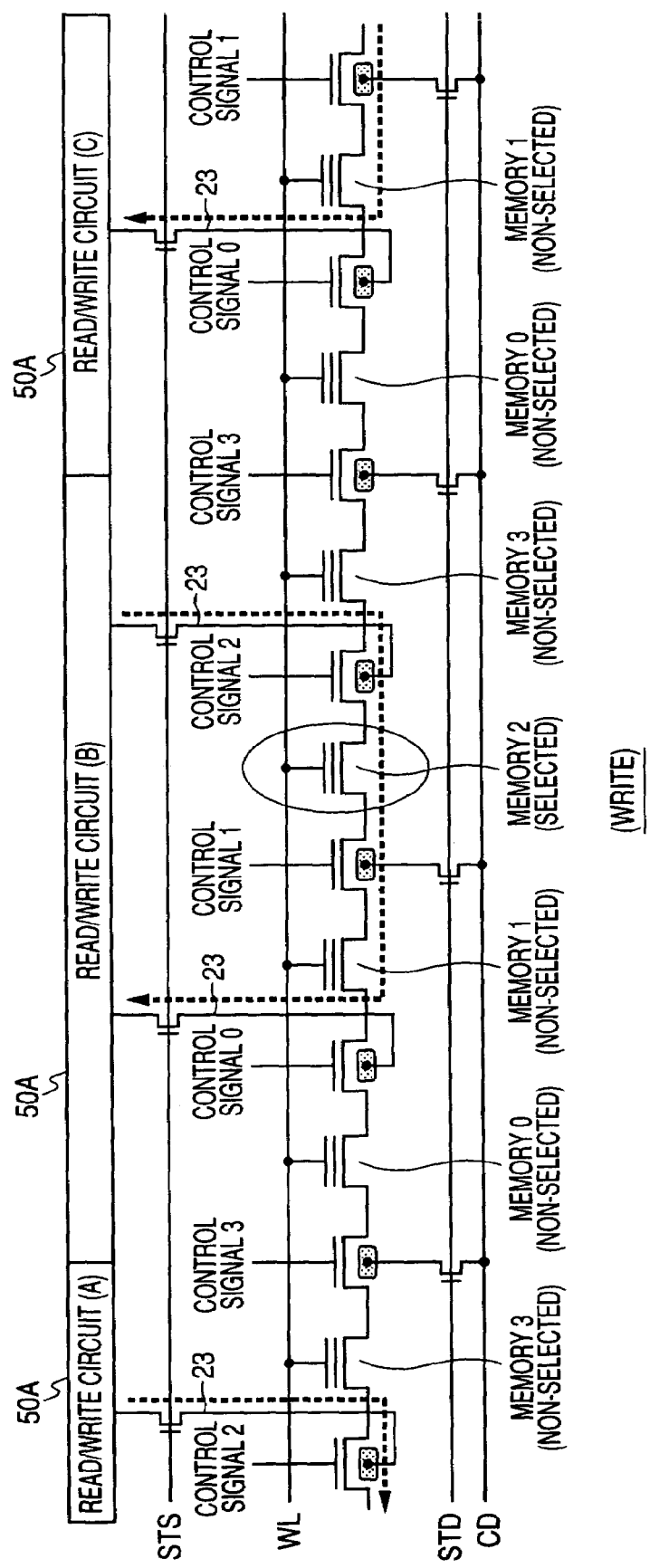
FIG. 20 is a circuit diagram showing, as the comparative example free of adoption of the selection circuit, a connected configuration at the time that the memories 2 are intended for writing as an operation form at that time that the allocation of each read/write circuit and its corresponding inversion layers is fixed.
Figure 21:
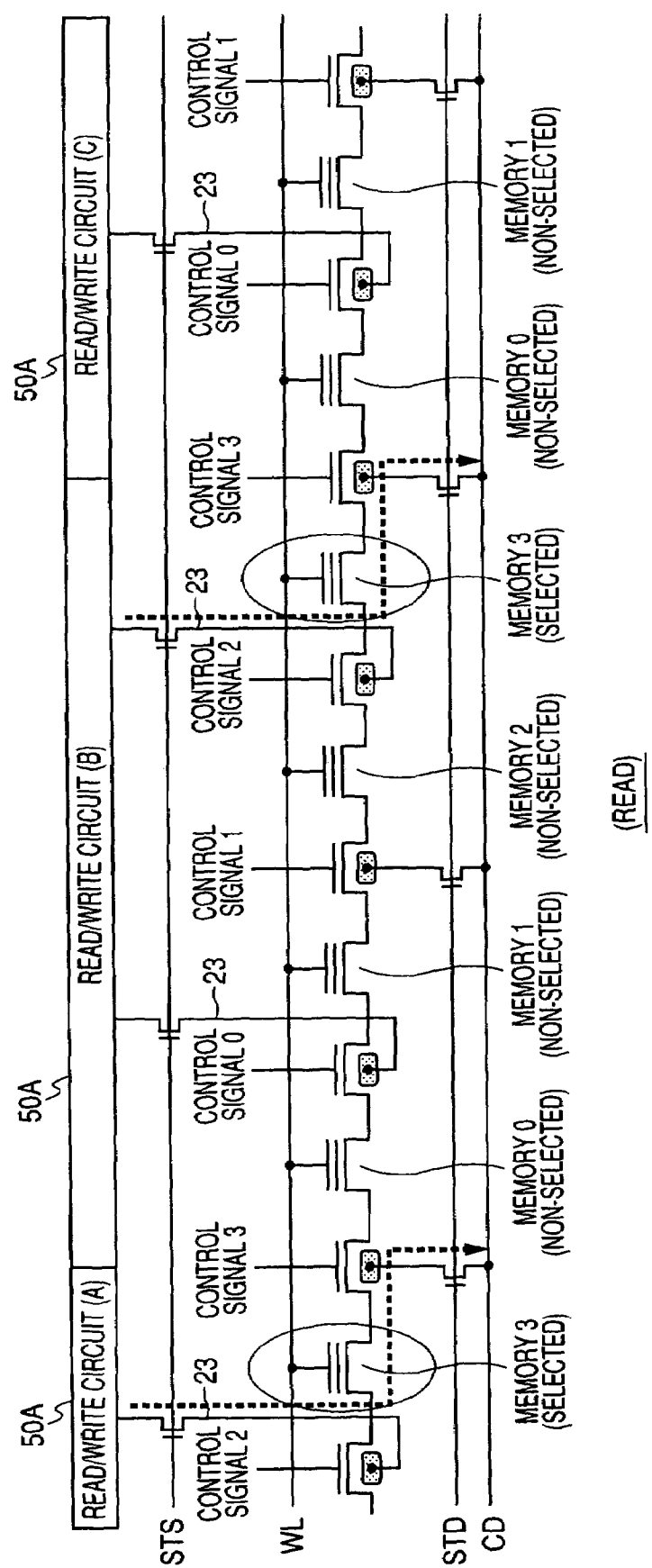
FIG. 21 is a circuit diagram showing, as the comparative example free of adoption of the selection circuit, a connected configuration at the time that memories 3 are intended for reading as an operation form at that time that the allocation of each read/write circuit and its corresponding inversion layers is fixed.
Figure 22:
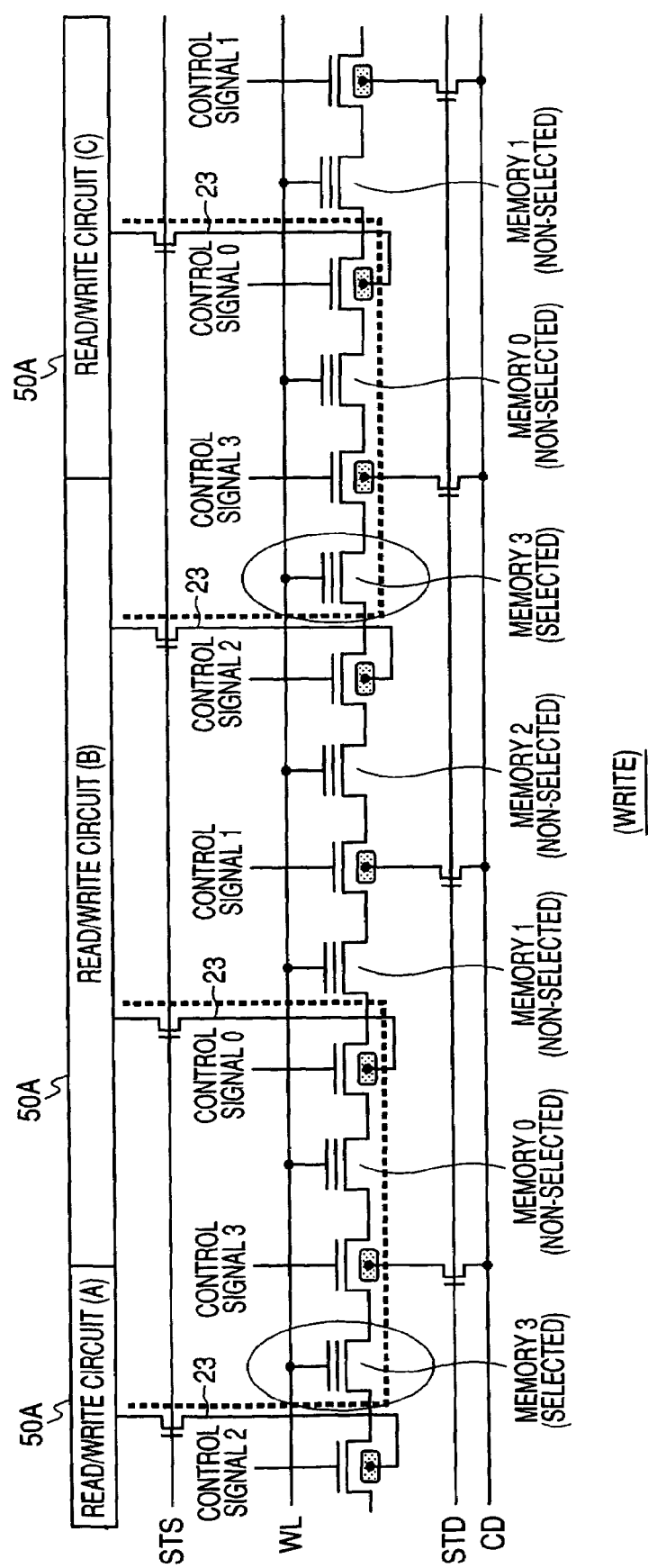
FIG. 22 is a circuit diagram showing, as the comparative example free of adoption of the selection circuit, a connected configuration at the time that the memories 3 are intended for writing as an operation form at that time that the allocation of each read/write circuit and its corresponding inversion layers is fixed.

Operation forms at that time that the allocations of read/write circuits 51 and their corresponding inversion layers 23 are fixed, are shown in FIGS. 15 through 22 as comparative examples each free of adoption of the selection circuit 51, respectively. In the respective figures, the two inversion layers 23 are fixedly connected to their corresponding read/write circuits 50A. A connected configuration at the time that memories 0 are intended for reading is shown in FIG. 15, and a connected configuration at the time that the memories 0 are intended for writing is shown in FIG. 16, respectively. A connected configuration at the time that memories 1 are intended for reading is shown in FIG. 17, and a connected configuration at the time that the memories 1 are intended for writing is shown in FIG. 18, respectively. A connected configuration at the time that memories 2 are intended for reading is shown in FIG. 19, and a connected configuration at the time that the memories 2 are intended for writing is shown in FIG. 20, respectively. A connected configuration at the time that memories 3 are intended for reading is shown in FIG. 21, and a connected configuration at the time that the memories 3 are intended for writing is shown in FIG. 22, respectively. As apparent from a comparison between FIGS. 15 and 16, for example, a read/write circuit (B) is used to detect read data upon reading for the memory 0, whereas upon a write operation for the memory 0, a read/write circuit (A) adjacent to the read/write circuit (B) must be used upon control on the generation of a write current in accordance with write data. Similar situations take place even between reading and writing for the memories 3 shown in FIGS. 21 and 22. In the case of such a connected configuration, inconvenience takes place in that since the read/write circuits 50A used for write and read operations for the same memory transistors 21 differ, data read by write verify cannot be reflected directly on the write operation. Its convenience is resolved by using the selection circuit 51.

<<Memory Array Using Diffused Layers for Bit Lines>>

Figure 23:
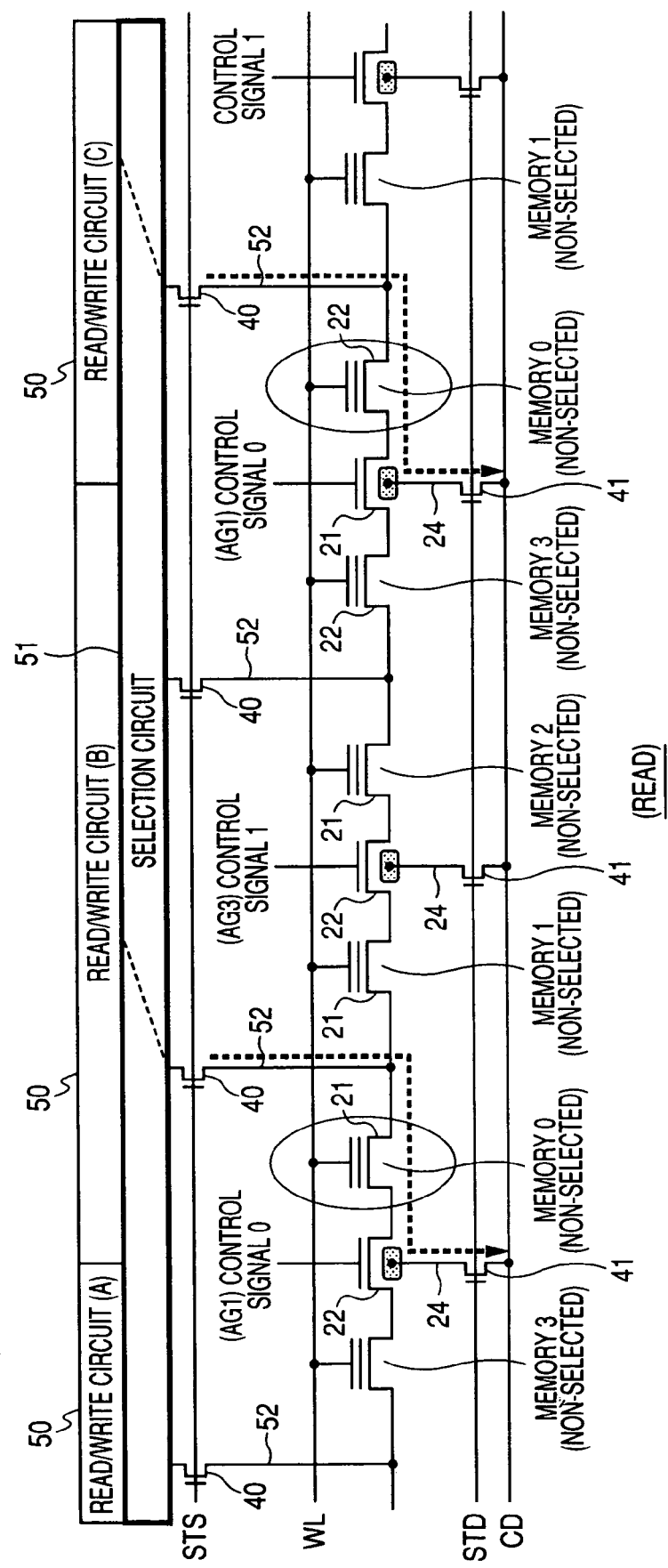
FIG. 23 is a circuit diagram depicting a connected configuration at the time that memories 0 are indented for reading, as a connected form made by a selection circuit when its corresponding diffused layers are used.

Although the inversion layers have been used for the local bit lines in the description made up to now, the diffused layers are also available in place of the inversion layers. As illustrated in FIG. 23 in this case, the first control transistors 20 are eliminated and instead the local bit lines are constituted of diffused layers 52. Thus, a memory transistor 21, a second control transistor 22 and a memory transistor 21 are sequentially disposed in series between the respective two diffused layers 52. A control signal 0 means a control signal AG1, a control signal 1 means a control signal AG3, a memory 0 means a memory transistor 21 adjoining to the right side of the control signal 0 (control signal AG1), a memory 1 means a memory transistor 21 adjoining to the left side of the control signal 1 (control signal AG3), a memory 2 means a memory transistor 21 adjoining to the right side of the control signal 1 (control signal AG3), and a memory 3 means a memory transistor 21 adjoining to the left side of the control signal (control signal AG1), respectively.

Figure 24:
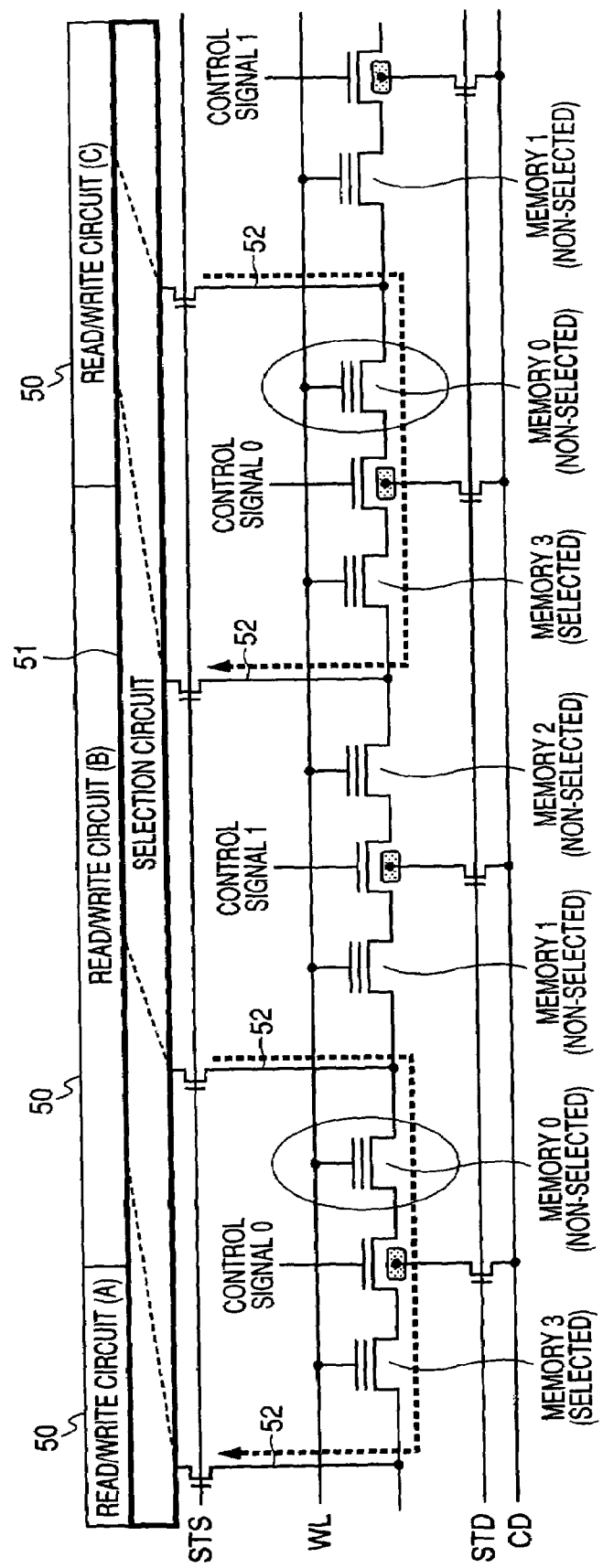
FIG. 24 is a circuit diagram showing a connected configuration at the time that the memories 0 are intended for writing, as a connected form made by the selection circuit when its corresponding diffused layers are used.
Figure 25:
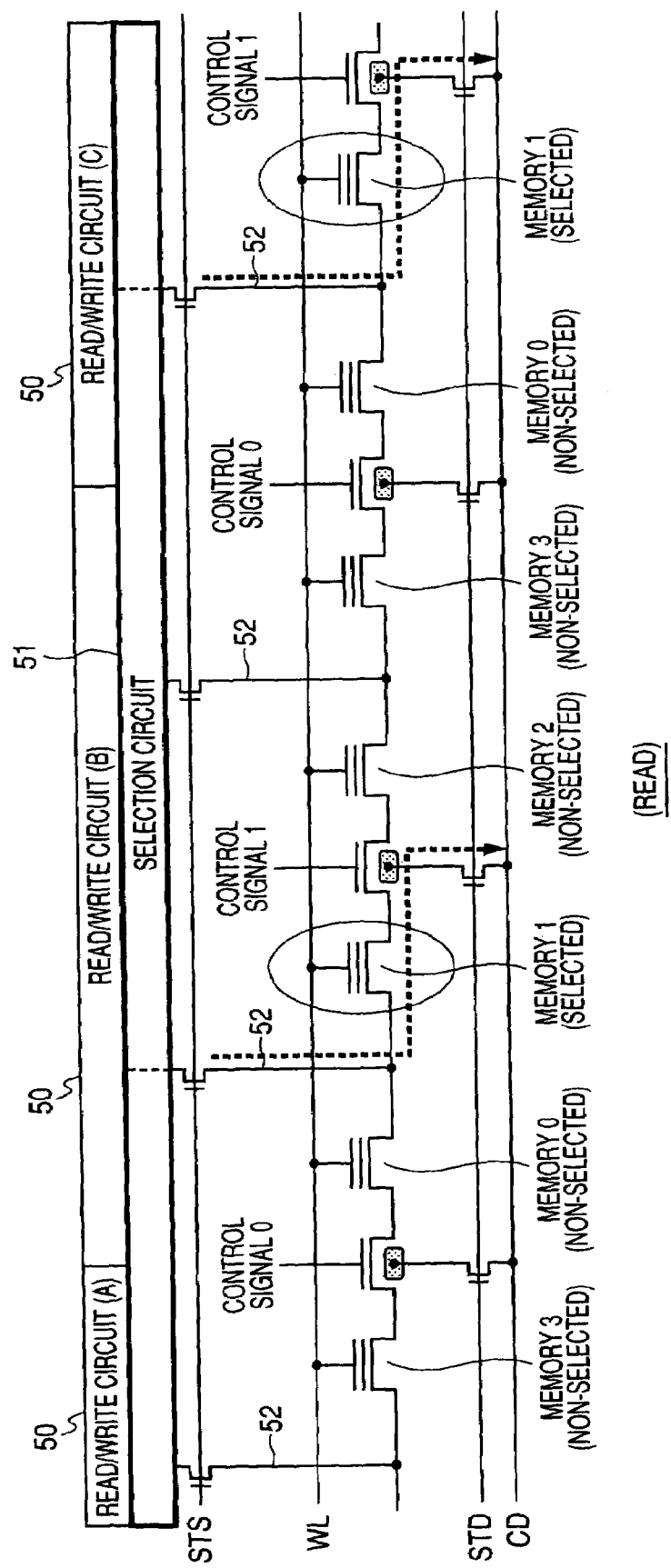
FIG. 25 is a circuit diagram depicting a connected configuration at the time that memories 1 are intended for reading, as a connected form made by the selection circuit when its corresponding diffused layers are used.
Figure 26:
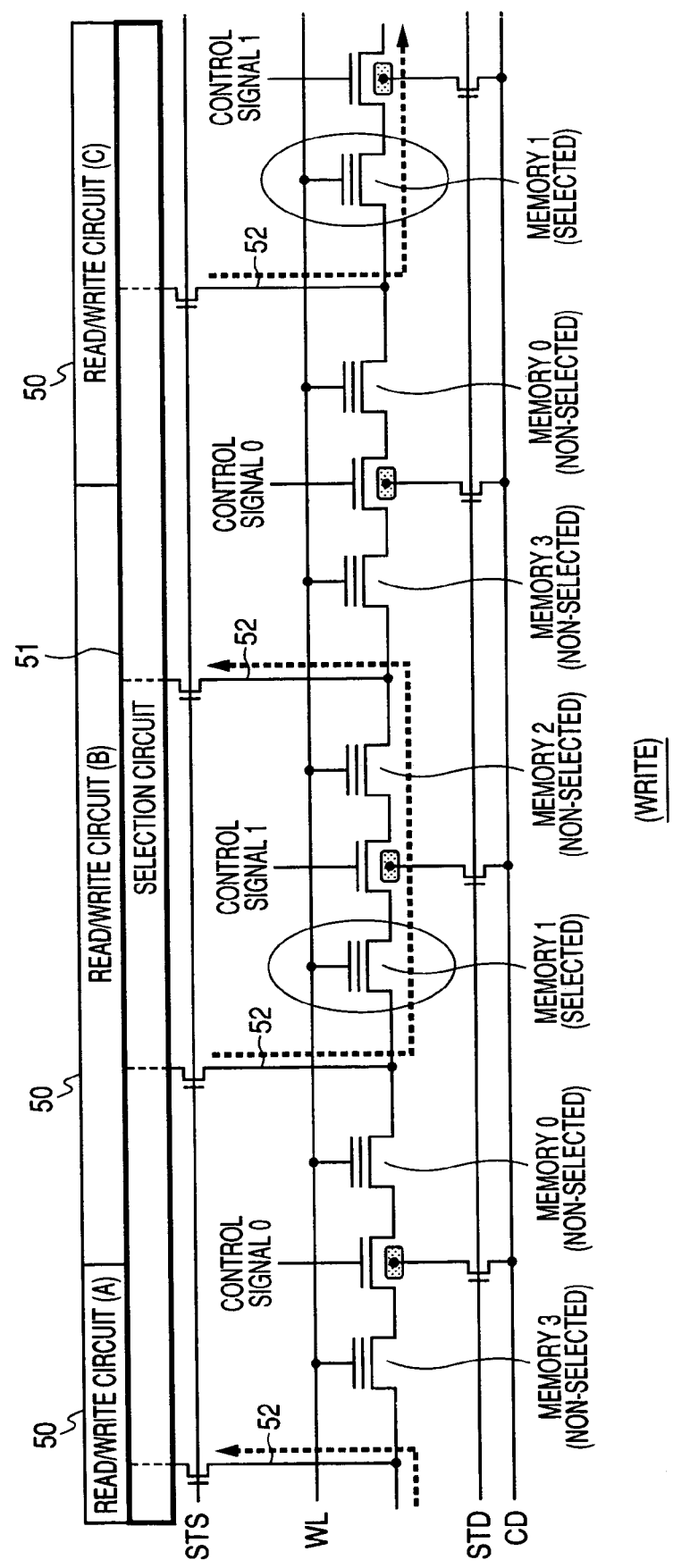
FIG. 26 is a circuit diagram showing a connected configuration at the time that the memories 1 are intended for writing, as a connected form made by the selection circuit when its corresponding diffused layers are used.
Figure 27:
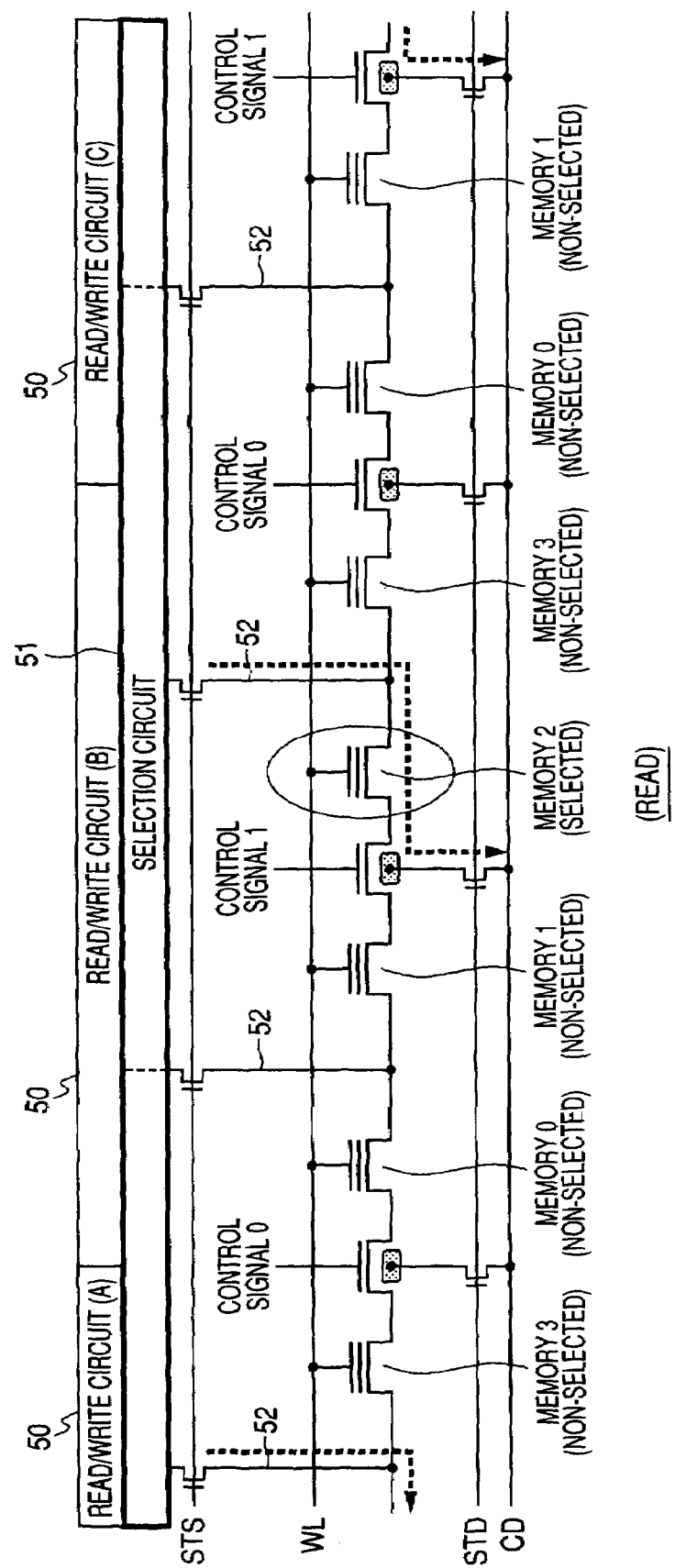
FIG. 27 is a circuit diagram depicting a connected configuration at the time that memories 2 are intended for reading, as a connected form made by the selection circuit when its corresponding diffused layers are used.
Figure 28:
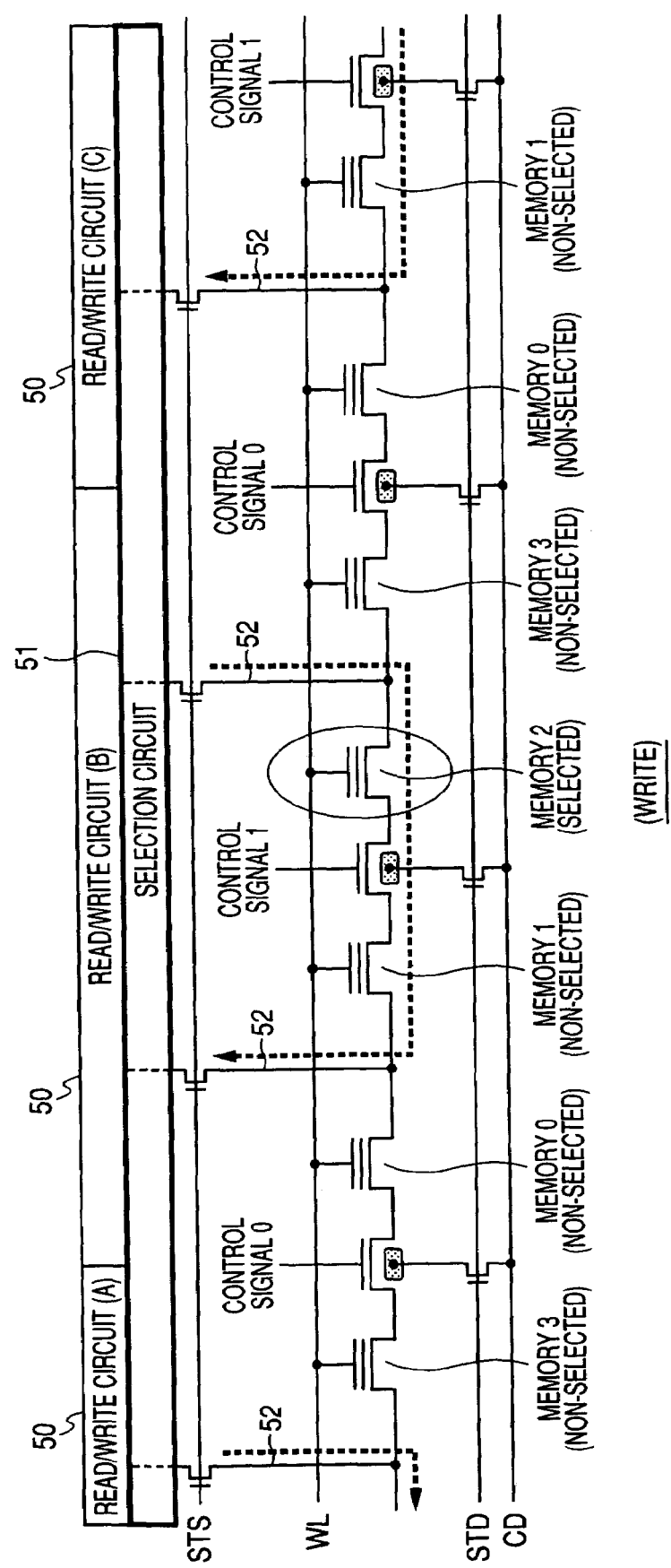
FIG. 28 is a circuit diagram showing a connected configuration at the time that the memories 2 are intended for writing, as a connected form made by the selection circuit when its corresponding diffused layers are used.
Figure 29:
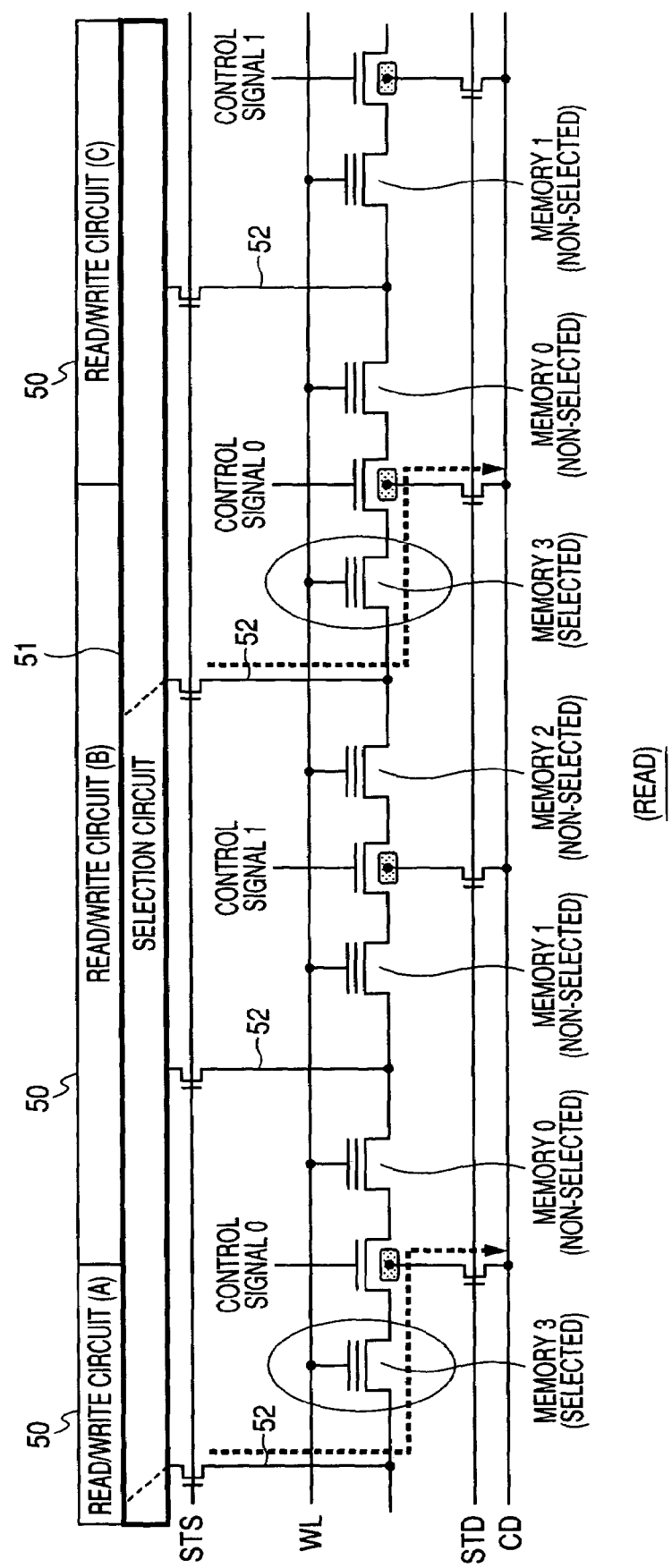
FIG. 29 is a circuit diagram showing a connected configuration at the time that memories 3 are intended for reading, as a connected form made by the selection circuit when its corresponding diffused layers are used.
Figure 30:
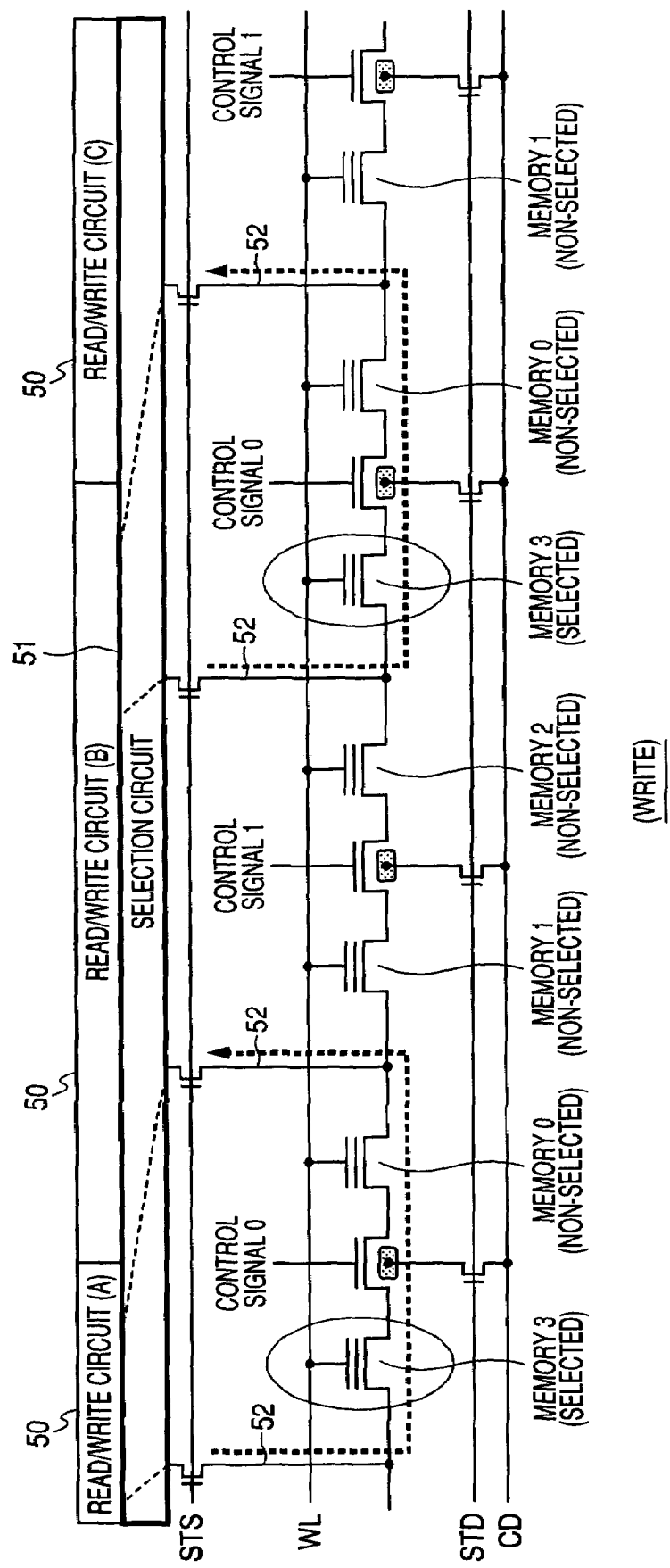
FIG. 30 is a circuit diagram depicting a connected configuration at the time that memories 3 are intended for writing, as a connected form made the selection circuit when its corresponding diffused layers are used.

Selected forms of the inversion layers 52 by the selection circuit 51 are illustrated in FIGS. 23 through 30. Connected configurations related to one read/write circuit 50(B) and four diffused layers 52 continuously provided in parallel with it are shown in the respective figures. A connected configuration at the time that memories 0 are intended for reading is shown in FIG. 23, and a connected configuration at the time that the memories 0 are intended for writing is shown in FIG. 24, respectively. A connected configuration at the time that memories 1 are intended for reading is shown in FIG. 25, and a connected configuration at the time that the memories 1 are intended for writing is shown in FIG. 26, respectively. A connected configuration at the time that memories 2 are intended for reading is shown in FIG. 27, and a connected configuration at the time that the memories 2 are intended for writing is shown in FIG. 28. A connected configuration at the time that memories 3 are intended for reading is shown in FIG. 29, and a connected configuration at the time that the memories 3 are intended for writing is shown in FIG. 30. In a manner similar to FIGS. 7 through 14 referred to above, the selection circuit 51 selects the corresponding diffused layers 52 necessary for processing from the four diffused layers 52 depending upon the positions of memory transistors for reading or writing of the memory information, of memory transistors 21 disposed among the four diffused layers 52 with respect to the one read/write circuit 50 and the four diffused layers 52 corresponding to it and provided in parallel continuously, and connects the selected diffused layers to the one read/write circuit 50. In short, the selection circuit 51 controls the connection of the read/write circuit 50 and its corresponding diffused layer 52 in such a manner that the same read/write circuit 50 is used for reading and writing for the same memory transistor 21.

Figure 31:
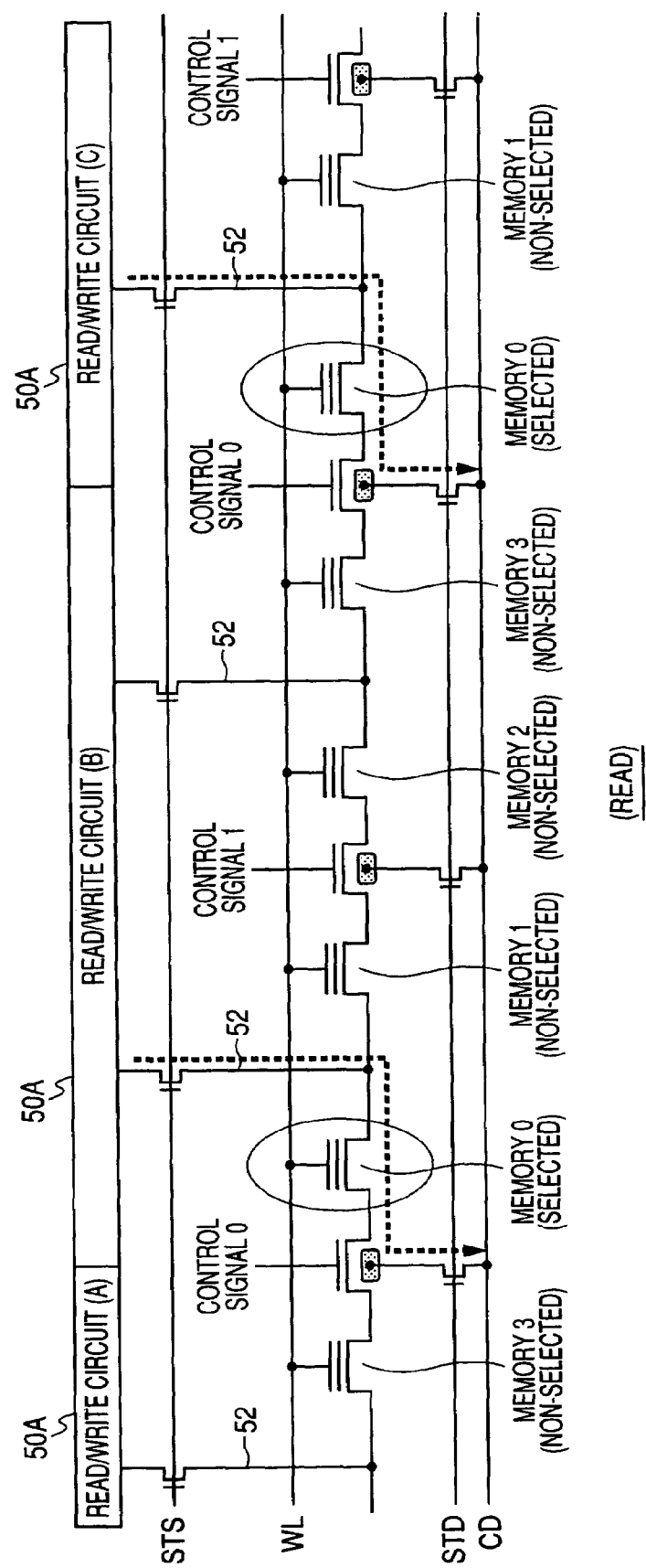
FIG. 31 is a circuit diagram showing, as a comparative example free of adoption of the selection circuit 51, a connected configuration at the time that memories 0 are intended for reading as an operation form at that time that the allocation of each read/write circuit and its corresponding diffused layers is fixed.
Figure 32:
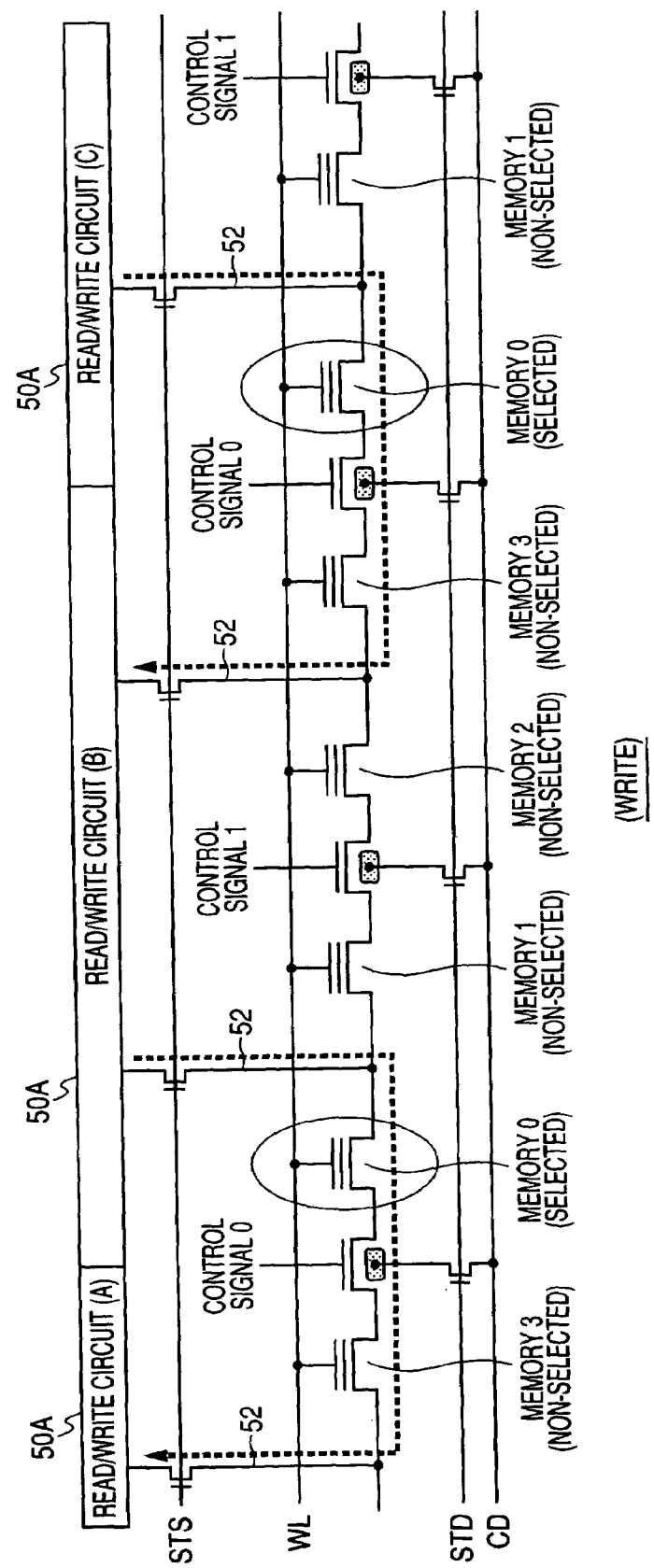
FIG. 32 is a circuit diagram showing, as the comparative example free of adoption of the selection circuit 51, a connected configuration at the time that the memories 0 are intended for writing as an operation form at that time that the allocation of each read/write circuit and its corresponding diffused layers is fixed.
Figure 33:
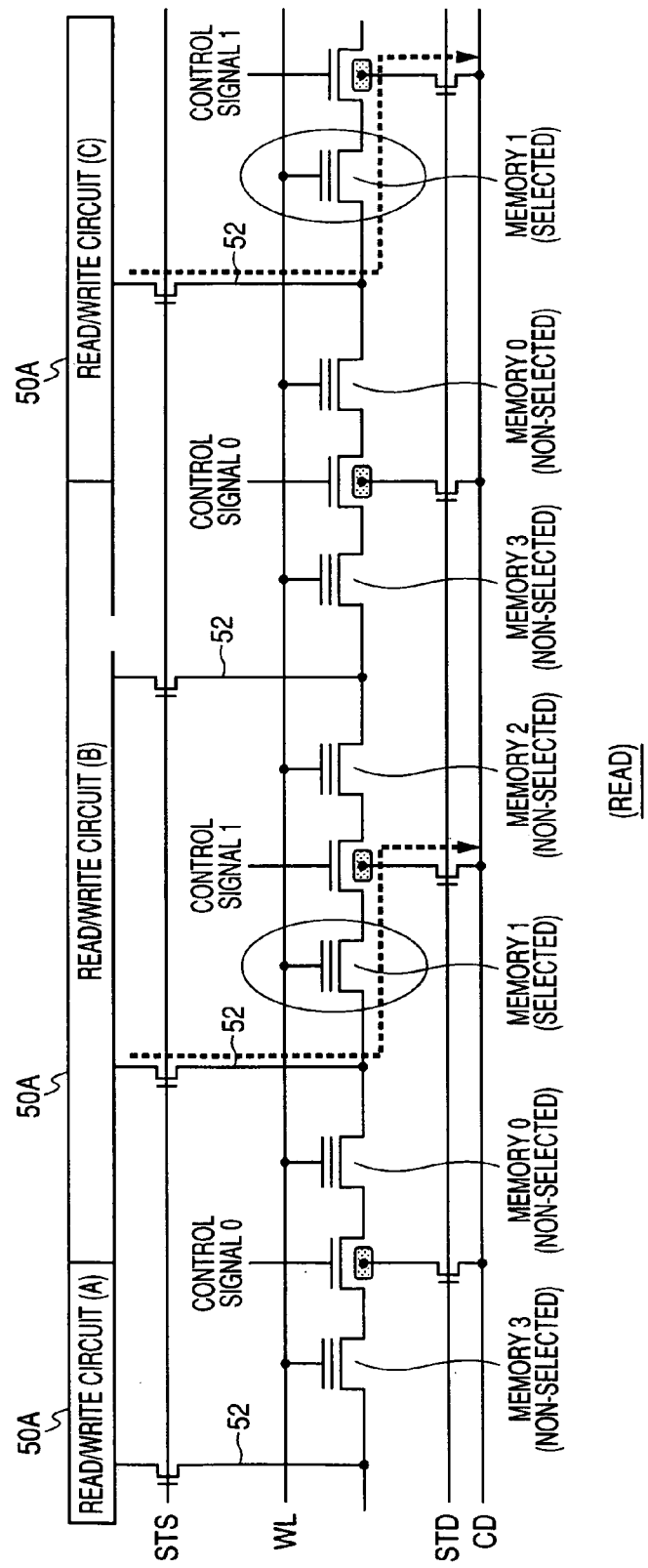
FIG. 33 is a circuit diagram showing, as the comparative example free of adoption of the selection circuit 51, a connected configuration at the time that memories 1 are intended for reading as an operation form at that time that the allocation of each read/write circuit and its corresponding diffused layers is fixed.
Figure 34:
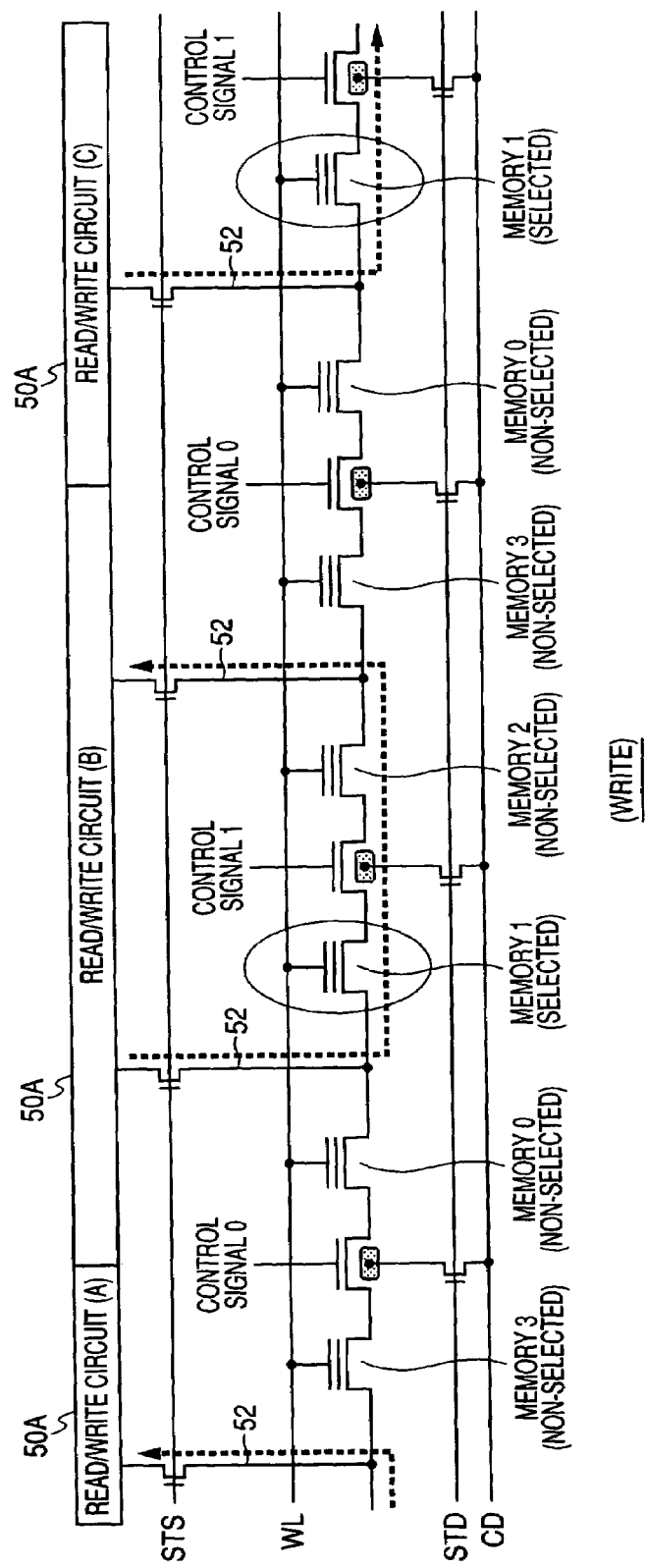
FIG. 34 is a circuit diagram depicting, as the comparative example free of adoption of the selection circuit 51, a connected configuration at the time that the memories 1 are intended for writing as an operation form at that time that the allocation of each read/write circuit and its corresponding diffused layers is fixed.
Figure 35:
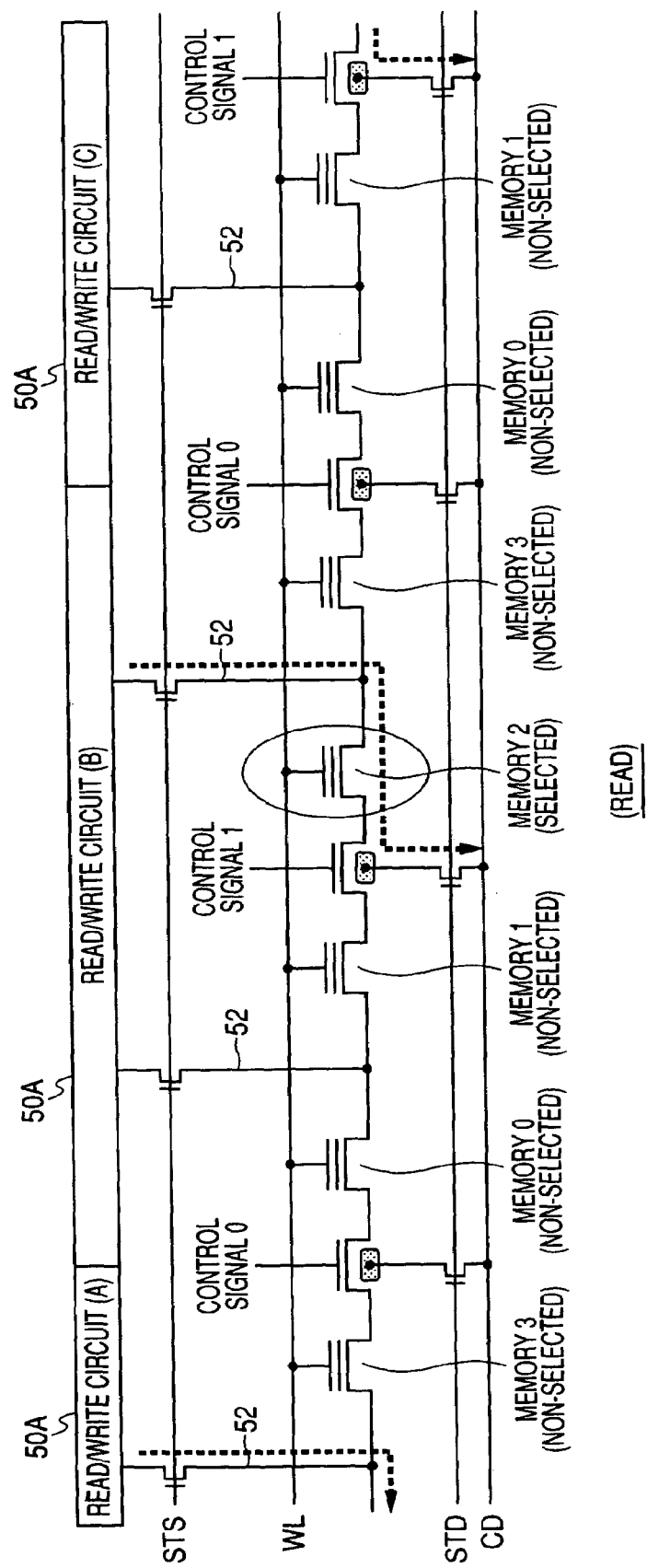
FIG. 35 is a circuit diagram showing, as the comparative example free of adoption of the selection circuit 51, a connected configuration at the time that memories 2 are intended for reading as an operation form at that time that the allocation of each read/write circuit and its corresponding diffused layers is fixed.
Figure 36:
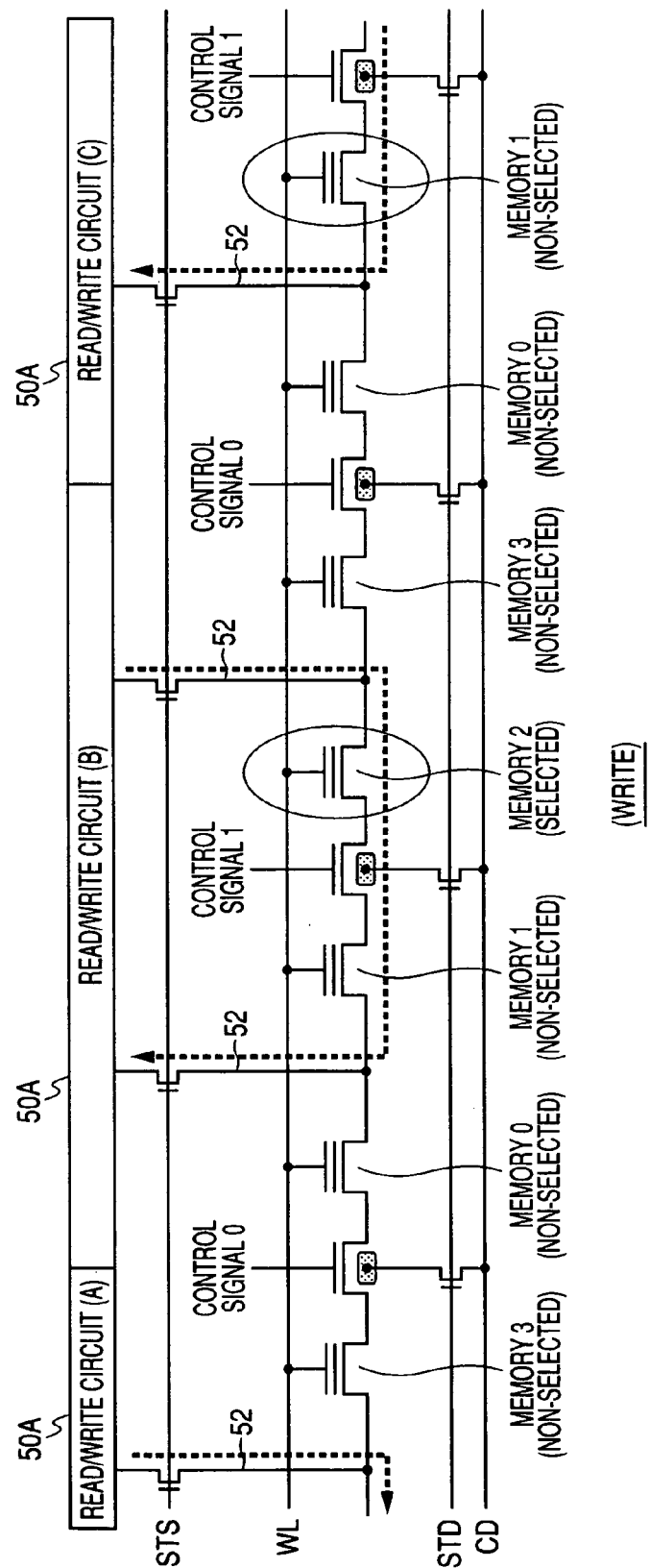
FIG. 36 is a circuit diagram showing, as the comparative example free of adoption of the selection circuit 51, a connected configuration at the time that the memories 2 are intended for writing as an operation form at that time that the allocation of each read/write circuit and its corresponding diffused layers is fixed.
Figure 37:
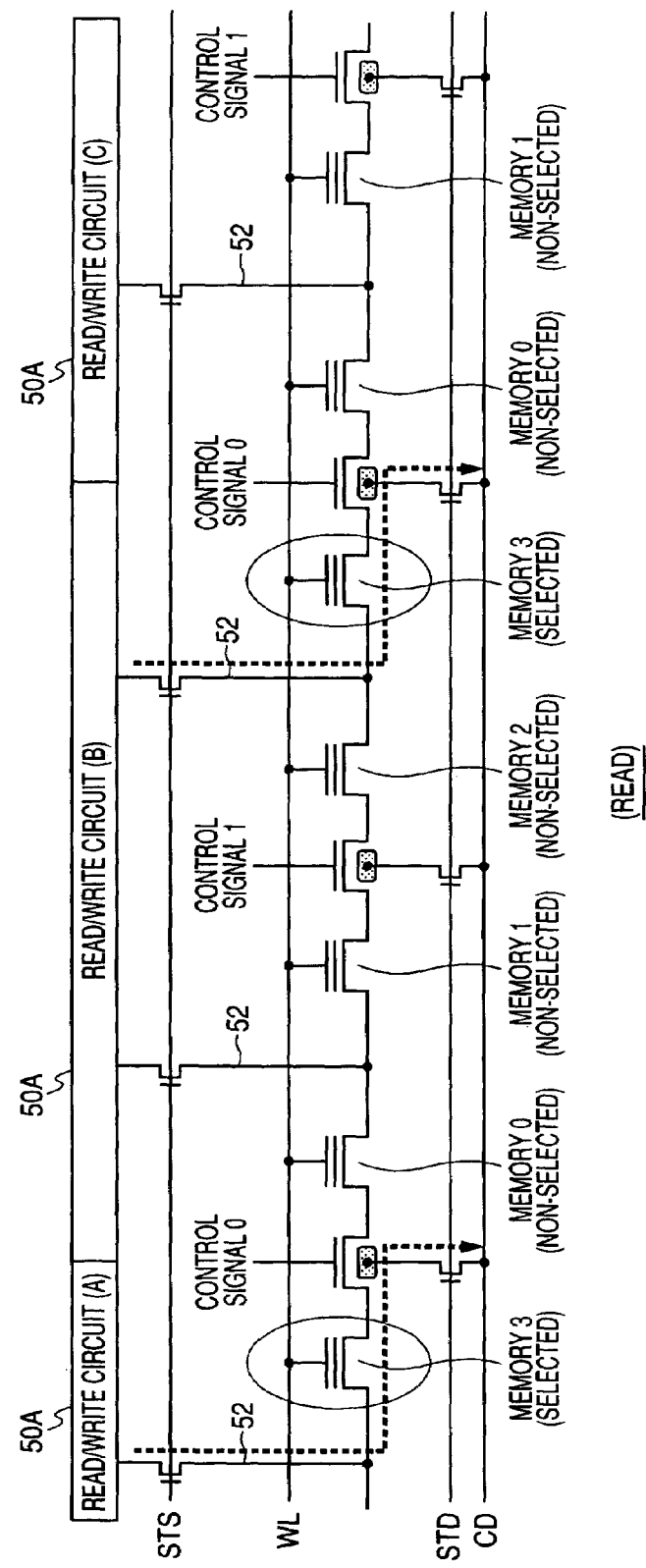
FIG. 37 is a circuit diagram showing, as the comparative example free of adoption of the selection circuit 51, a connected configuration at the time that memories 3 are intended for reading as an operation form at that time that the allocation of each read/write circuit and its corresponding diffused layers is fixed.
Figure 38:
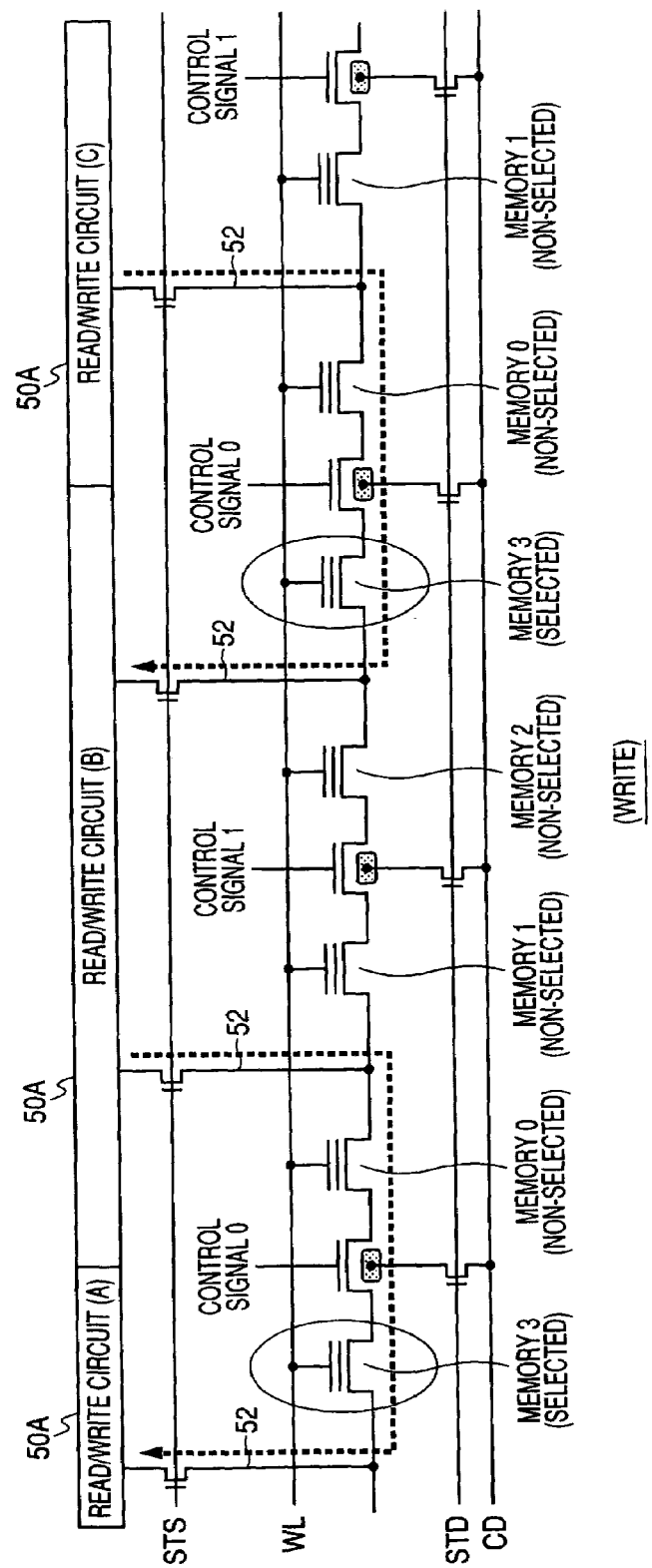
FIG. 38 is a circuit diagram showing, as the comparative example free of adoption of the selection circuit 51, a connected configuration at the time that the memories 3 are intended for writing as an operation form at that time that the allocation of each read/write circuit and its corresponding diffused layers is fixed.

Operation forms at that time that the allocations of read/write circuits 50A and their corresponding diffused layers 52 are fixed, are shown in FIGS. 31 through 38 as comparative examples each free of adoption of the selection circuit 51, respectively. In the respective figures, the two diffused layers 52 are fixedly connected to their corresponding read/write circuits 50A. A connected configuration at the time that memories 0 are intended for reading is shown in FIG. 31, and a connected configuration at the time that the memories 0 are intended for writing is shown in FIG. 32, respectively. A connected configuration at the time that memories 1 are intended for reading is shown in FIG. 33, and a connected configuration at the time that the memories 1 are intended for writing is shown in FIG. 34, respectively. A connected configuration at the time that memories 2 are intended for reading is shown in FIG. 35, and a connected configuration at the time that the memories 2 are intended for writing is shown in FIG. 36, respectively. A connected configuration at the time that memories 3 are intended for reading is shown in FIG. 37, and a connected configuration at the time that the memories 3 are intended for writing is shown in FIG. 38, respectively. As apparent from a comparison between FIGS. 31 and 32, for example, a read/write circuit (B) is used to detect read data upon reading for the memory 0, whereas upon a write operation for the memory 0, a read/write circuit (A) adjacent to the read/write circuit (B) must be used upon control on the generation of a write current in accordance with write data. Similar situations take place even between reading and writing for the memories 3 shown in FIGS. 37 and 38. In the case of such a connected configuration, inconvenience takes place in that since the read/write circuits 50A used for write and read operations for the same memory transistors 21 are different, data read by write verify cannot be reflected directly on the write operation. Its convenience is resolved by using the selection circuit 51.

<<Write/Read Circuit and Selection Circuit>>

Figure 39:
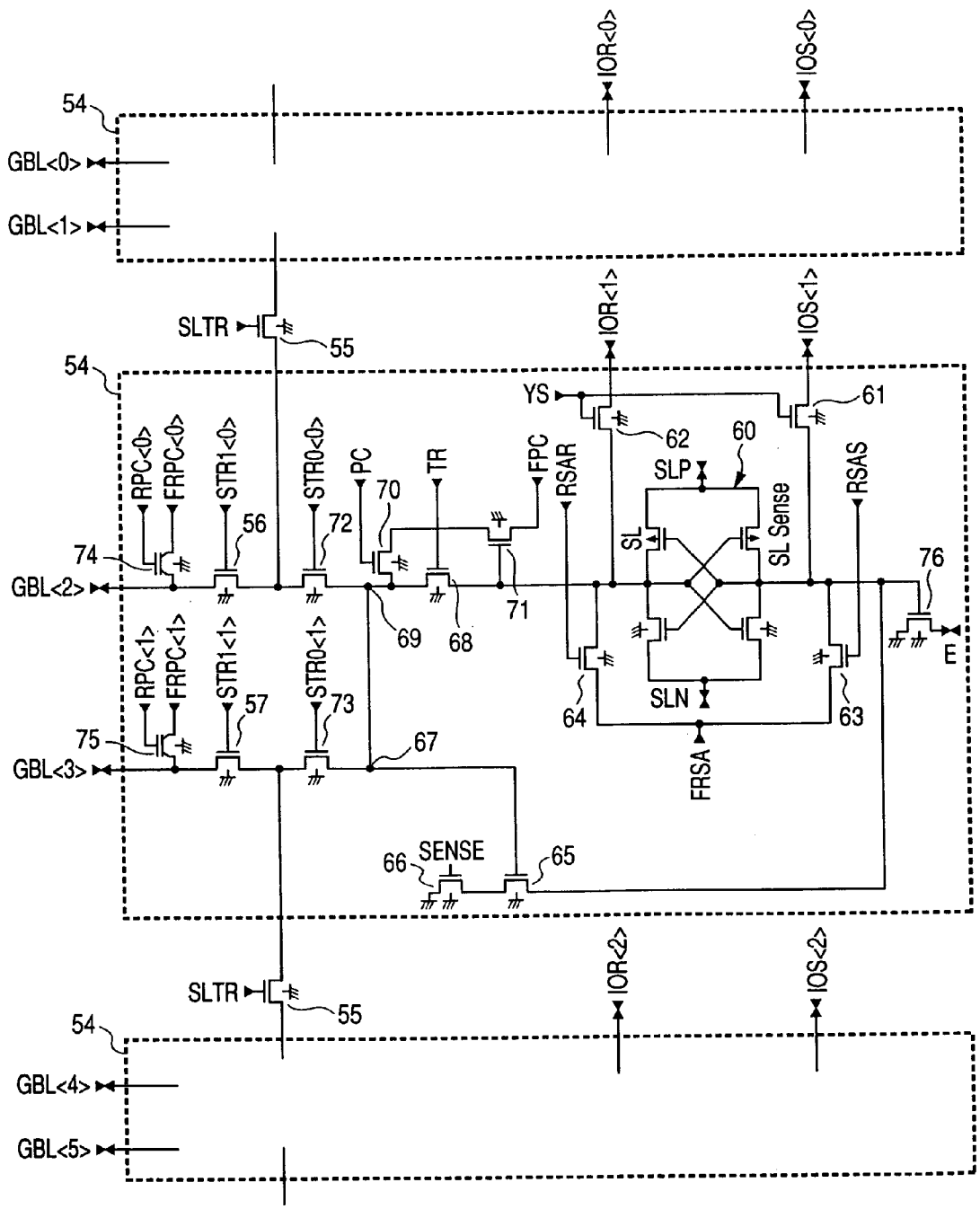
FIG. 39 is a circuit diagram depicting a detailed one example illustrative of a write/read circuit and a selection circuit.

A write/read circuit 50 and a selection circuit 51 are shown in FIG. 39. In FIG. 39, the write/read circuit 50 and the selection circuit 51 comprise a circuit unit 54 set every two global bit lines (GBL<i> and GBL<i+1>), and a MOS transistor 55 that selectively series-connect the adjoining circuit units 54 to each other. The write/read circuits 50 and the selection circuits 51 are illustrated in the form of an indistinct combination. If components or constituent elements for the two are distinguished from each other, then the selection circuit 51 is constituted of MOS transistors 55, 56, 57, 72 and 73, and the write/read circuit 50 is constituted of other circuit elements. In the figure, p-channel type MOS transistors are marked with arrows for their base gates and distinguished from n-channel type MOS transistors.

A configuration of the circuit unit 54 will be explained. The circuit unit 54 has a static latch 60 with SLP and SLN as operating power supply nodes. One input/output node is configured as a sense node (SL Sense) and the other input/output node is configured as a reference node (SL Ref). The sense node and the reference node are connectable to external interface terminals IOR<n> and IOS<n> via select MOS transistors 61 and 62 switch-controlled by a column select signal YS. Also they are connected to a precharge power supply node FRSA via sense latch set MOS transistors 63 and 64 respectively switch-controlled by signals RSAS and RSAR. Upon the operation of initialization of the sense node and reference node, the signals RSAS and RSAR are different in level from each other, so that the reference node is precharged to a level equal to approximately one-half the level at the sense node. The sense node is connected to a circuit ground potential via a sense MOS transistor 65 and a sense enable MOS transistor 66 switch-controlled by a signal SENSE. The gate of the sense MOS transistor 65 is connected to a node 67 that extends to a global bit line, and the sense MOS transistor 65 is switch-controlled according to the level of a global bit line to be read, whereby the level of the sense node is selectively inverted to a low level. Thus, the static latch 60 is capable of detecting memory information of a memory transistor and latching it therein. Also the static latch 60 is able to latch write data sent from the external interface terminals IOR<n> and IOS<n>.

The sense node is connected to a node 69 extending to a global bit line via a separate MOS transistor 68 switch-controlled by a signal TR. The node 69 is connected to a precharge power supply FPC via a write blocking precharge enable MOS transistor 70 switch-controlled by a signal PC and a write blocking precharge MOS transistor 71. The MOS transistor 71 is switch-controlled in accordance with the level of the sense node. When the reference node is of a high level upon latching of write data in the static latch 60, the node 69 is charged by the precharge power supply FPC in advance and thereafter reaches the high level of the reference node. If the reference node is low in level when the static latch 60 latches write data therein, then the node 69 reaches the low level of the reference node.

The node 69 is connected to its corresponding global bit line GBL<i> via the MOS transistor 72 switch-controlled by a signal SRT<0> and the MOS transistor 56 switch-controlled by a signal STR1<0>. The node 67 is connected to its corresponding global bit line GBL<i+1> via the MOS transistor 73 switch-controlled by a signal STR0<1> and the MOS transistor 57 switch-controlled by a signal STR1<1>. A connecting node of MOS transistors 56 and 72 in the circuit unit 54 provided in a subsequent stage is selectively connectable to a connecting node of MOS transistors 57 and 73 in the pre-stage circuit unit 54 via the corresponding MOS transistor 55 switch-controlled by a signal SLTR. The nodes 69 and 69 are connected to each other by a wiring. Thus, the static latch 60 is connectable to any one selected from the four global bit lines in accordance with switch-controlled states of the MOS transistors 55, 56, 57, 72 and 73. Bit line precharge MOS transistors 74 and 75 for reading and writing are provided corresponding to the respective global bit lines GBL<i> and GBL<i+1>. The bit line precharge MOS transistors 74 and 75 are connected to their corresponding precharge power supplies FRPC<0> and FRPC<1> and switch-controlled by their corresponding signals RPC<0> and RPC<1>.

Incidentally, a MOS transistor designated at reference numeral 76 is a transistor brought to an off state when data of a memory Vth"H" is latched in the static latch 60. The present MOS transistor is used to generate a signal EC indicative of write completion of the memory transistor upon write verify.

Figure 40:
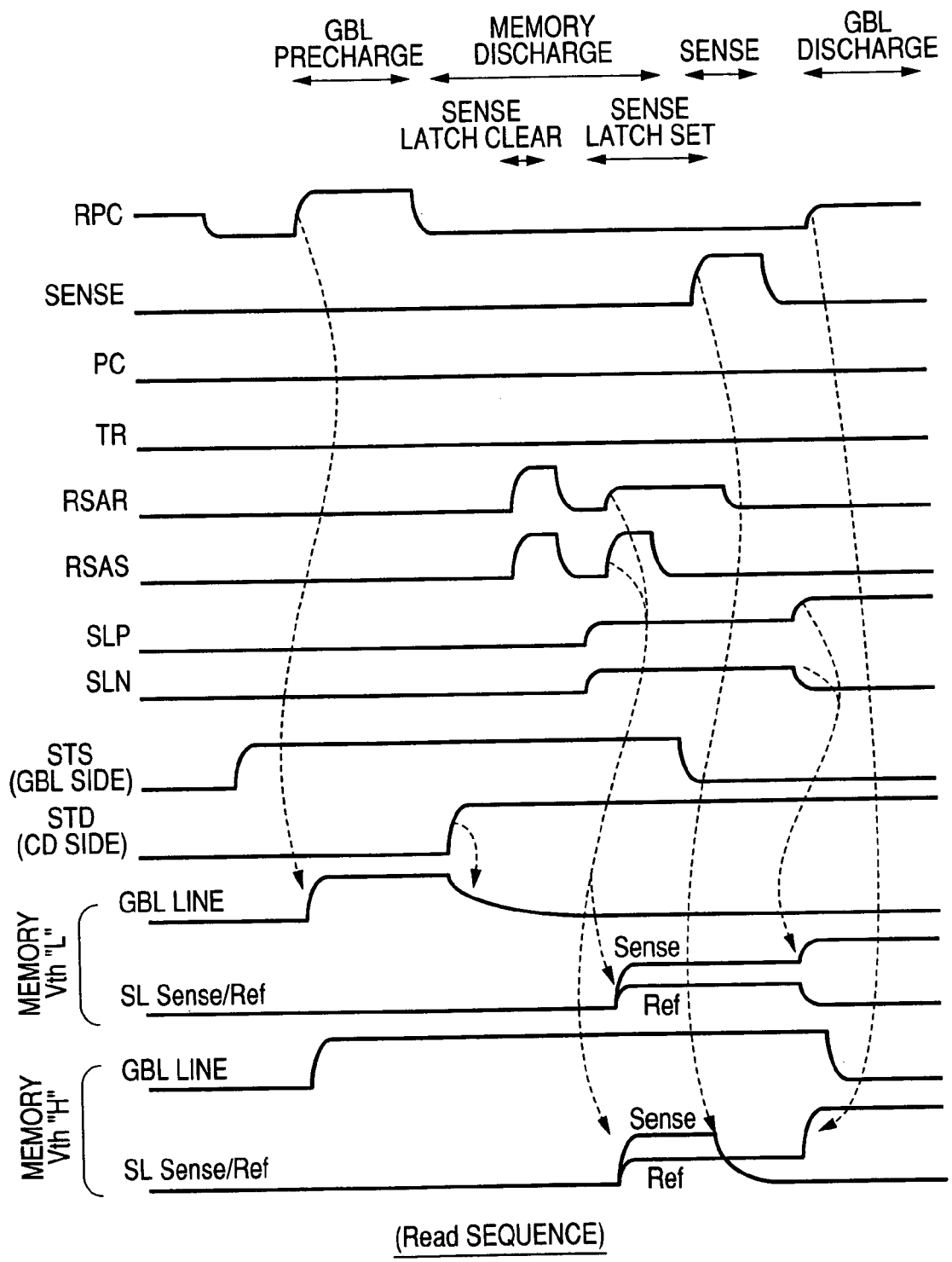
FIG. 40 is a timing chart showing read operating timings of a circuit unit for the write/read circuit and the selection circuit.

Read operating timings of the circuit unit 54 constituted of the write/read circuit 50 and the selection circuit 51 are shown in FIG. 40. When the threshold voltage of a memory transistor 21 to be read is placed in a low erase state (memory Vth"L"), its corresponding global bit line (GBL) is discharged from a precharge level, so that the MOS transistor 65 is held in an off state and the sense node is maintained at a high level. On the other hand, when the threshold voltage of the memory transistor 21 to be read is placed in a high write state (memory Vth"H"), GBL is maintained at the precharge level and the MOS transistor 65 is inverted to an on state, so that the sense node is inverted to a low level.

Figure 41:
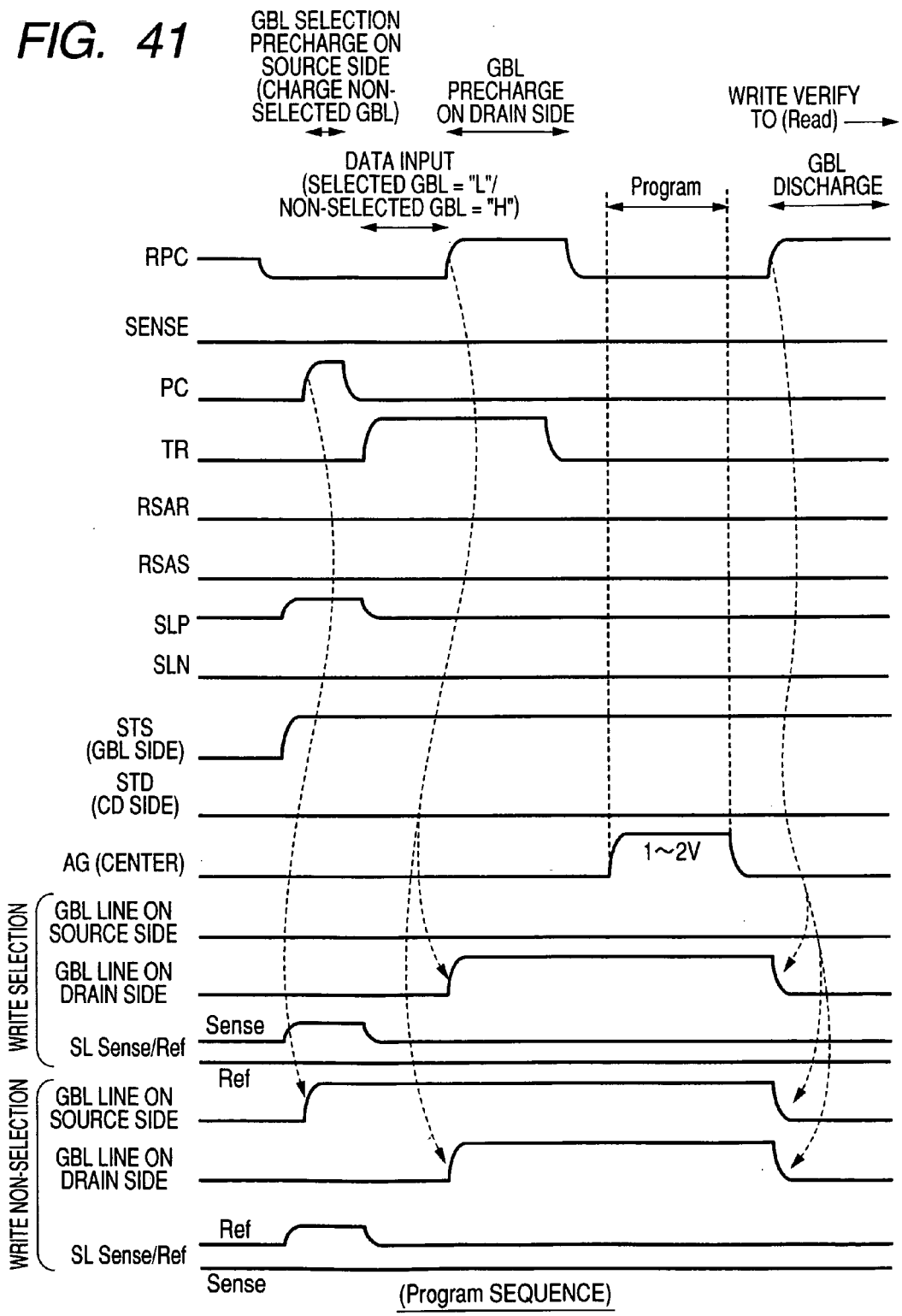
FIG. 41 is a timing chart depicting write operating timings of the circuit unit for the write/read circuit and the selection circuit.

Write (program) operating timings of the circuit unit 54 constituted of the write/read circuit 50 and the selection circuit 51 are shown in FIG. 41. The source side GBL to which each write selected memory transistor is connected is brought to a circuit ground potential in response to the low level of the reference node of the static latch 60 having latched the write data therein, whereas the drain side GBL is precharged to a write voltage by the transistor 74. Thus, a write current flows through the memory transistor 21 and hot electrons generated by the current are injected into a charge storage region of the memory transistor 21. The source side GBL to which each write non-selected memory transistor is connected, is charged to a write potential in response to the high level of the reference node of the static latch 60 having latched the write data therein, whereas the drain side GBL is precharged to a write voltage by the transistor 74. Thus, no write current flows through the memory transistor 21 and hence the injection of electrons into a charge storage region of the memory transistor 21 is suppressed.

Figure 42:
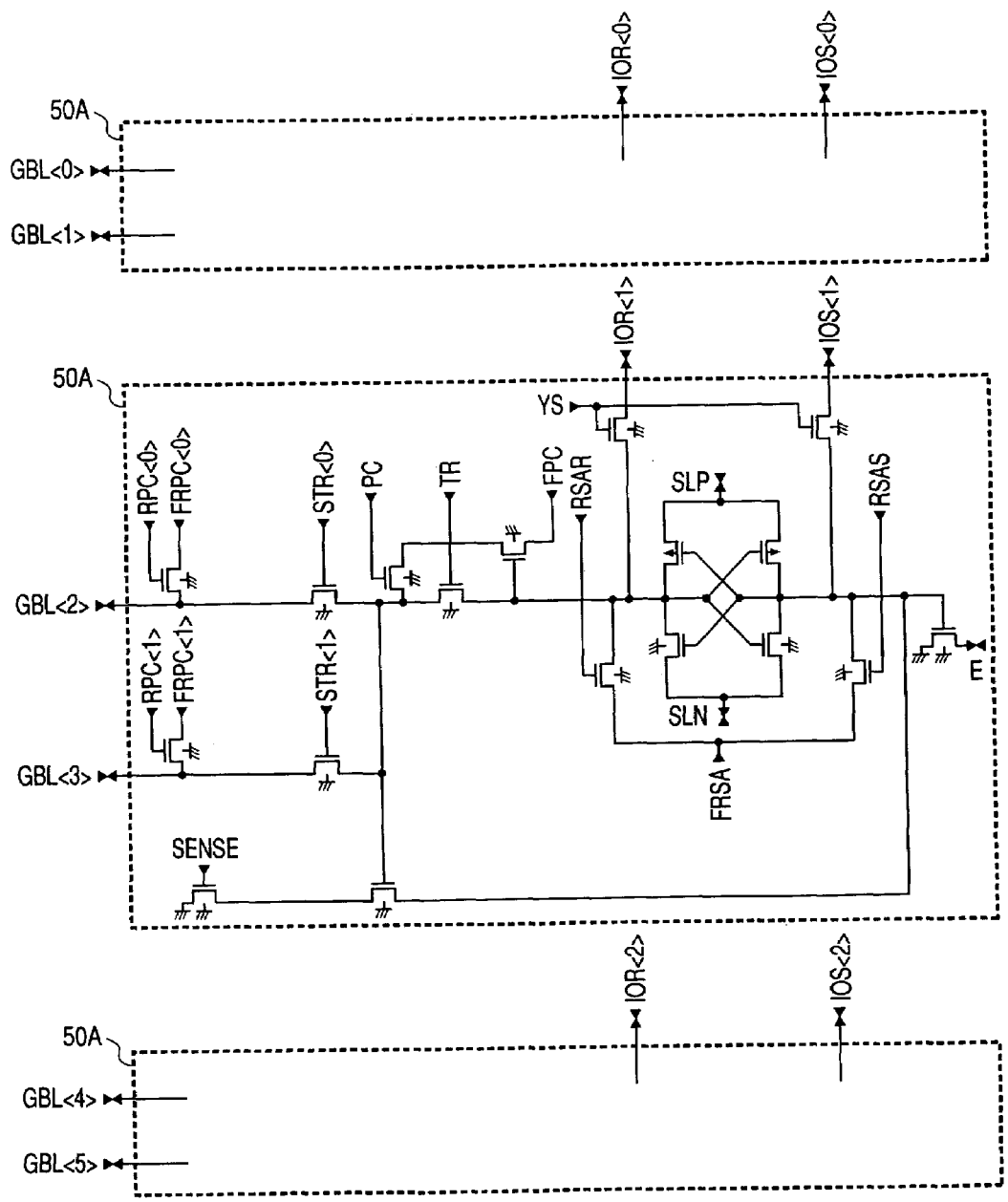
FIG. 42 is a circuit diagram showing a detained one example of the read/write circuit used in FIGS. 15 through 22 described as the comparative example.

The read/write circuits 50A employed in FIGS. 15 through 22 each described as the comparative example are illustrated in FIG. 42. The read/write circuit 50A is different from the circuit unit 54 shown in FIG. 39 in that no transistors 56 and 57 are provided and no gate transistor 55 is disposed between the units. The read/write circuit 50A shown in FIG. 42 is merely connectable selectively to two global bit lines determined in advance.

Figure 43:
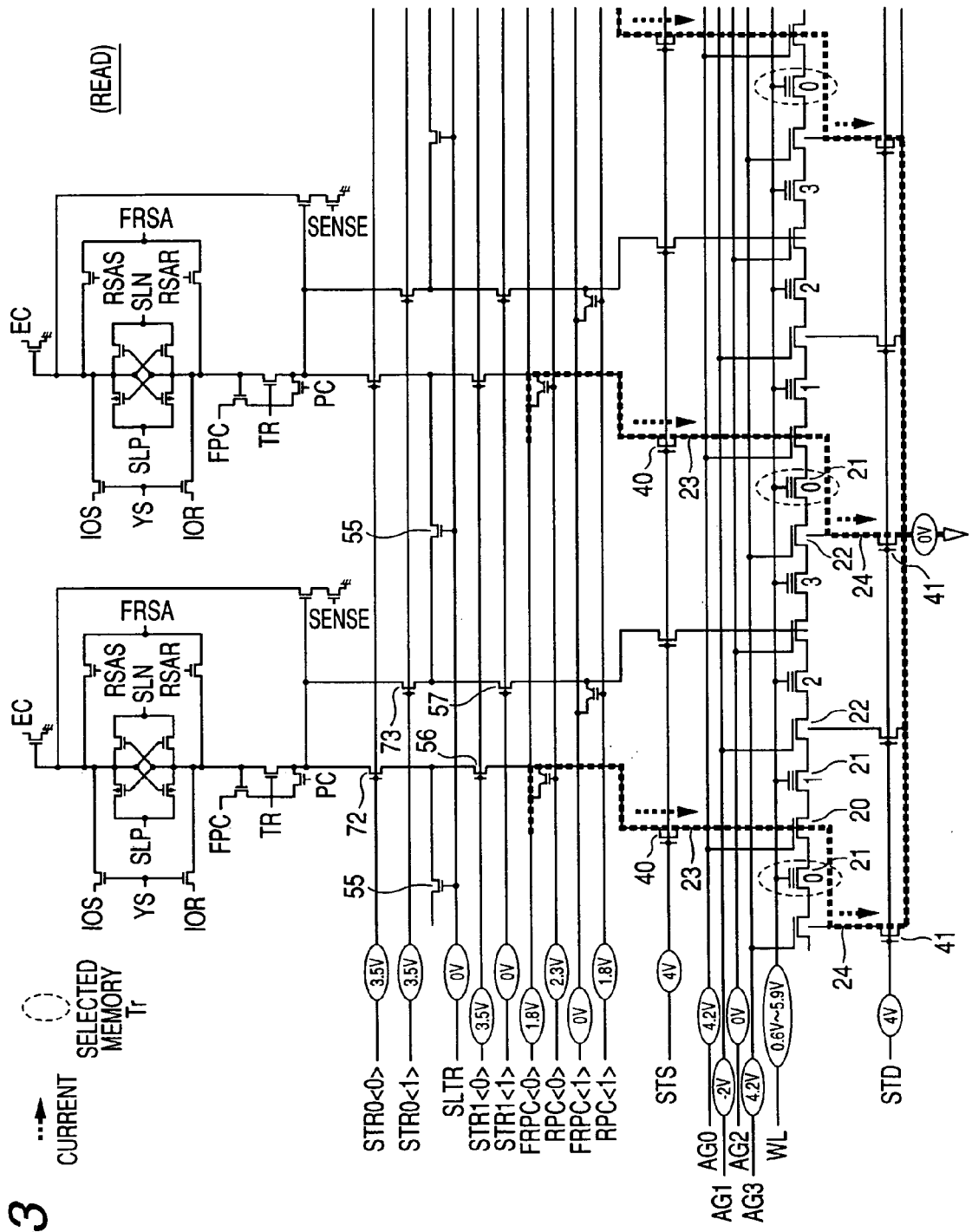
FIG. 43 is a circuit diagram depicting a connected configuration at the time that memories 0 are intended for reading, as a connected form of inversion layers by the write/read circuit and selection circuit based on the constitution of FIG. 39.
Figure 44:
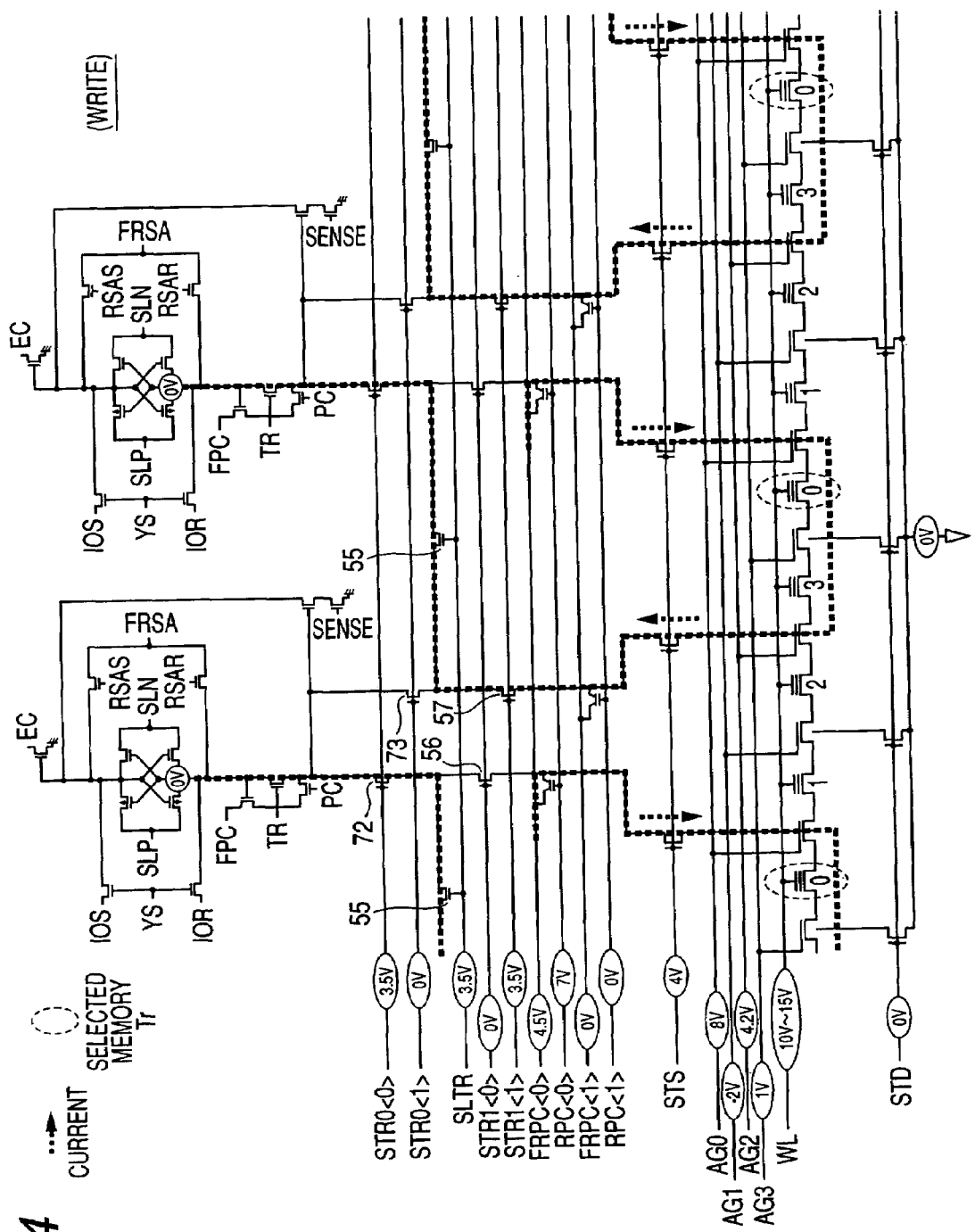
FIG. 44 is a circuit diagram showing a connected configuration at the time that the memories 0 are intended for writing, as a connected form of the inversion layers by the write/read circuit and selection circuit based on the constitution of FIG. 39.
Figure 45:
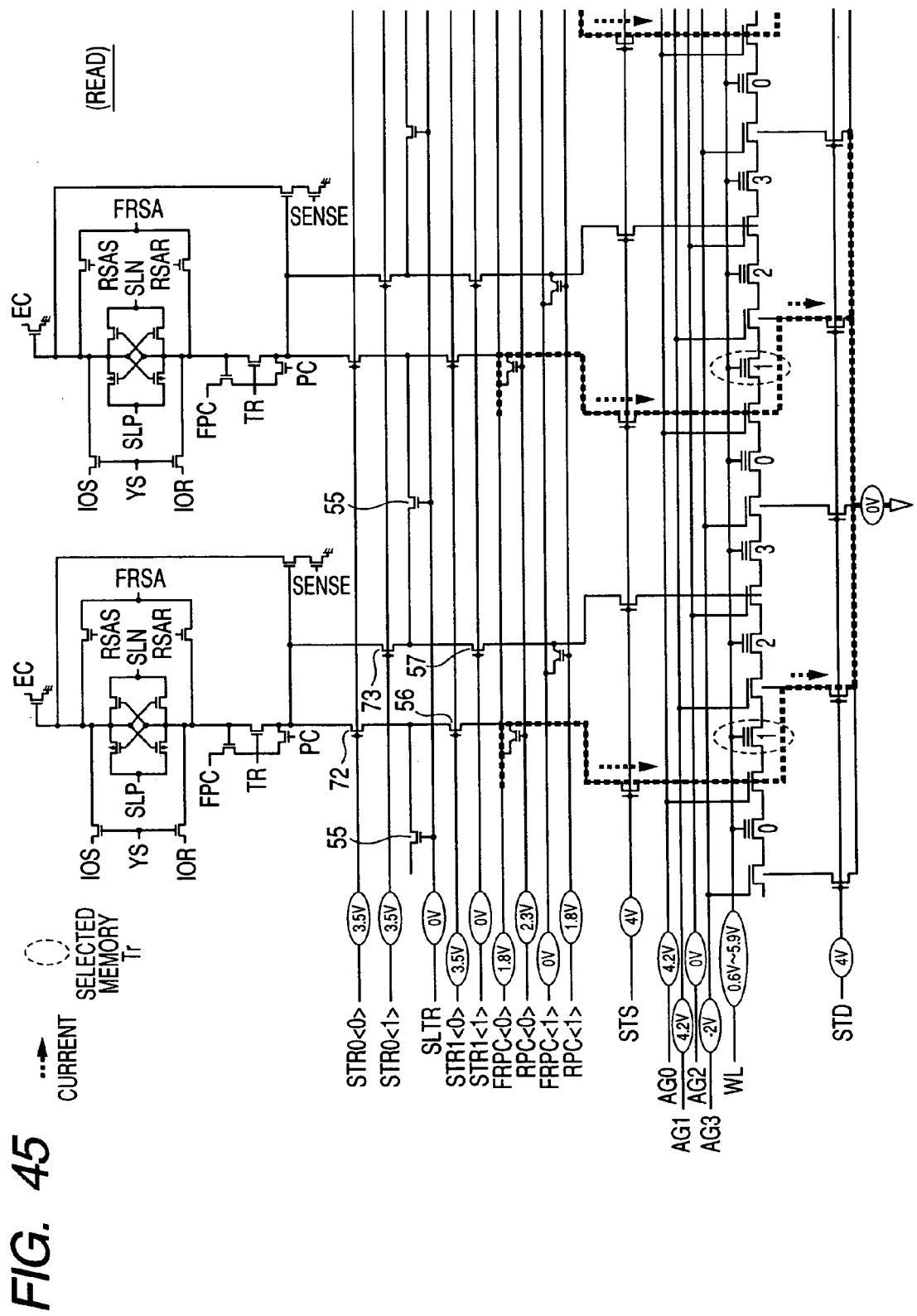
FIG. 45 is a circuit diagram depicting a connected configuration at the time that memories 1 are intended for reading, as a connected form of the inversion layers by the write/read circuit and selection circuit based on the constitution of FIG. 39.
Figure 46:
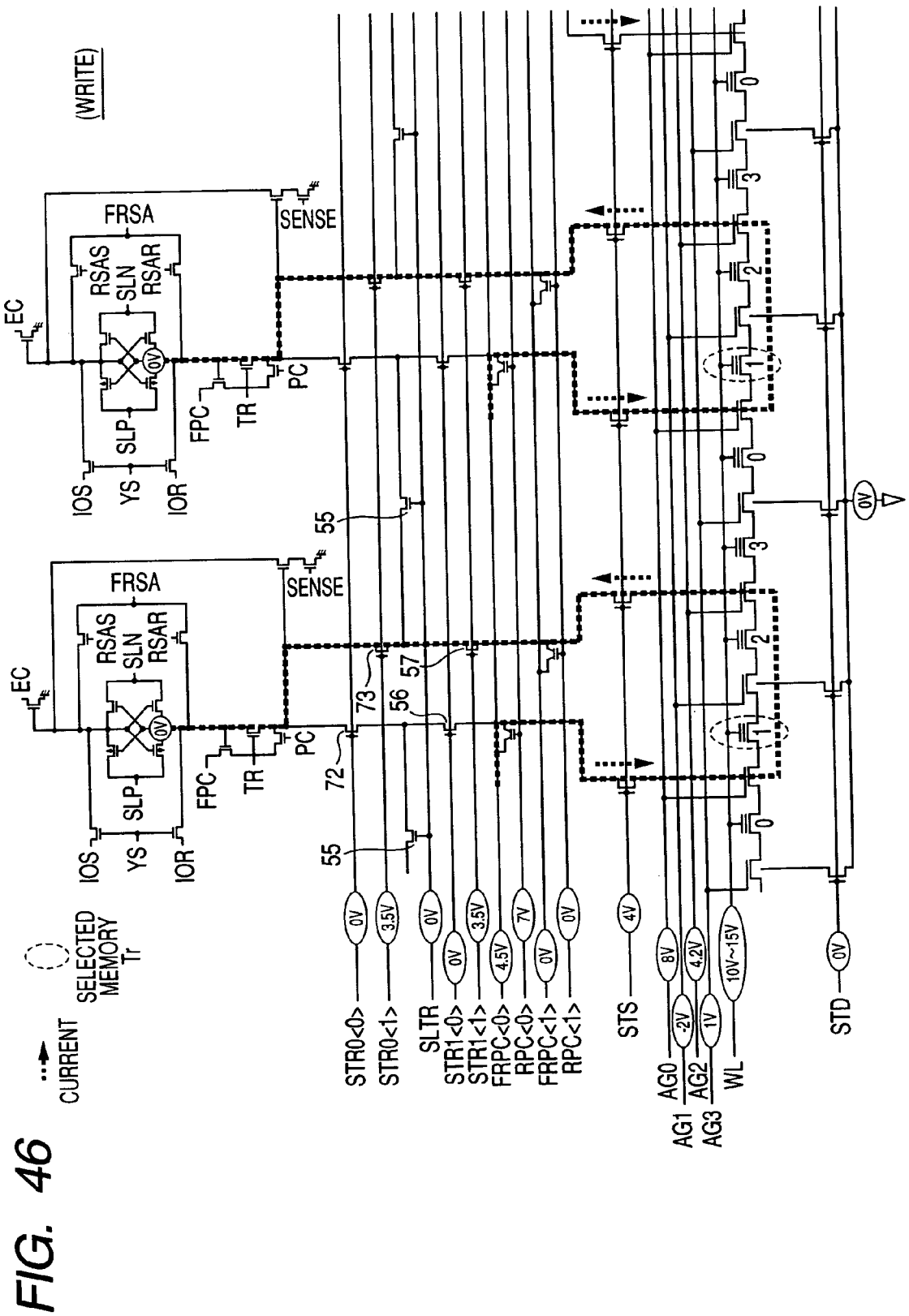
FIG. 46 is a circuit diagram showing a connected configuration at the time that the memories 1 are intended for writing, as a connected form of the inversion layers by the write/read circuit and selection circuit based on the constitution of FIG. 39.
Figure 47:
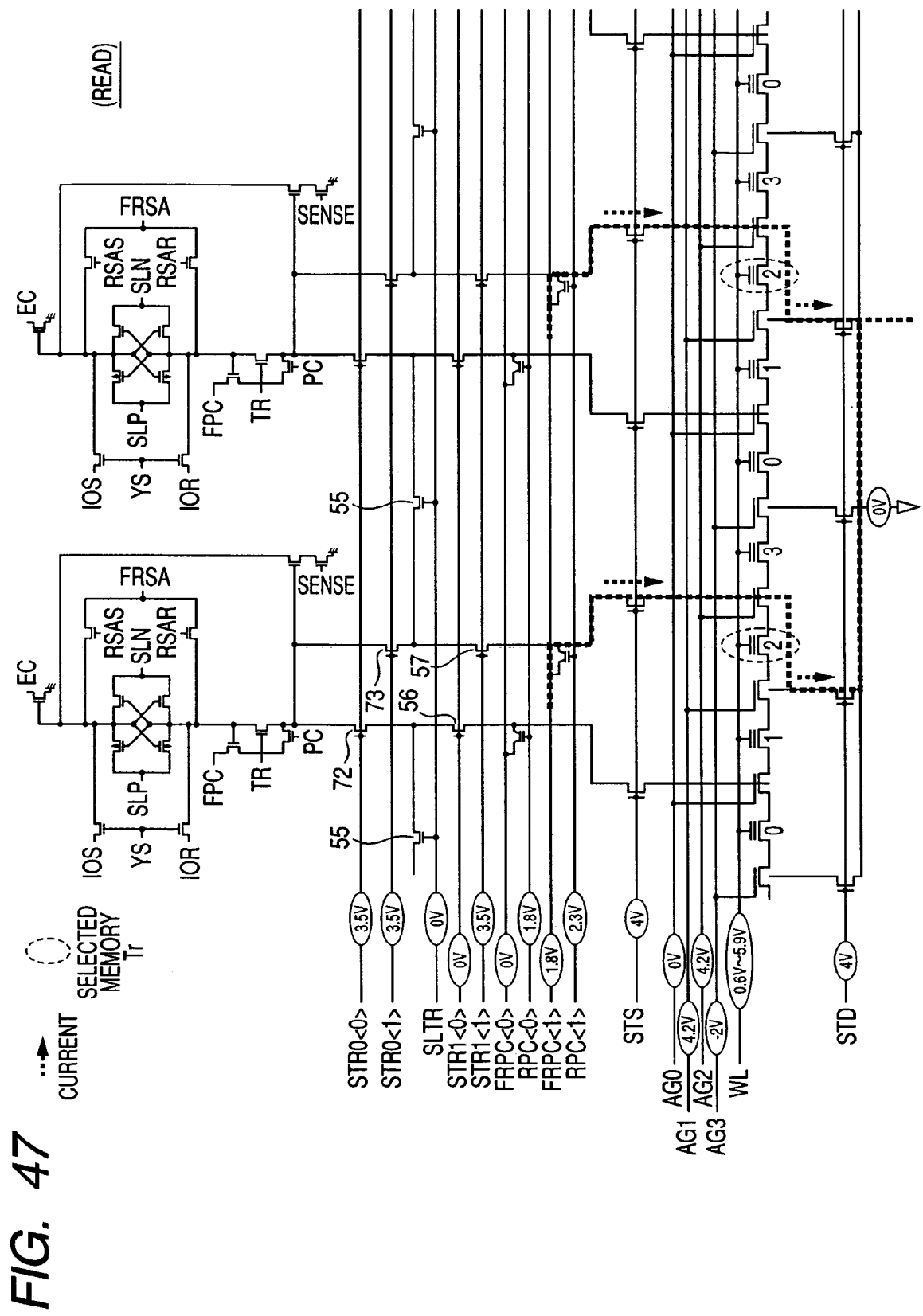
FIG. 47 is a circuit diagram depicting a connected configuration at the time that memories 2 are intended for reading, as a connected form of the inversion layers by the write/read circuit and selection circuit based on the constitution of FIG. 39.
Figure 48:
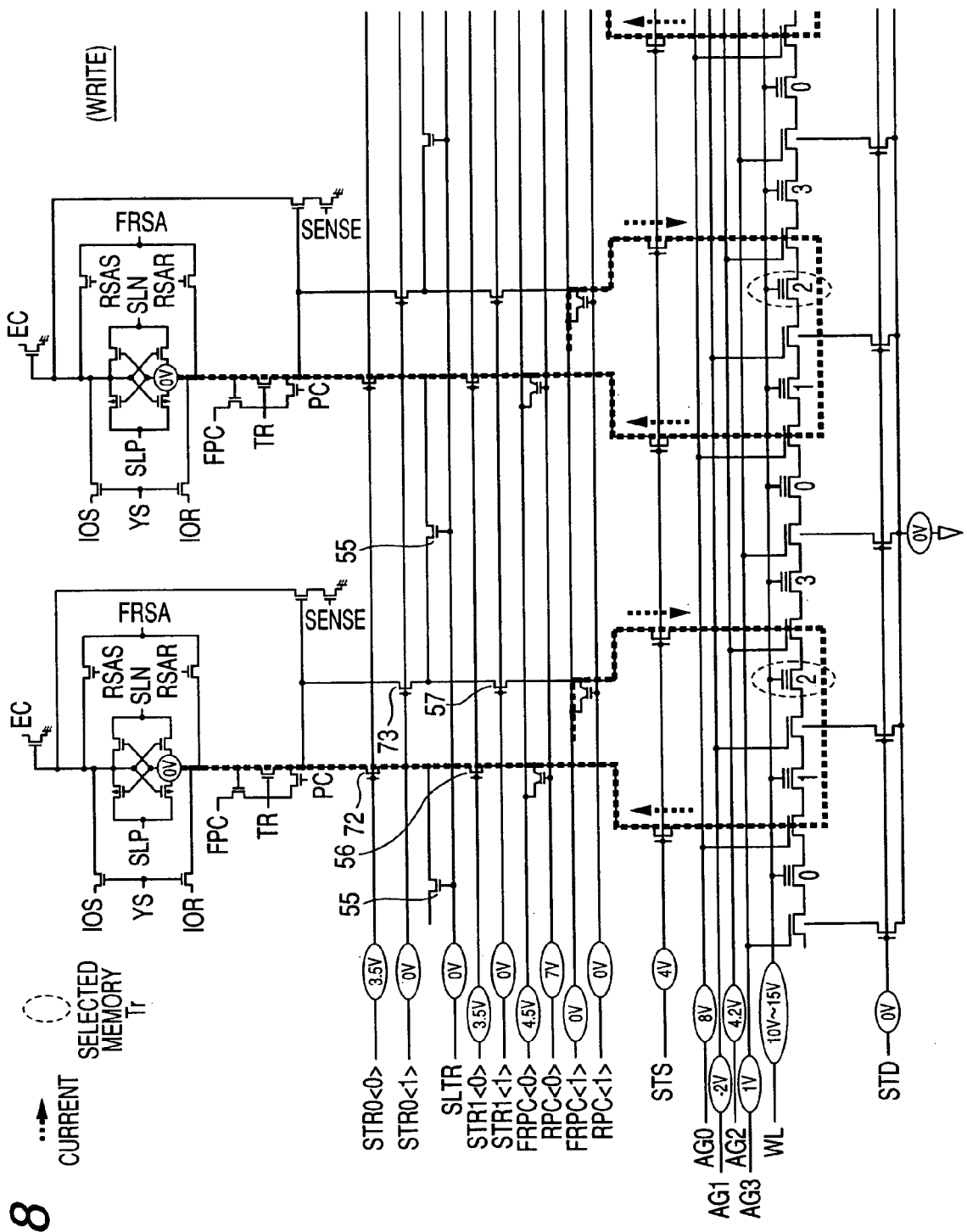
FIG. 48 is a circuit diagram showing a connected configuration at the time that the memories 2 are intended for writing, as a connected form of the inversion layers by the write/read circuit and selection circuit based on the constitution of FIG. 39.
Figure 49:
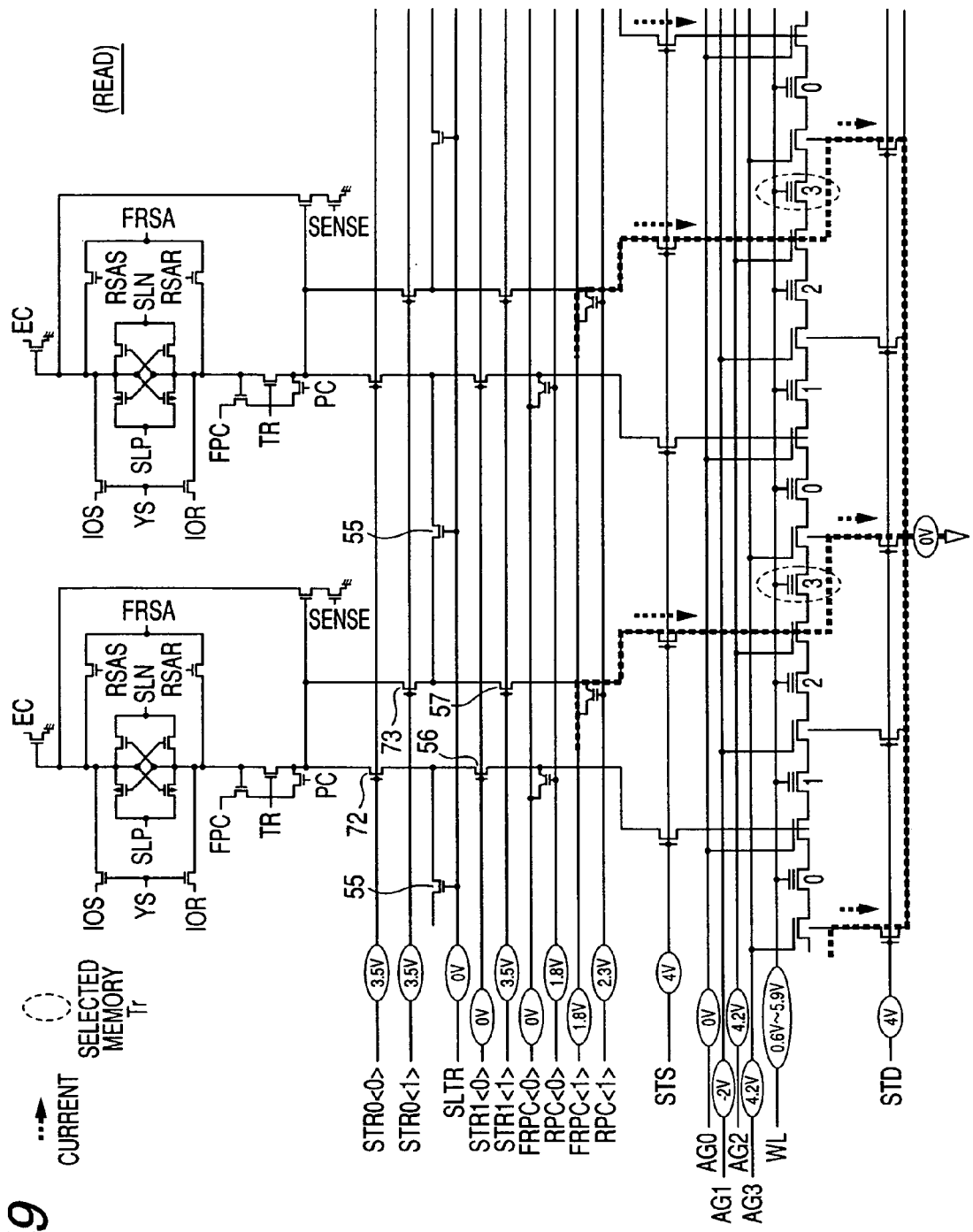
FIG. 49 is a circuit diagram depicting a connected configuration at the time that memories 3 are intended for reading, as a connected form of the inversion layers by the write/read circuit and selection circuit based on the constitution of FIG. 39.
Figure 50:
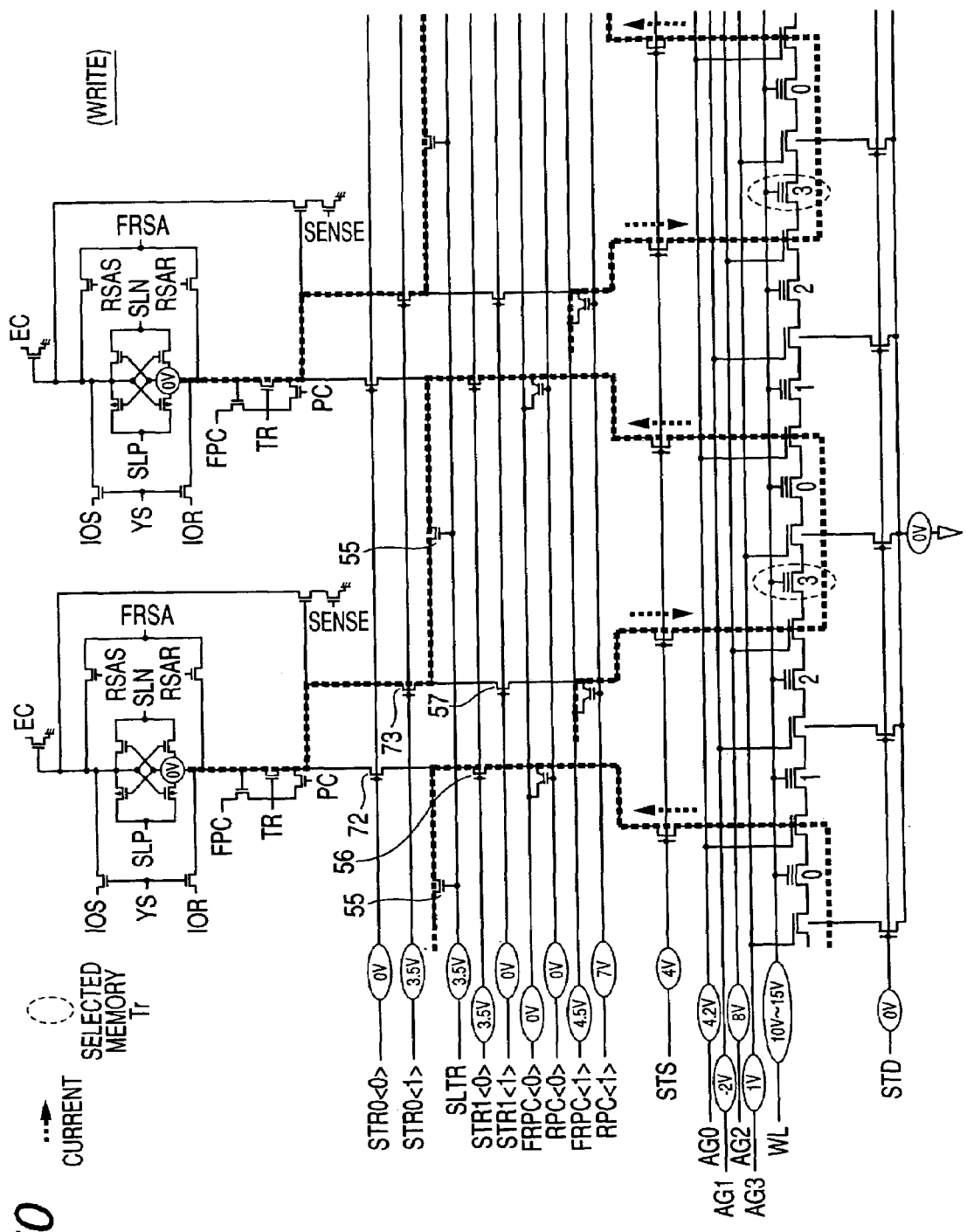
FIG. 50 is a circuit diagram showing a connected configuration at the time that memories 3 are intended for writing, as a connected form of the inversion layers by the write/read circuit and selection circuit based on the constitution of FIG. 39.

Respective connected forms of inversion layers 23 by the write/read circuit 50 and the selection circuit 51 based on the constitution of FIG. 39 are illustrated in FIGS. 43 through 50. A connected configuration at the time that memories 0 are intended for reading is shown in FIG. 43, and a connected configuration at the time that the memories 0 are intended for writing is shown in FIG. 44, respectively. A connected configuration at the time that memories 1 are intended for reading is shown in FIG. 45, and a connected configuration at the time that the memories 1 are intended for writing is shown in FIG. 46, respectively. A connected configuration at the time that memories 2 are intended for reading is shown in FIG. 47, and a connected configuration at the time that the memories 2 are intended for writing is shown in FIG. 48, respectively. A connected configuration at the time that memories 3 are intended for reading is shown in FIG. 49, and a connected configuration at the time that the memories 3 are intended for writing is shown in FIG. 50, respectively.

<<Another Example of Connected Configuration by Selection Circuit 51>>

Figure 51:
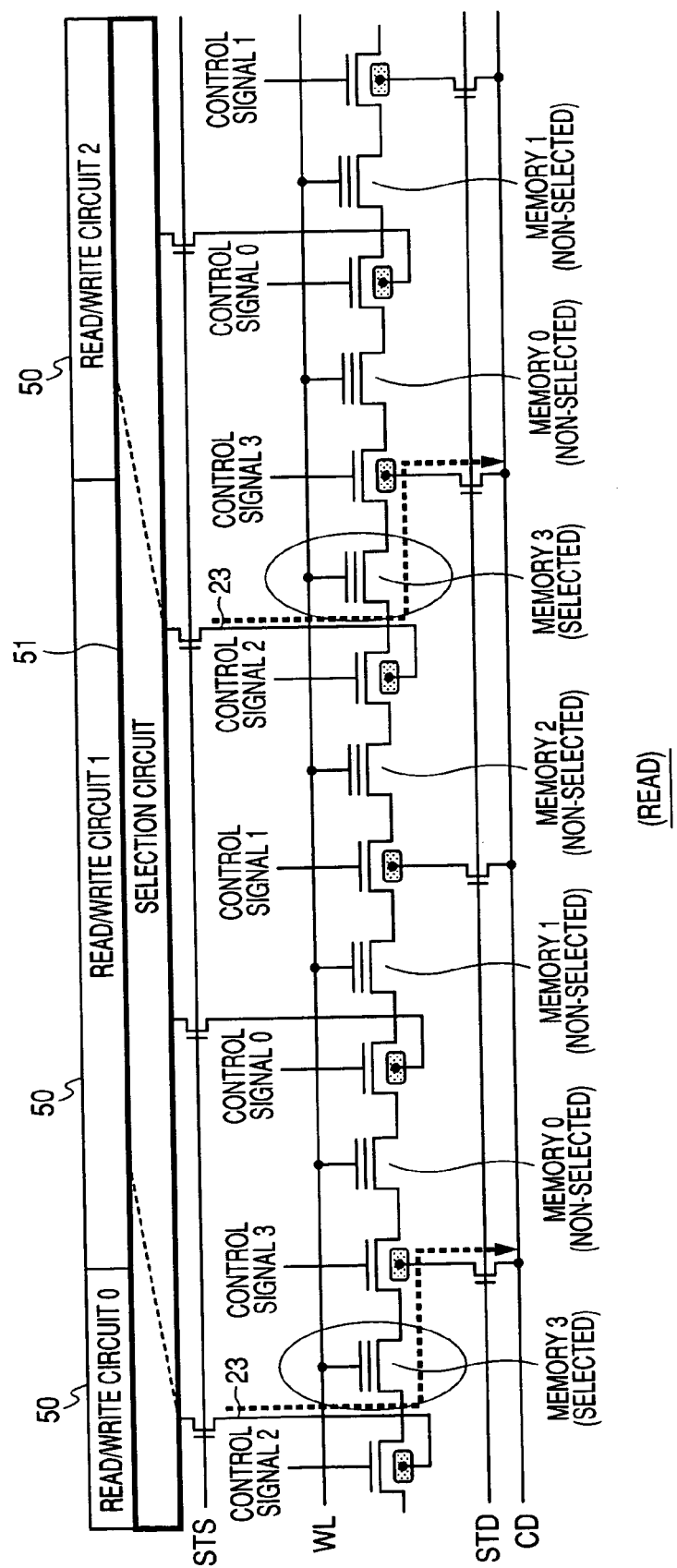
FIG. 51 is a circuit diagram depicting a connected configuration at a read operation of each of memories 3 when one write/read circuit is operated so as to select a connection in accordance with an access operation in a range of three GBLs provided side by side to the right and left.
Figure 52:
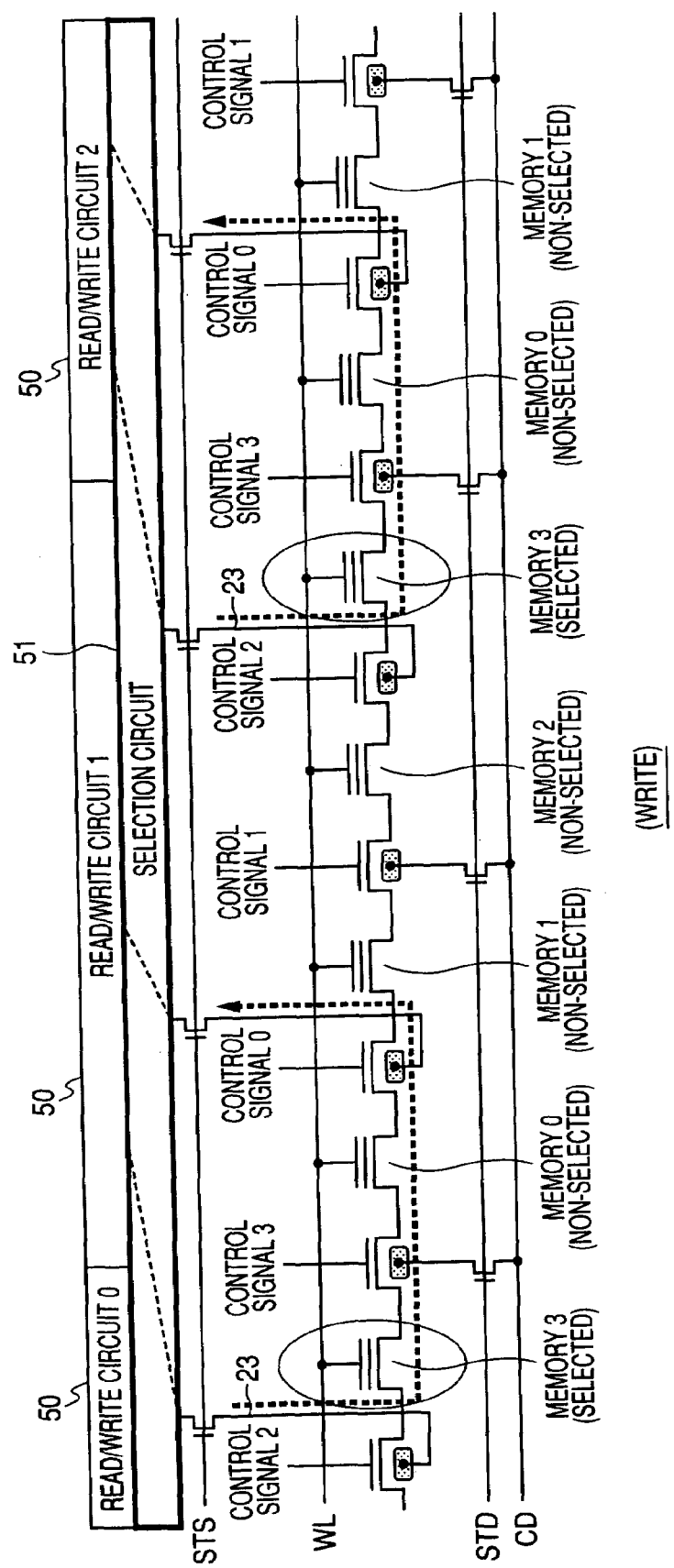
FIG. 52 is a circuit diagram depicting a connected configuration at a write operation of each of the memories 3 when one write/read circuit is operated so as to select a connection in accordance with an access operation in a range of three GBLs provided side by side to the right and left.

In the connected configuration of the inversion layers 23 by the write/read circuit 50 and the selection circuit 51 described in FIG. 39, one write/read circuit 50 is operated so as to select the connection in accordance with the access operation in the range of the four GBLs provided side by side to the right and left. The constitution of FIG. 39 is not limited to it. One write/read circuit 50 may be operated so as to select a connection in accordance with an access operation in a range of three GBLs provided side by side to the right and left. In this case, such a connected configuration as shown in FIG. 51 may be selected upon the read operation of the memory 3 described in FIG. 13. Such a connected configuration as shown in FIG. 52 may be selected upon the write operation of the memory 3 described in FIG. 14. The same connected forms as those described in FIGS. 7 through 12 may be selected upon access to the memories 0, 1 and 2.

Figure 53:
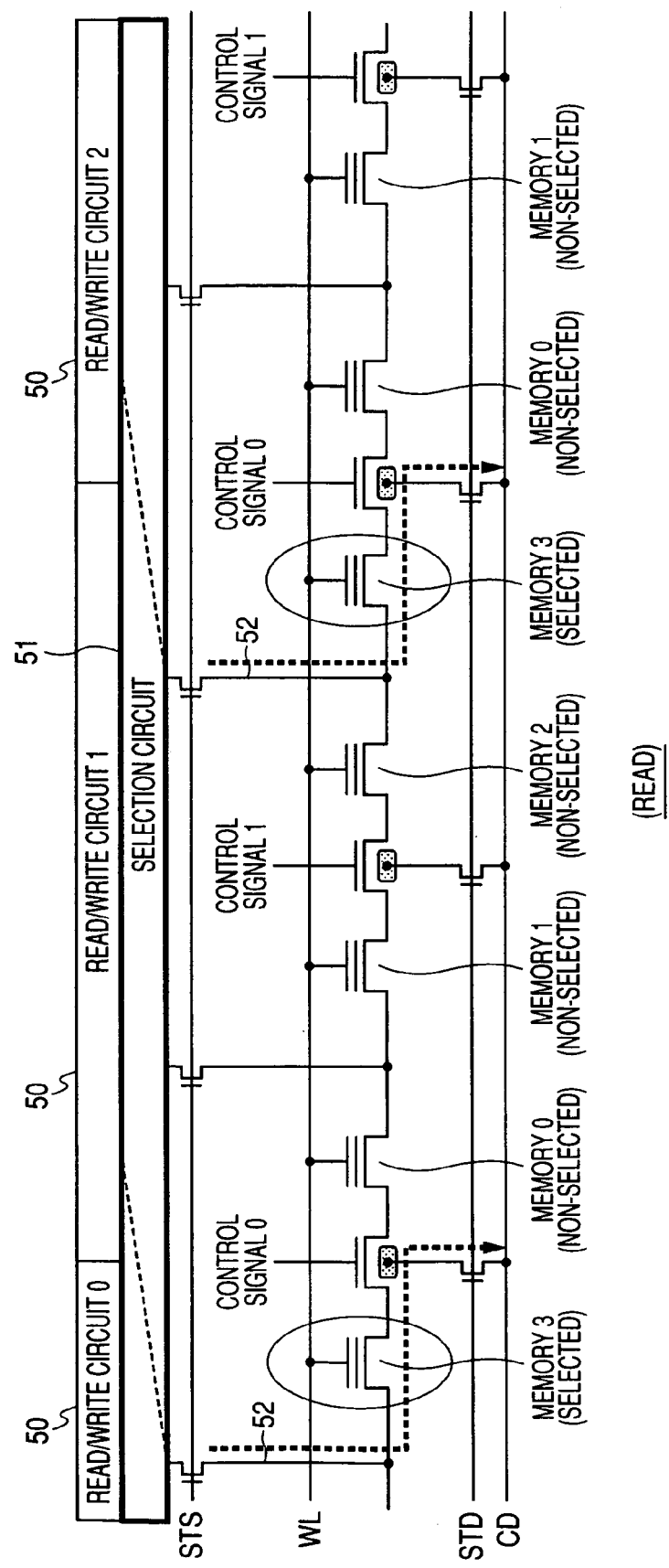
FIG. 53 is a circuit diagram showing a connected configuration at a read operation of each of memories 3 when one write/read circuit is operated so as to select a connection in a range of three GBLs provided side by side to the right and left in a memory array configuration using diffused layers in place of inversion layers.
Figure 54:
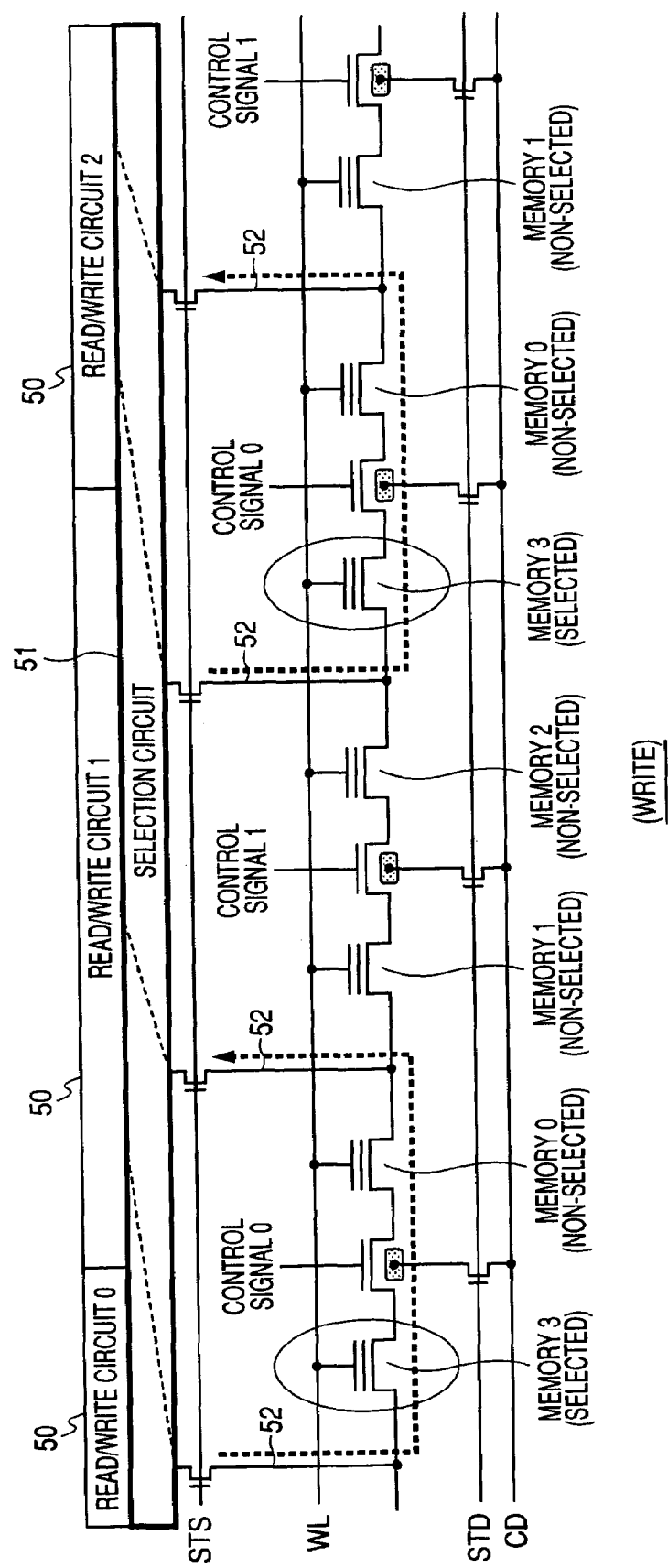
FIG. 54 is a circuit diagram depicting a connected configuration at a write operation of each of the memories 3 when one write/read circuit is operated so as to select a connection in a range of three GBLs provided side by side to the right and left in the memory array configuration using the diffused layers in place of the inversion layers.

In a manner similar to above, connected forms shown in FIGS. 53 and 54 may be selected in place of the connected forms shown in FIGS. 29 and 30 even in a memory array configuration using diffused layers 52 as an alternative to the inversion layers 23. The same connected forms as those described in FIGS. 23 through 28 may be selected upon access to the memories 0, 1 and 2.

Figure 55:
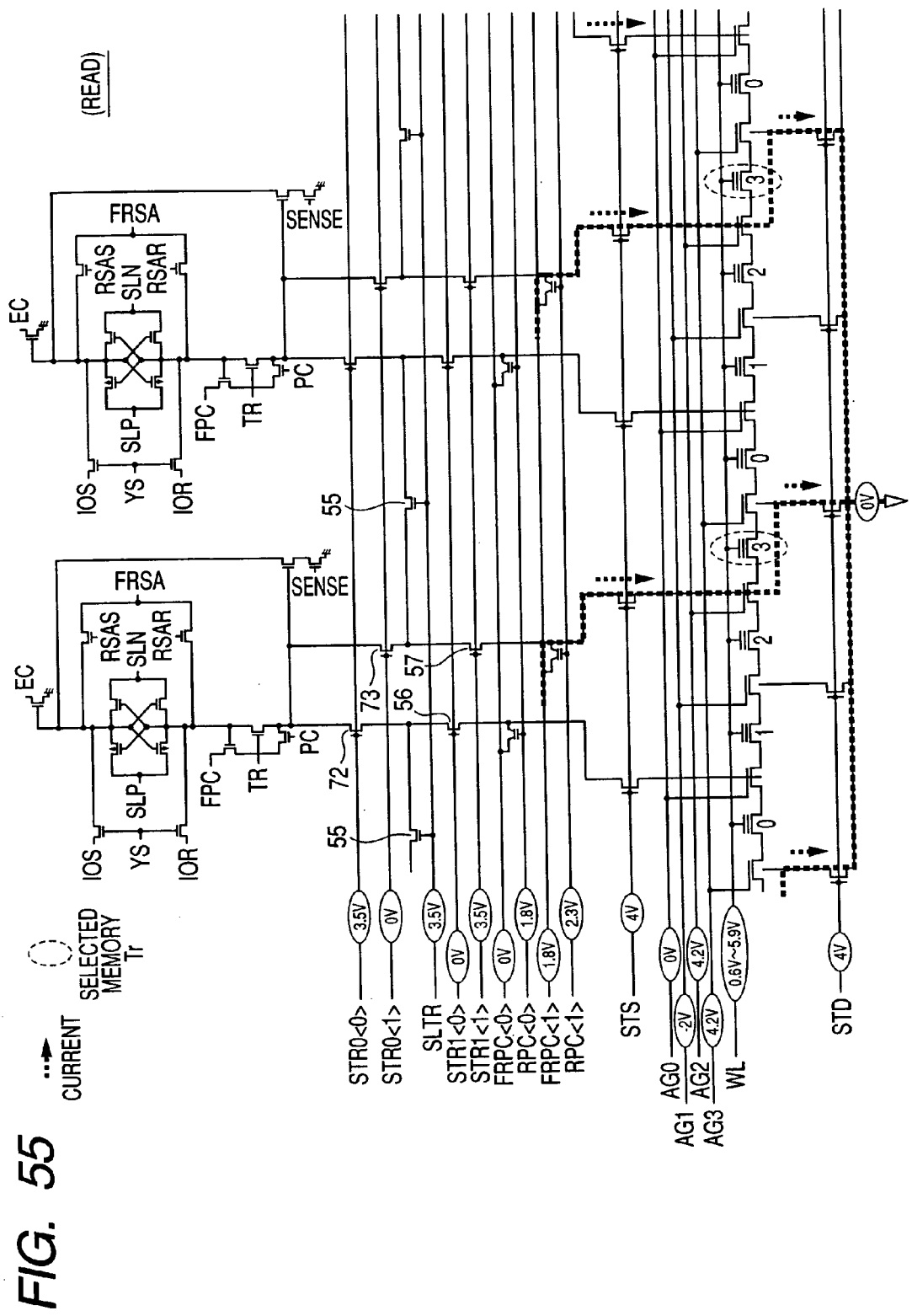
FIG. 55 is a circuit diagram showing a connected configuration adopted in place of the connected configuration shown in FIG. 49 as a further detailed connected form corresponding to the connected form of FIG. 52.
Figure 56:
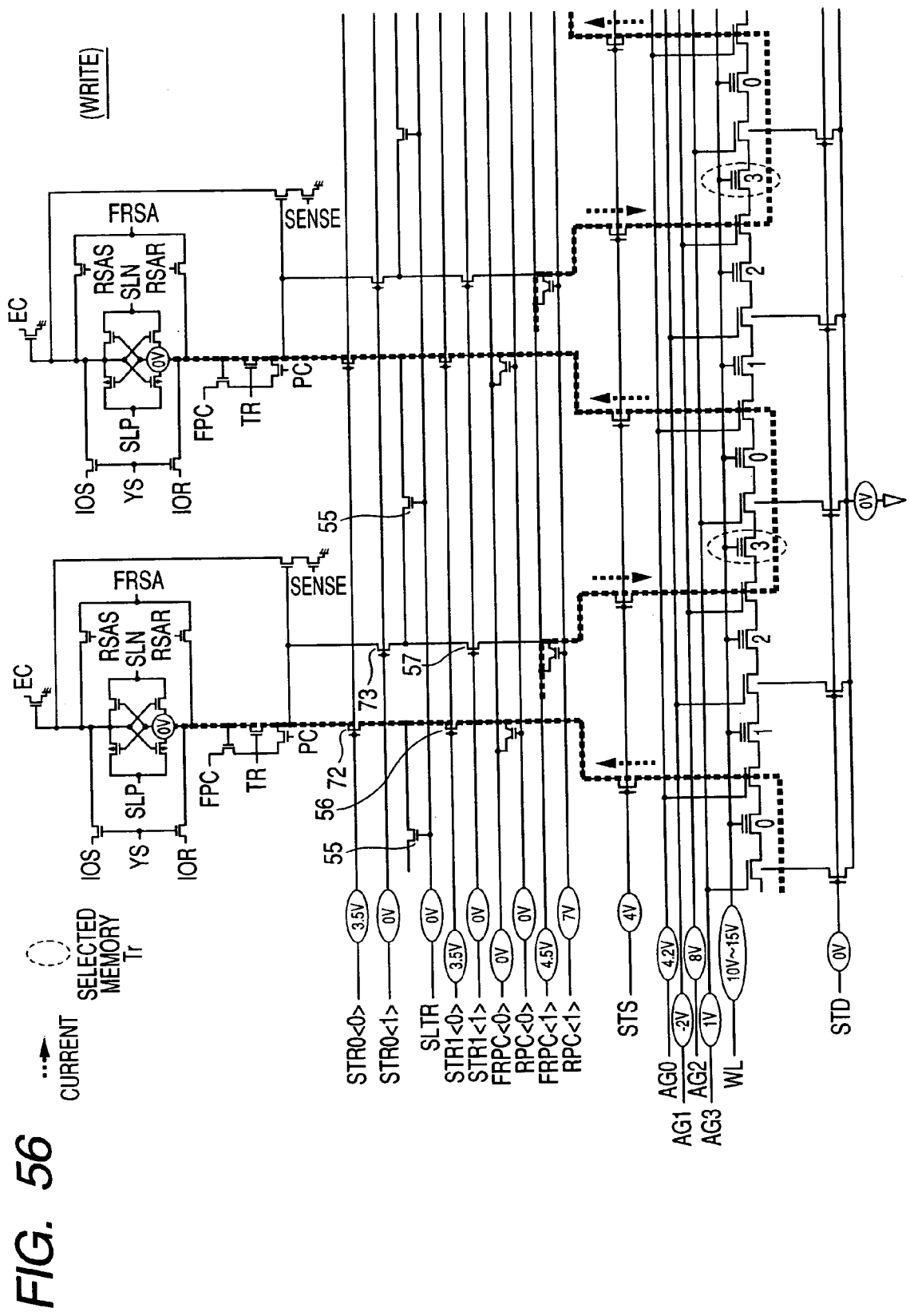
FIG. 56 is a circuit diagram depicting a connected configuration adopted in place of the connected configuration of FIG. 50 as a further detailed connected form corresponding to the connected form of FIG. 52.

A further detailed connected form corresponding to the connected form shown in FIG. 51 is illustrated in FIG. 55. A further detailed connected form corresponding to the connected form shown in FIG. 52 is illustrated in FIG. 56. FIG. 55 shows the connected form adopted in place of the connected form shown in FIG. 49, and FIG. 56 depicts the connected form adopted in place of the connected form shown in FIG. 50.

<<Another Example Illustrative of Write/Read Circuit and Selection Circuit>>

Figure 57:
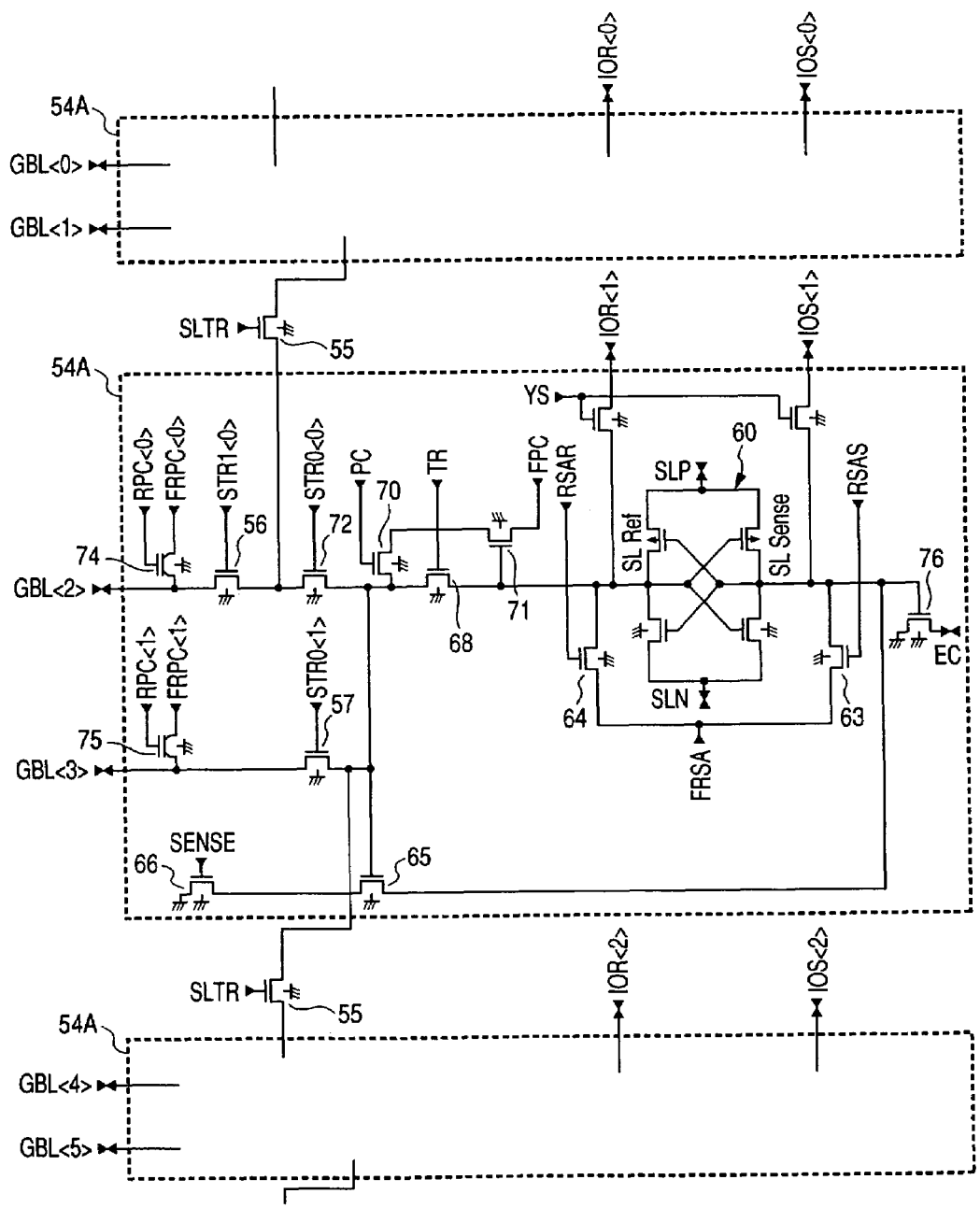
FIG. 57 is a circuit diagram showing another example illustrative of a write/read circuit and a selection circuit.

Another example illustrative of a write/read circuit 50 and a selection circuit 51 is shown in FIG. 57. In FIG. 57, the write/read circuit 50 and the selection circuit 51 comprise a circuit unit 54A set every two global bit lines (GBL<i> and GBL<i+1>), and a MOS transistor 55 that selectively series-connect the adjoining circuit units 54A to each other. The write/read circuits 50 and the selection circuits 51 are illustrated in the form of an indistinct combination. If components or constituent elements for the two are distinguished from each other, then the selection circuit 51 is constituted of MOS transistors 55, 56, 57 and 72, and the write/read circuit 50 is constituted of other circuit elements. In the figure, p-channel type MOS transistors are marked with arrows for their base gates and distinguished from n-channel type MOS transistors. A point of difference between the circuit configuration shown in FIG. 57 and the circuit configuration shown in FIG. 39 resides in that the transistor 73 is omitted. The constitution shown in FIG. 57 is different functionally from the constitution of FIG. 39 in that a connection to the read/write circuit is controlled in a range of three global bit lines of two global bit lines GBL<i> and GBL<i+1> and its upper or high-order one global bit line GBL<i+2> corresponding to the circuit unit 54A. Other configurations are identical to those shown in FIG. 39. The same circuit elements are given the same reference numerals, and their detailed description will therefore be omitted.

Figure 58:
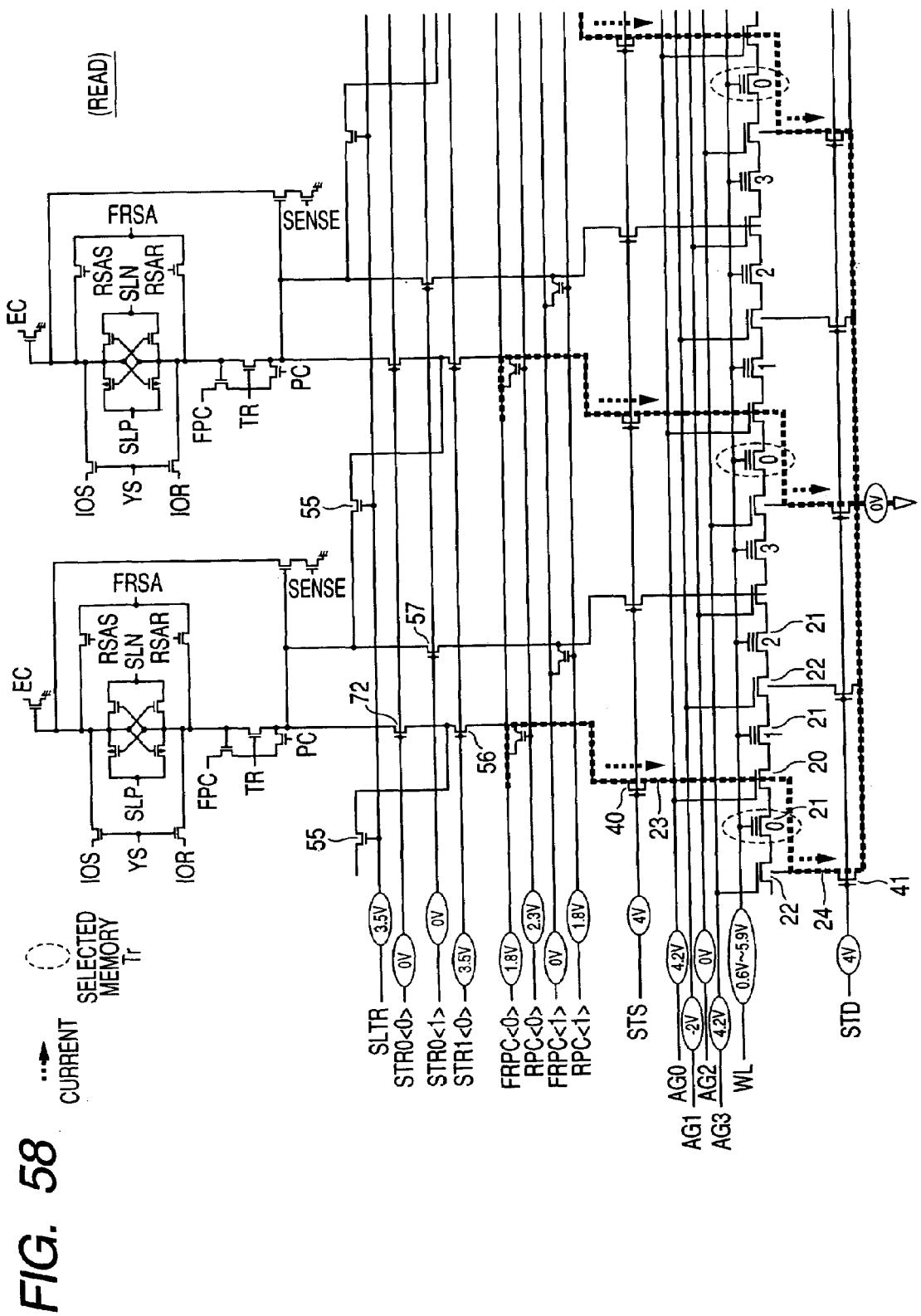
FIG. 58 is a circuit diagram depicting a connected configuration at the time that memories 0 are intended for reading, as a connected form of inversion layers by the write/read circuit and selection circuit based on the constitution of FIG. 57.
Figure 59:
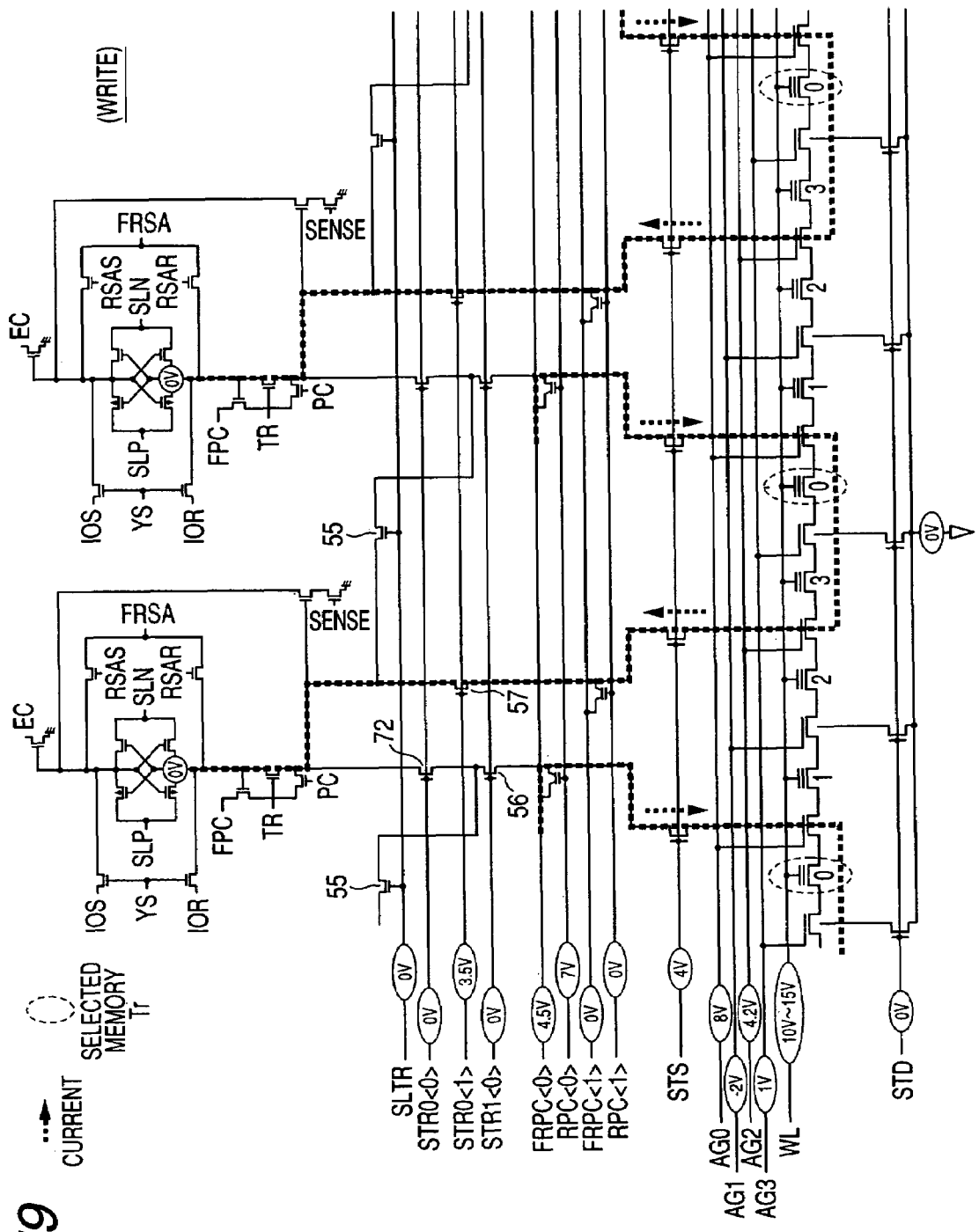
FIG. 59 is a circuit diagram depicting a connected configuration at the time that the memories 0 are intended for writing, as a connected form of the inversion layers by the write/read circuit and selection circuit based on the constitution of FIG. 57.
Figure 60:
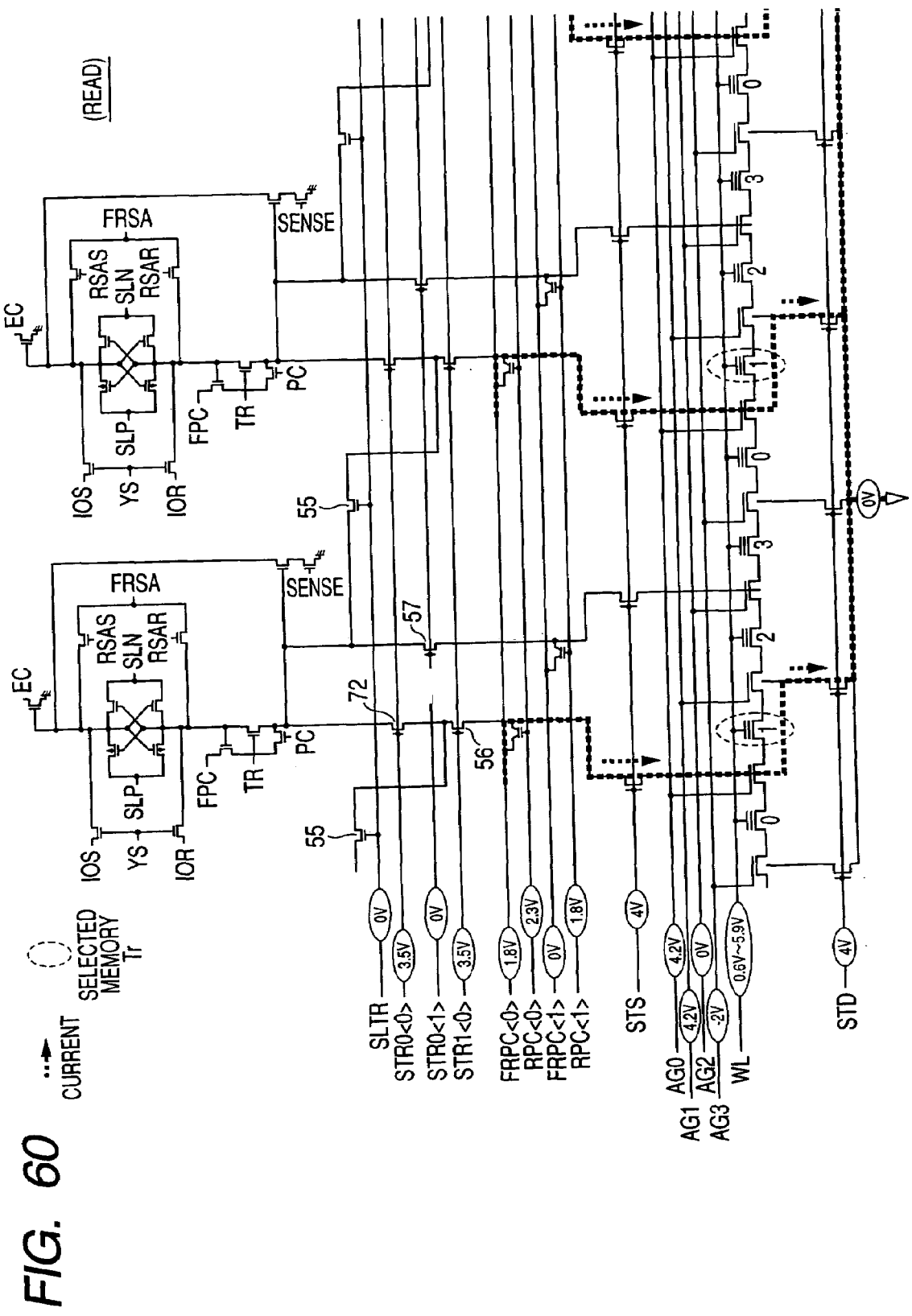
FIG. 60 is a circuit diagram showing a connected configuration at the time that memories 1 are intended for reading, as a connected form of the inversion layers by the write/read circuit and selection circuit based on the constitution of FIG. 57.
Figure 61:
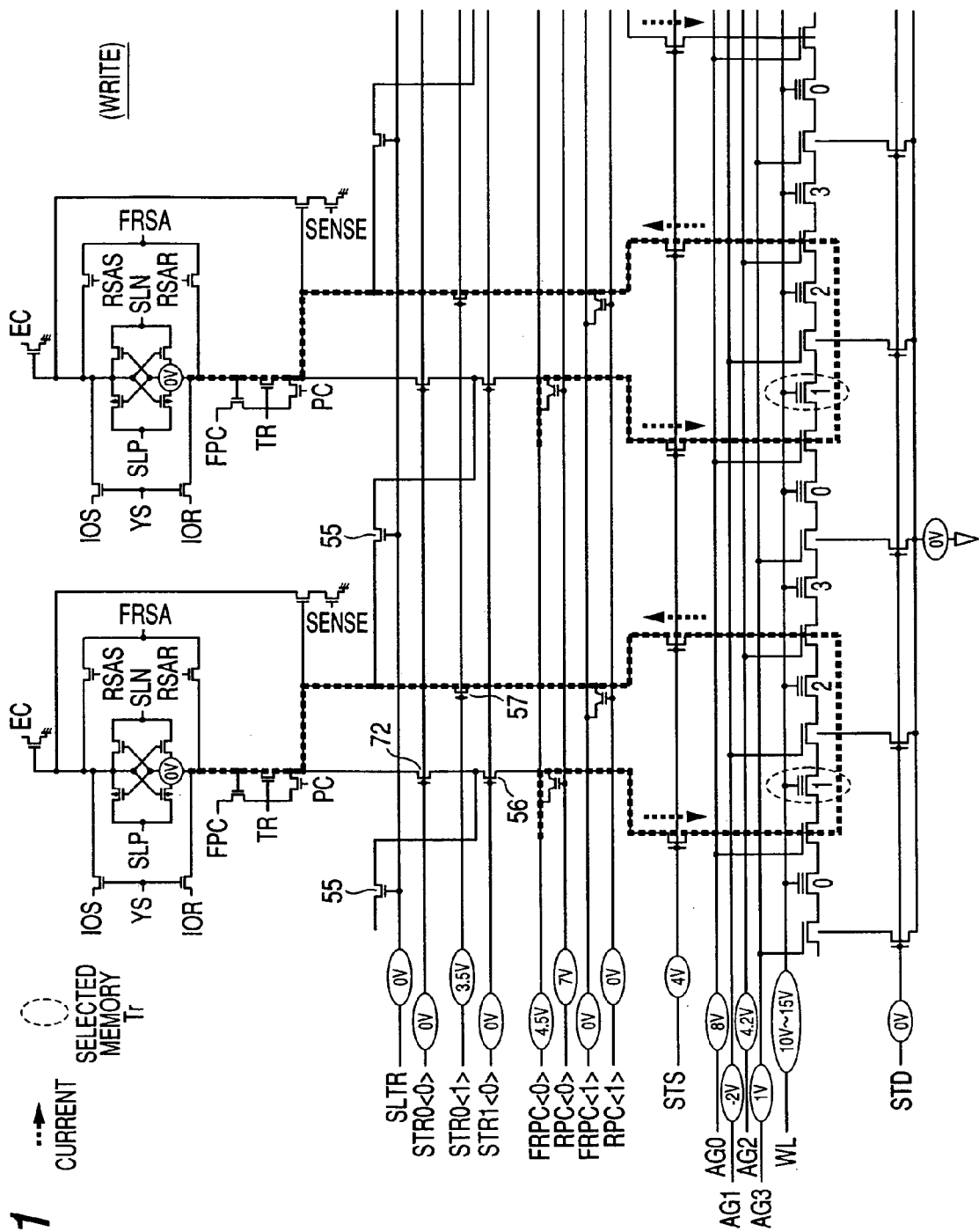
FIG. 61 is a circuit diagram depicting a connected configuration at the time that the memories 1 are intended for writing, as a connected form of the inversion layers by the write/read circuit and selection circuit based on the constitution of FIG. 57.
Figure 62:
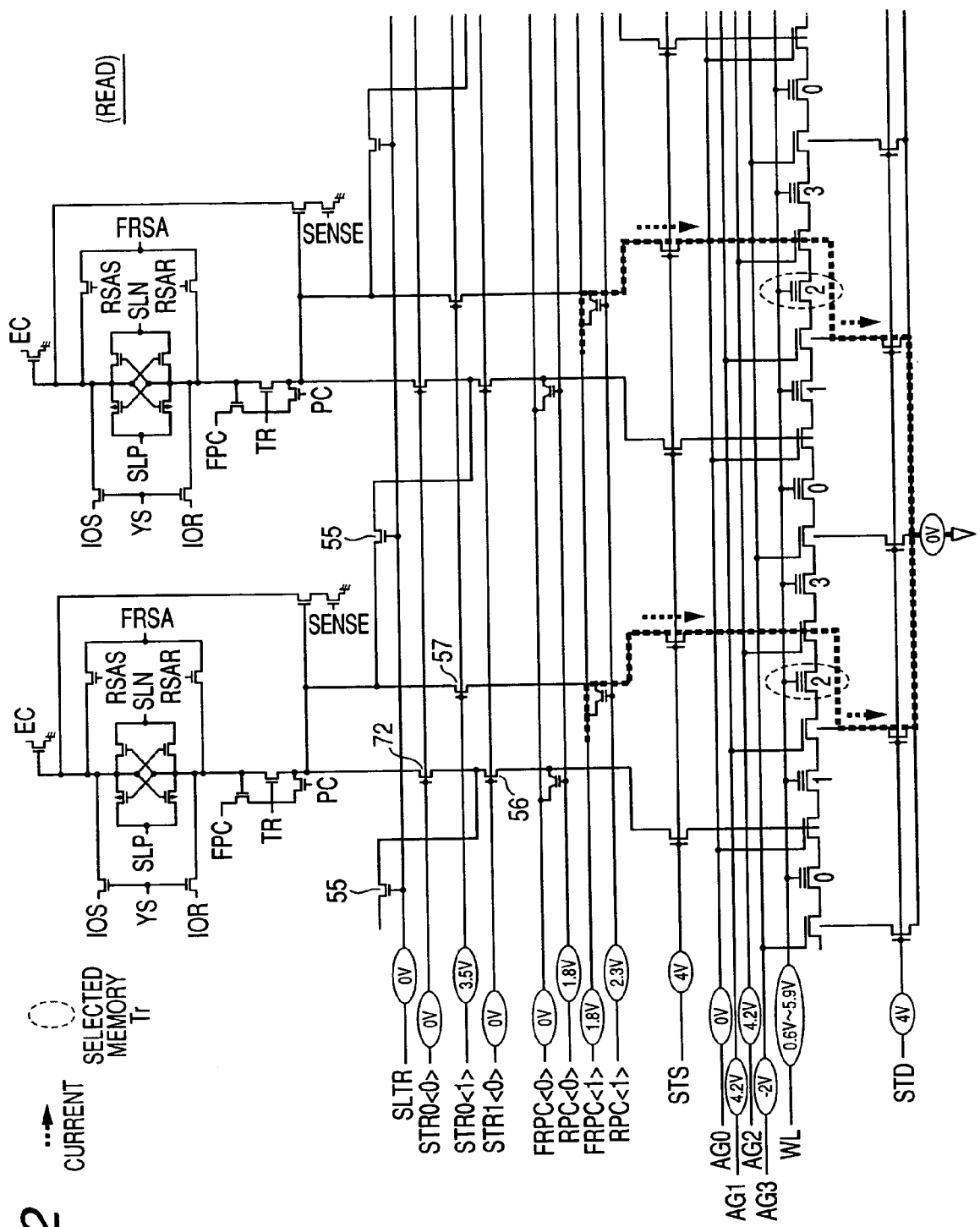
FIG. 62 is a circuit diagram showing a connected configuration at the time that memories 2 are intended for reading, as a connected form of the inversion layers by the write/read circuit and selection circuit based on the constitution of FIG. 57.
Figure 63:
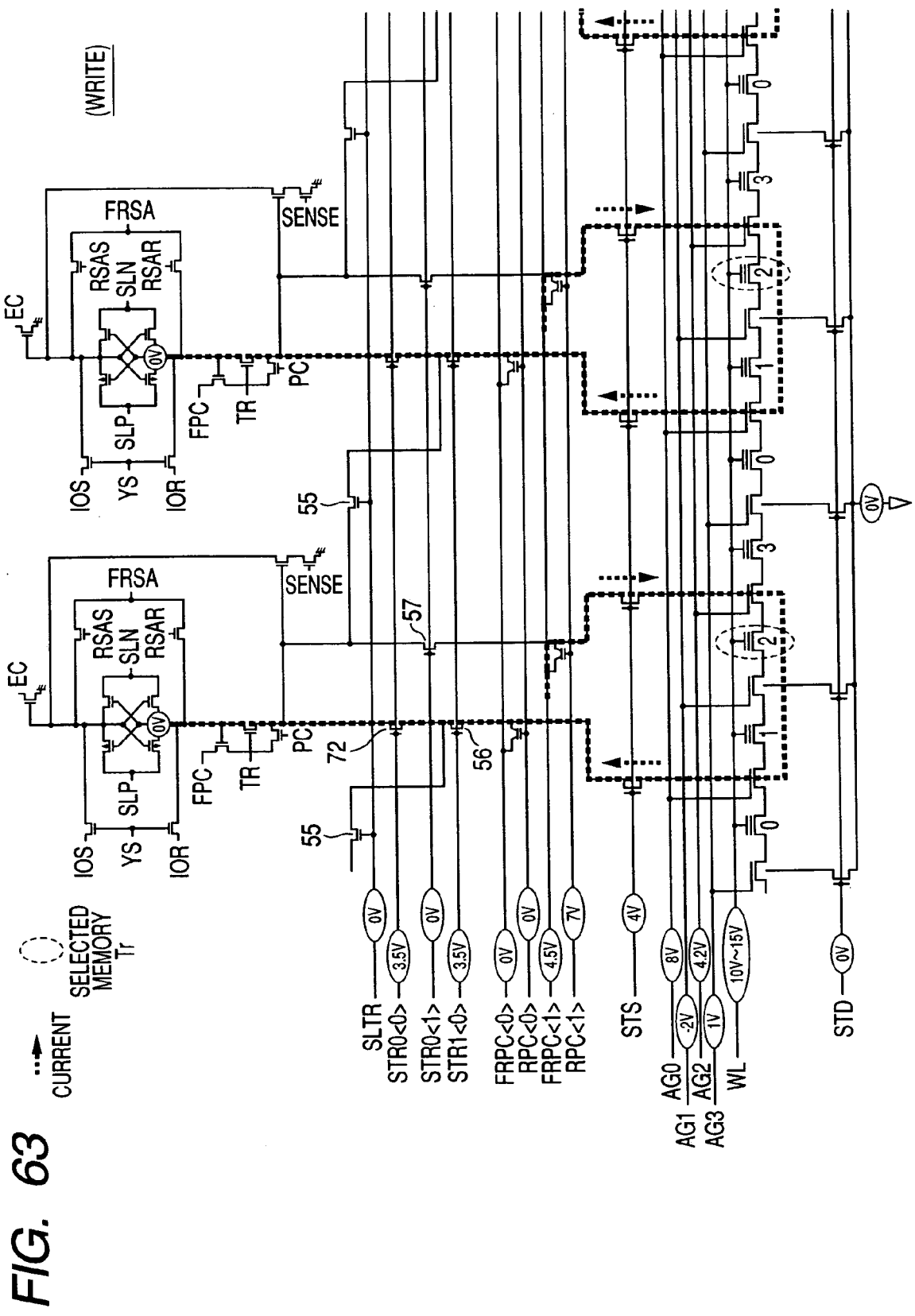
FIG. 63 is a circuit diagram depicting a connected configuration at the time that the memories 2 are intended for writing, as a connected form of the inversion layers by the write/read circuit and selection circuit based on the constitution of FIG. 57.
Figure 64:
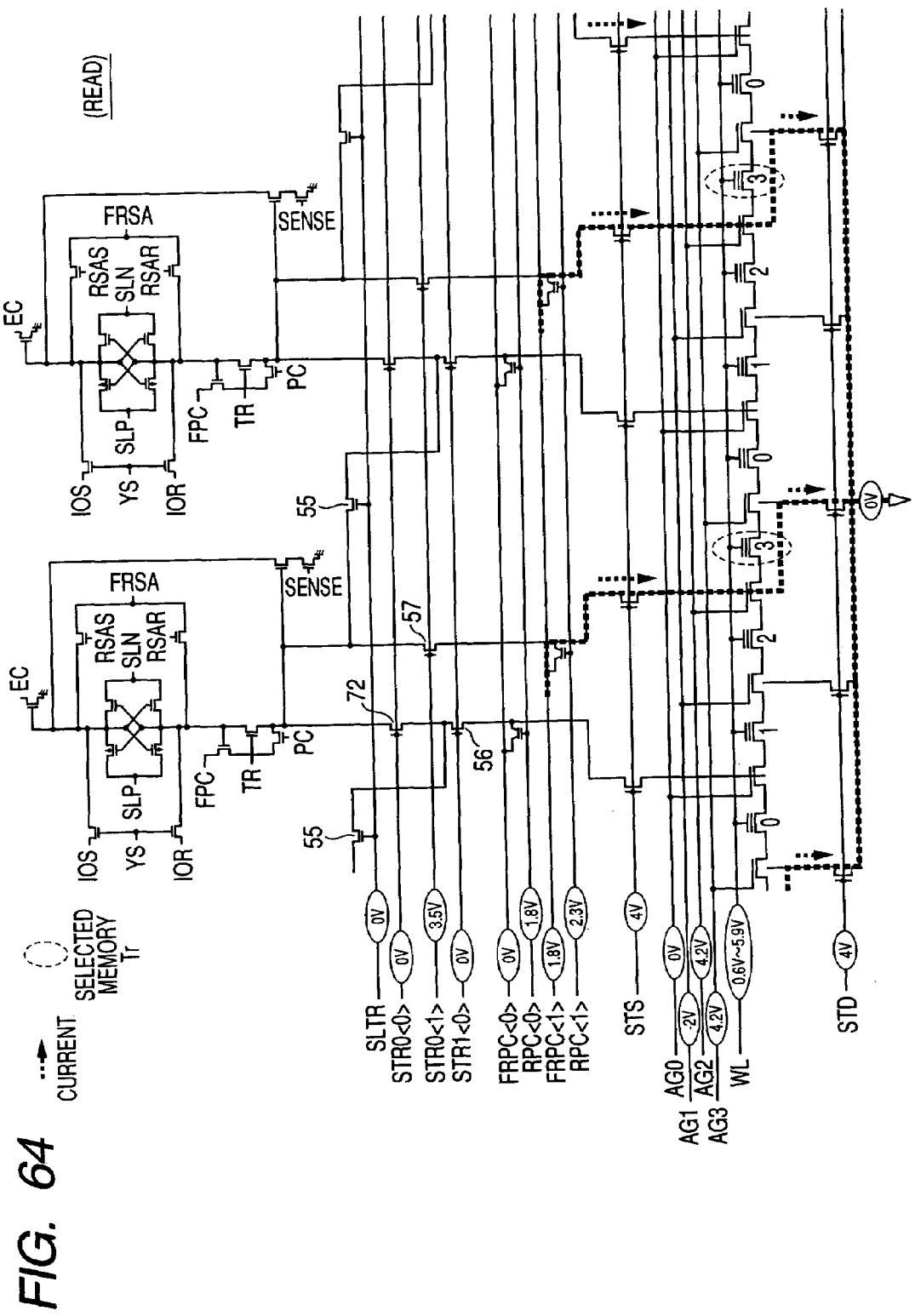
FIG. 64 is a circuit diagram showing a connected configuration at the time that memories 3 are intended for reading, as a connected form of the inversion layers by the write/read circuit and selection circuit based on the constitution of FIG. 57.
Figure 65:
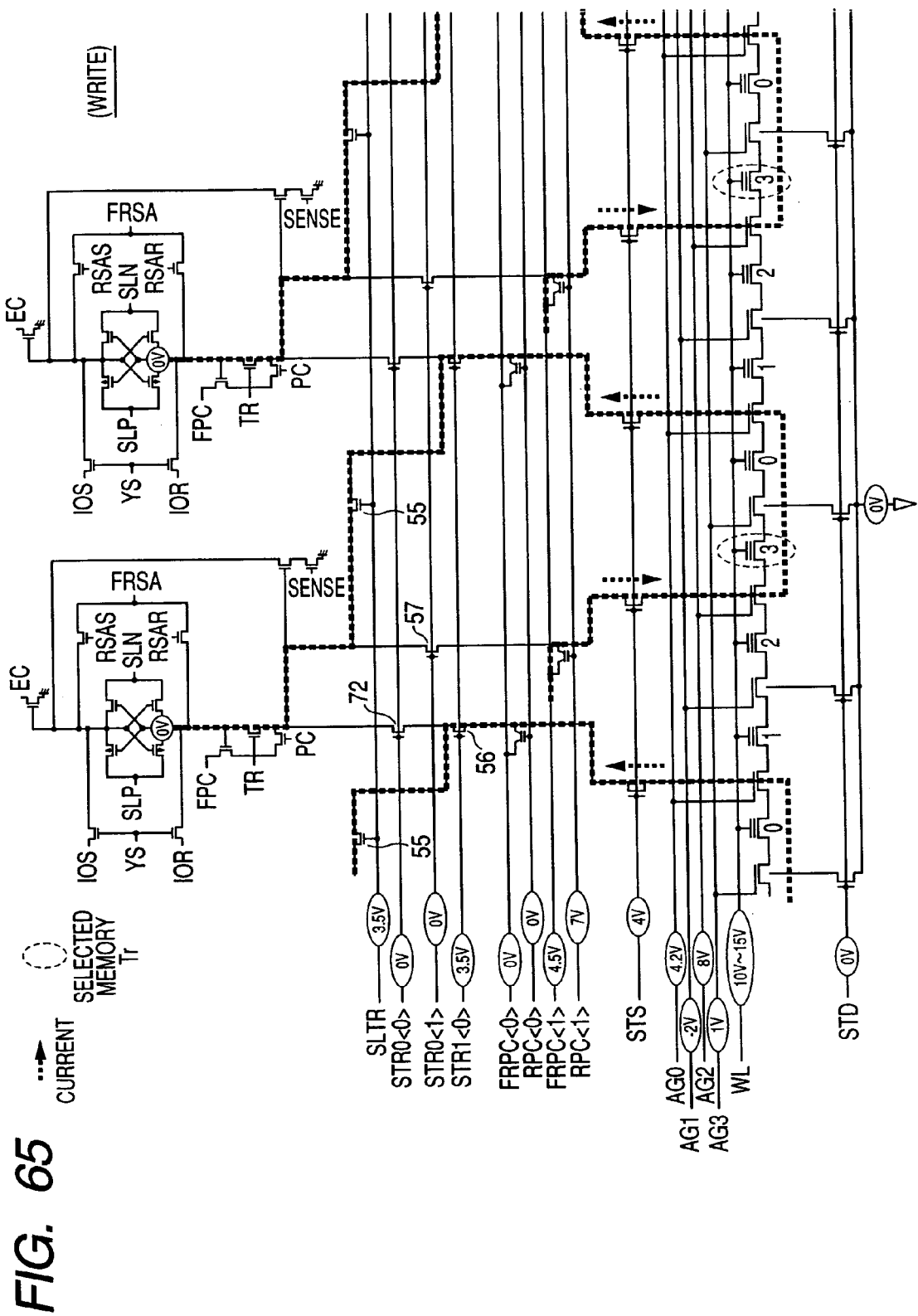
FIG. 65 is a circuit diagram depicting a connected configuration at the time that the memories 3 are intended for writing, as a connected form of the inversion layers by the write/read circuit and selection circuit based on the constitution of FIG. 57.

Respective connected forms of inversion layers 23 by the write/read circuit 50 and the selection circuit 51 based on the constitution of FIG. 57 are illustrated in FIGS. 58 through 65. A connected configuration at the time that memories 0 are intended for reading is shown in FIG. 58, and a connected configuration at the time that the memories 0 are intended for writing is shown in FIG. 59, respectively. A connected configuration at the time that memories 1 are intended for reading is shown in FIG. 60, and a connected configuration at the time that the memories 1 are intended for writing is shown in FIG. 61, respectively. A connected configuration at the time that memories 2 are intended for reading is shown in FIG. 62, and a connected configuration at the time that the memories 2 are intended for writing is shown in FIG. 63, respectively. A connected configuration at the time that memories 3 are intended for reading is shown in FIG. 64, and a connected configuration at the time that the memories 3 are intended for writing is shown in FIG. 65, respectively.

According to the flash memory 1 as described above, an inversion layer 23 formed by a first control transistor 20 adjacent to one memory transistor 21 is used as one current path upon writing to the one memory transistor 21. An inversion layer 23 formed by another first control transistor 20 that straddles a second control transistor 22 and another memory transistor 21 adjacent to the two referred to above and is located ahead thereof, is used as the other current path. According to this type of cell-through write system, in order to produce large field concentration between the memory transistor 21 and the second control transistor 22 when a write current flows from the memory transistor 21 to the second transistor 22, only the conductance of the second control transistor 22 may be reduced. There is no need to reduce the conductance of the inversion layer 23 for the first control transistor 20, which functions as a wiring for causing the write current to flow. Accordingly, the performance of writing of memory information can be improved.

Further, even when one pair of first control transistors 20 used for the supply of the write current are spaced away from each other as in the cell-through write system, the selection circuit is adopted which controls the connection of the read/write circuit 50 and the inversion layer 23 formed by the first control transistor 20 in such a manner that the same read/write circuit 50 is used upon reading and writing for the same memory transistor. It is therefore possible to assure a write operation based on the cell-through write system. In the case of such a configuration that one intrinsic read/write circuit is allocated every two adjoining inversion layers as shown in the comparative example shown in FIG. 22 or the like, memory information is latched through the inversion layer on the drain side of each of the memory transistors 21 disposed between the different read/write circuits upon the read operation, whereas upon the write operation based on the cell-through write system, another circuit different from the read/write circuit used upon the read operation must be used as the read/write circuit for controlling the potential on the source side of each memory transistor. Therefore, it is not possible to directly reflect data read for verify on the write operation. This inconvenience can be resolved by the selection circuit 51.

While the invention made above by the present inventors has been described specifically on the basis of the embodiments, the present invention is not limited thereto. It is needless to say that various changes can be made thereto without the scope not departing from the gist thereof.

For example, a memory transistor is not limited to quaternary storage but may be configured as binary storage. A nonvolatile memory is not limited to such a configuration as to have a plurality of banks operable in parallel. The nonvolatile memory can be applied even to a system LSI or an on-chip memory such as a microcomputer. Further, the present invention is not limited to a flash memory but can be widely applied even to an EEPROM and a nonvolatile memory having other memory format.

What is claimed is:

1. A nonvolatile memory comprising:

circuits each having first control transistors, memory transistors, second control transistors and memory transistors repeatedly connected in series in sequence;

read/write circuits each used to form inversion layers in a direction intersecting said serial direction with turning on of the first and second control transistors and perform reading and writing of memory information from and to each memory transistor; and a selection circuit which selects a connection of the inversion layer placed under the first control transistor and the corresponding read/write circuit, wherein upon a read operation, the second control transistor and one of the right and left first control transistors are turned on to perform reading of one of the right and left memory transistors, and upon a write operation, the first control transistors on both sides of the second control transistor as viewed from side to side are turned on to perform writing into the other memory transistor via one of the right and left memory transistors, and wherein the selection circuit controls a connection of the read/write circuit and the inversion layer placed under the first control transistor in such a manner that the same read/write circuit is used in reading and writing for the same memory transistor.

2. A nonvolatile memory comprising:

circuits each having first control transistors, memory transistors, second control transistors and memory transistors repeatedly connected in series in sequence;

read/write circuits each used to form inversion layers in a direction intersecting said serial direction with turning on of the first and second control transistors and perform reading and writing of memory information from and to each memory transistor; and a selection circuit which selects a connection of the inversion layer and the corresponding read/write circuit, wherein a signal is read into the inversion layer placed under the first control transistor adjacent to the corresponding memory transistor to perform reading of memory information, and hot electrons are injected into the memory transistor for writing via the second control transistor and memory transistor adjacent to the memory transistor for writing to perform writing of memory information, wherein upon a read operation, the selection circuit connects the inversion layer placed under one first control transistor adjacent to the corresponding memory transistor for reading to the read/write circuit, wherein upon a write operation, the selection circuit connects the inversion layers placed under the pair of first control transistors interposing the memory transistor for the write operation therebetween to the read/write circuit, and wherein the selection circuit controls a connection of the read/write circuit and the inversion layer placed under the corresponding first control transistor in such a manner that the same read/write circuit is used in reading and writing for the same memory transistor.

3. A nonvolatile memory comprising:

an insulating film formed over a main surface of a semiconductor substrate;

a plurality of first and second electrodes alternately formed over the insulating film in a first direction at predetermined intervals;

a plurality of third electrodes formed over the insulating film at predetermined intervals in a second direction intersecting the first direction and insulated from the first and second electrodes;

charge storage regions each disposed between the first and second electrodes and capable of selectively storing an electrical charge immediately below the third electrode;

read/write circuits each used for reading of memory information corresponding to a state of the electrical charge held in the charge storage region and writing of memory information for controlling a charge holding state with respect to the charge storage region; and a selection circuit which selects a connection of an inversion layer selectively formed immediately below the first electrode and the corresponding read/write circuit, wherein upon reading of the memory information, the read/write circuit detects memory information using the inversion layers placed immediately below the right and left first electrodes adjacent to the charge storage region for reading, and an inversion layer placed immediately below the second electrode, wherein upon writing of the memory information, the read/write circuit controls a charge holding state using a current path extending from the inversion layer placed immediately below one of the right and left first electrodes adjacent to the charge storage region for writing to a weak inversion layer placed immediately below the other second electrode, an inversion layer placed below the third electrode adjacent thereto, and the inversion layer placed immediately below the first electrode adjacent thereto, and wherein the selection circuit controls a connection of the read/write circuit and the inversion layer placed under the first electrode in such a manner that the same read/write circuit is used in reading and writing of memory information from and to the same charge storage region.

4. The nonvolatile memory according to claim 3, wherein the read/write circuit includes: a static latch, a detecting transistor which when one input/output node of the static latch is used as a reference node upon the operation of reading of memory information, level-changes the other input/output node of the static latch in response to the level of the inversion layer placed under the first electrode; and a current supply transistor which selectively supplies a current to the current path according to write data held in the static latch upon the operation of writing of memory information.

5. The nonvolatile memory according to claim 4, wherein the selection circuit selects the corresponding inversion layer necessary for processing from the inversion layers placed immediately below the four first electrodes depending upon the position of the charge storage region for reading or writing of the memory information, of the charge storage regions disposed among the four first electrodes with respect to the one read/write circuit and the inversion layers placed immediately below the four first electrodes corresponding to the read/write circuit provided in parallel continuously, and connects the selected inversion layer to the one read/write circuit.

6. The nonvolatile memory according to claim 4, wherein the selection circuit selects the corresponding inversion layer necessary for processing from the inversion layers placed immediately below the three first electrodes depending upon the position of the charge storage region for reading or writing of the memory information, of the charge storage regions disposed among the three first electrodes with respect to the one read/write circuit and the inversion layers placed immediately below the three first electrodes corresponding to the read/write circuit provided in parallel continuously, and connects the selected inversion layer to the one read/write circuit.

7. The nonvolatile memory according to claim 6, wherein upon the write operation of the memory information, the read/write circuit sets a first potential to the first electrode adjacent to the charge storage region for writing, sets a second potential lower than the first potential to the first electrode located on the side opposite to the first electrode, and applies a third potential lower than the voltage applied to the pair of first electrodes to the second electrode adjacent to the charge storage region thereby to generate hot electrons at a boundary between the inversion layer placed immediately below the second electrode to which the third potential is applied, and a channel placed immediately below the charge storage region adjacent to the inversion layer, thus applying a high potential for injecting the hot electrons in the charge storage region to the corresponding third electrode.

8. The nonvolatile memory according to claim 7, wherein upon the read operation of the memory information, the read/write circuit precharges the corresponding inversion layer placed immediately below the first electrode adjacent to the charge storage region for reading to a fourth potential to forcibly set the corresponding inversion layer placed immediately below the second electrode on the opposite side thereof to a potential lower than the fourth potential, thereby detecting the presence or absence of a change in the precharged first potential.

9. The nonvolatile memory according to claim 8, wherein the operation of initializing the charge holding state is enabled, and upon such an initializing operation, a fifth potential is set to the corresponding inversion layer immediately below the first electrode and the corresponding inversion layer immediately below the second electrode, and a negative sixth potential lower than the fifth potential is set to the third electrode, whereby electrons are moved in their emission direction from the corresponding charge storage region immediately below the third electrode to which the sixth potential is set.

10. A nonvolatile memory comprising:
read/write circuits in which two memory transistors and one control transistor are alternately disposed in series between two wirings and each of which is used to form inversion layers in a direction parallel to the wirings with turning on of the control transistor and perform reading and writing of memory information from and to the corresponding memory transistor; and
a selection circuit which selects a connection of the inversion layer and the read/write circuit,
wherein upon a read operation, an inversion layer is formed in the center control transistor, the reading of the memory transistor between one of right and left wirings and the inversion layer placed below the center control transistor is performed, and upon a write operation, the writing into the other of the right and left memory transistors is performed via the right and left wirings and one of the right and left memory transistors, and
wherein the selection circuit controls a connection of the read/write circuit and the wirings in such a manner that the same read/write circuit is used in reading and writing for the same memory transistor.

11. A nonvolatile memory comprising:
read/write circuits in which two memory transistors and one control transistor are alternately disposed in series between two wirings and each of which is used to form inversion layers in a direction parallel to the wirings with turning on of the control transistor and perform reading and writing of memory information from and to the corresponding memory transistor; and
a selection circuit which selects a connection of the inversion layer and the read/write circuit,
wherein a signal is read into the wiring adjacent to the corresponding memory transistor to perform reading of memory information, and hot electrons are injected into the memory transistor for writing via the control transistor and memory transistor adjacent to the memory transistor for writing to perform writing of memory information,
wherein upon a read operation, the selection circuit connects one wiring adjacent to the corresponding memory transistor for reading to the corresponding read/write circuit,
wherein upon a write operation, the selection circuit connects the pair of wirings interposing the memory transistor for the write operation therebetween to the corresponding read/write circuit, and
wherein the selection circuit controls a connection of the read/write circuit and the wiring in such a manner that the same read/write circuit is used in reading and writing for the same memory transistor.

12. A nonvolatile memory comprising:
an insulating film formed over a main surface of a semiconductor substrate;
a plurality of first electrodes each formed of a diffused layer, said first electrodes being formed over the main surface of the semiconductor substrate at predetermined intervals in a first direction;
a plurality of second electrodes formed over the insulating film in the first direction alternately with respect to the first electrodes;
a plurality of third electrodes formed over the insulating film at predetermined intervals in a second direction intersecting the first direction and insulated from the first and second electrodes;
charge storage regions each disposed between the first and second electrodes and capable of selectively storing an electrical charge immediately below the third electrode;
read/write circuits each used for reading of memory information corresponding to a state of the electrical charge held in the charge storage region and writing of memory information for controlling a charge holding state with respect to the charge storage region; and
a selection circuit which selects a connection of the first electrode and the corresponding read/write circuit,
wherein upon reading of the memory information, the read/write circuit detects memory information using inversion layers placed immediately below the right and left first and second electrodes adjacent to the charge storage region for reading,
wherein upon writing of the memory information, the read/write circuit controls a charge holding state using a current path extending from one of the right and left first electrodes adjacent to the charge storage region for writing to a weak inversion layer placed immediately below the other second electrode, an inversion layer placed below the third electrode adjacent thereto, and the first electrode adjacent thereto, and
wherein the selection circuit controls a connection of the read/write circuit and the inversion layer placed under the first electrode in such a manner that the same read/write circuit is used in reading and writing of memory information from and to the same charge storage region.

13. The nonvolatile memory according to claim 12, wherein the read/write circuit includes: a static latch; a detecting transistor which, when one input/output node of the static latch is used as a reference node upon the operation of reading of memory information, level-changes the other input/output node of the static latch in response to the level of the first electrode; and a current supply transistor which selectively supplies a current to the current path according to write data held in the static latch upon the operation of writing of memory information.

14. The nonvolatile memory according to claim 13, wherein the selection circuit selects the corresponding inversion layer necessary for processing from the four first electrodes depending upon the position of the charge storage region for reading or writing of the memory information, of the charge storage regions disposed among the four first electrodes with respect to the one read/write circuit and the four first electrodes corresponding to the read/write circuit provided in parallel continuously, and connects the selected inversion layer to the one read/write circuit.

15. The nonvolatile memory according to claim 13, wherein the selection circuit selects the corresponding inversion layer necessary for processing from the three first electrodes depending upon the position of the charge storage region for reading or writing of the memory information, of the charge storage regions disposed among the three first electrodes with respect to the one read/write circuit and the three first electrodes corresponding to the read/write circuit provided in parallel continuously, and connects the selected inversion layer to the one read/write circuit.

16. The nonvolatile memory according to claim 15, wherein upon the write operation of the memory information, the read/write circuit sets a first potential to one first electrode adjacent to the charge storage region for writing, sets a second potential lower than the first potential to the first electrode located on the side opposite to the first electrode, applies a third potential for generating hot electrons to the corresponding second electrode adjacent to the charge storage region at a boundary between the inversion layer placed immediately below the second electrode, and a channel placed immediately below the charge storage region adjacent to the inversion layer, and applies a high potential for injecting the hot electrons in the charge storage region to the corresponding third electrode.

17. The nonvolatile memory according to claim 16, wherein upon the read operation of the memory information, the read/write circuit precharges the first electrode adjacent to the charge storage region for reading to a fourth potential to forcibly set the corresponding inversion layer placed immediately below the second electrode on the opposite side thereof to a potential lower than the fourth potential, thereby detecting the presence or absence of a change in the precharged first potential.

18. The nonvolatile memory according to claim 17, wherein the operation of initializing the charge holding state is enabled, and upon such an initializing operation, a fifth potential is set to the corresponding inversion layers immediately below the first and second electrodes and a negative sixth potential lower than the fifth potential is set to the third electrode, whereby electrons are moved in their emission direction from the corresponding charge storage region immediately below the third electrode to which the sixth potential is set.

* * * * *